(12) United States Patent
Huang et al.

(10) Patent No.: US 11,211,360 B2
(45) Date of Patent: Dec. 28, 2021

(54) PASSIVE DEVICE MODULE, SEMICONDUCTOR PACKAGE INCLUDING THE SAME, AND MANUFACTURING METHOD THEREOF

(71) Applicant: Taiwan Semiconductor Manufacturing Co., Ltd., Hsinchu (TW)

(72) Inventors: Shih-Ya Huang, Hsinchu (TW); Chung-Hao Tsai, Changhua County (TW); Chen-Hua Yu, Hsinchu (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/745,345

(22) Filed: Jan. 17, 2020

(65) Prior Publication Data

US 2021/0225804 A1   Jul. 22, 2021

(51) Int. Cl.
| | | |
|---|---|---|
| *H01L 25/065* | (2006.01) | |
| *H01L 23/48* | (2006.01) | |
| *H01L 23/00* | (2006.01) | |
| *H01L 25/00* | (2006.01) | |
| *H01L 21/56* | (2006.01) | |
| *H01L 21/48* | (2006.01) | |
| *H01L 23/498* | (2006.01) | |

(52) U.S. Cl.
CPC ...... *H01L 25/0652* (2013.01); *H01L 21/4857* (2013.01); *H01L 21/56* (2013.01); *H01L 23/481* (2013.01); *H01L 23/49816* (2013.01); *H01L 24/16* (2013.01); *H01L 25/50* (2013.01); *H01L 2224/16146* (2013.01)

(58) Field of Classification Search
CPC .. H01L 25/0652; H01L 21/4857; H01L 21/56
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |

(Continued)

*Primary Examiner* — Errol V Fernandes
(74) *Attorney, Agent, or Firm* — JCIPRNET

(57) ABSTRACT

A passive device module includes a first tier, a second tier and connective terminals. The first tier includes a first semiconductor chip and a first encapsulant. The first semiconductor chip has contact posts. The encapsulant encapsulates the first semiconductor chip. The second tier is disposed on the first tier, and includes a second semiconductor chip, through interlayer walls, and a second encapsulant. The through interlayer walls are locate beside and face sidewalls of the second semiconductor chip and are electrically connected to the contact posts. The second encapsulant encapsulates the second semiconductor chip and the through interlayer walls. The connective terminals are disposed over the second tier and are electrically connected to the first semiconductor chip via the through interlayer walls. The first and second semiconductor chips include passive devices.

20 Claims, 44 Drawing Sheets

(56) References Cited

U.S. PATENT DOCUMENTS

| | | |
|---|---|---|
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0174974 A1* | 6/2018 | Kim ........................ H01L 24/08 |
| 2019/0096866 A1* | 3/2019 | Hsu ................... H01L 21/76846 |

* cited by examiner (Ⅱ-Ⅱ)

(III-III)

(VII-VII)

(VIII–VIII)

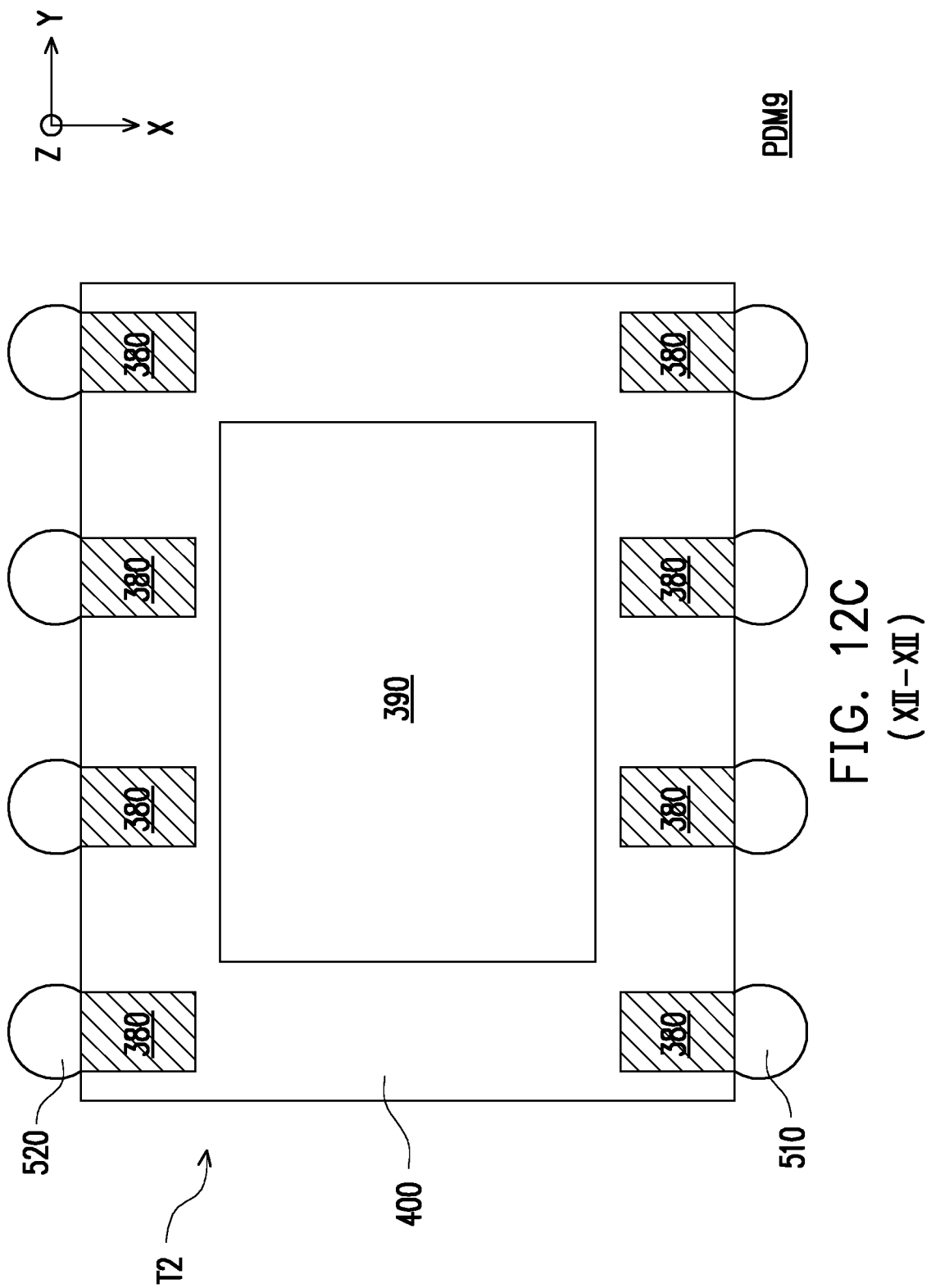

PASSIVE DEVICE MODULE, SEMICONDUCTOR PACKAGE INCLUDING THE SAME, AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12C is schematic cross-sectional view of a passive device module according to some embodiments of the present disclosure.

DETAILED DESCRIPTION

Figure 1A:
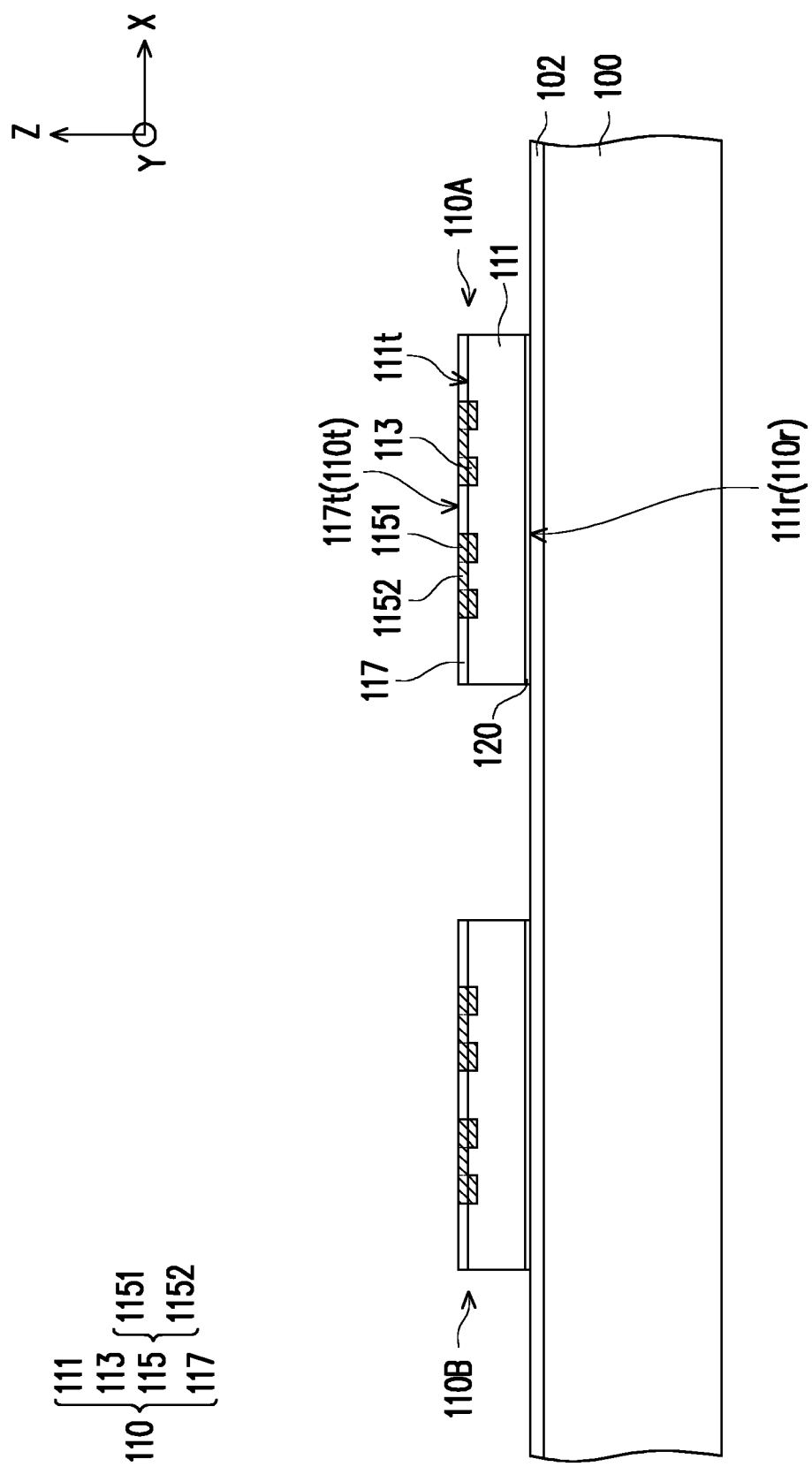
FIG. 1A to FIG. 1G are schematic side views of structures produced at various stages of a manufacturing method of a passive device module according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1G are schematic side views of structures produced at various stages of a manufacturing method of a passive device module PDM1 according to some embodiments of the present disclosure. The schematic side views of FIG. 1A through FIG. 1G are taken using a direction Y as point of view. As such, the elements are shown in planes defined by directions X and Z, where directions X, Y and Z may form the orthogonal axis of a set of Cartesian coordinates. In the schematic side views of the present disclosure may be drawn elements belonging to XZ planes disposed at different points along the Y direction. Referring to FIG. 1A, a carrier 100 is provided. In some embodiments, the carrier 100 is a glass substrate, a metal plate, a plastic supporting board or the like, but other suitable substrate materials may be used as long as the materials are able to withstand the subsequent steps of the process. In some embodiments, a de-bonding layer 102 is provided on the carrier 100 to facilitate peeling the carrier 100 away from the structure when required by the manufacturing process. In some embodiments, the de-bonding layer 102 includes a light-to-heat conversion (LTHC) release layer.

In some embodiments, semiconductor chips 110A, 110B are provided on the carrier 100. In some embodiments, the semiconductor chips 110A, 110B are placed onto the carrier 100 through a pick-and-place method. Throughout the disclosure, when it is not necessary to differentiate between semiconductor chips 110A and 110B, the semiconductor chips 110A and 110B may be collectively referred to as semiconductor chips 110. The same nomenclature approach is adopted for other elements described hereafter. Even though only two semiconductor chips 110 are presented in FIG. 1A for illustrative purposes, a plurality of semiconductor chips 110 may be provided on the carrier 100 to produce multiple passive device modules with wafer-level packaging technology. In some embodiments, an individual semiconductor chip 110 includes a semiconductor substrate 111, contact pads 113, contact posts 115, and a protective layer 117. The contact pads 113 may be formed at a top surface 111t of the semiconductor substrate 111. The contact posts 115 may extend over the contact pads 113. Each contact posts 115 may contact multiple contact pads 113, and include portions 1151 extending on the contact pads 113 joined by portions 1152 extending on the semiconductor substrate 111. The protective layer 117 may cover the front surface 111t of the semiconductor substrate 111 left exposed by the contact posts 115.

The semiconductor substrates 111 may be made of semiconductor materials, such as semiconductor materials of the groups III-V of the periodic table. In some embodiments, the semiconductor substrates 111 include elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In certain embodiments, the contact pads 113 and the contact posts 115 include aluminum, copper, or other suitable metals. In some embodiments, the material of the contact pads 113 and the contact posts 115 includes copper, copper alloys, or other conductive materials, and may be formed by deposition, plating, or other suitable techniques. The protective layer 117 may be a single layer or a multi-layered structure, and may include silicon oxide, silicon nitride, silicon oxynitride, other suitable dielectric materials, or combinations thereof. The protective layer 117 may be formed by suitable fabrication techniques such as spin-on coating, chemical vapor deposition (CVD), or the like.

In some embodiments the protective layer 117 may cover the contact posts 115 and (temporarily) constitute a top surface 110t of the semiconductor chips 110. In some embodiments, the semiconductor chips 110 are placed over the carrier 100 with the front surfaces 111t of the semiconductor substrates 111 facing away from the carrier 100. Rear surfaces 111r of the semiconductor substrates 111 opposite to the front surfaces 111t may form the rear surfaces 110r of the semiconductor chips 110 and may be secured to the carrier 100 or the de-bonding layer 102 by portions of die attach film 120. In some embodiments, the die attach film 120 comprises a thermoplastic material, a thermocurable material, or a photocurable material. The die attach film 120 may comprise epoxy resins, phenol resins, polyolefin resins, or other suitable materials. However, the disclosure is not limited thereto, and other materials or polymers compatible with semiconductor processing environments may be used. The die attach film 120 may be applied via lamination, spin-coating, or other suitable techniques. In some embodiments, the semiconductor chips 110 are chips of integrated passive devices and function as capacitors, inductors, resistors, or the like. In some embodiments, the semiconductor chips 110 function as capacitors having different capacitance values, resonance frequencies, and/or different sizes.

Figure 1B:
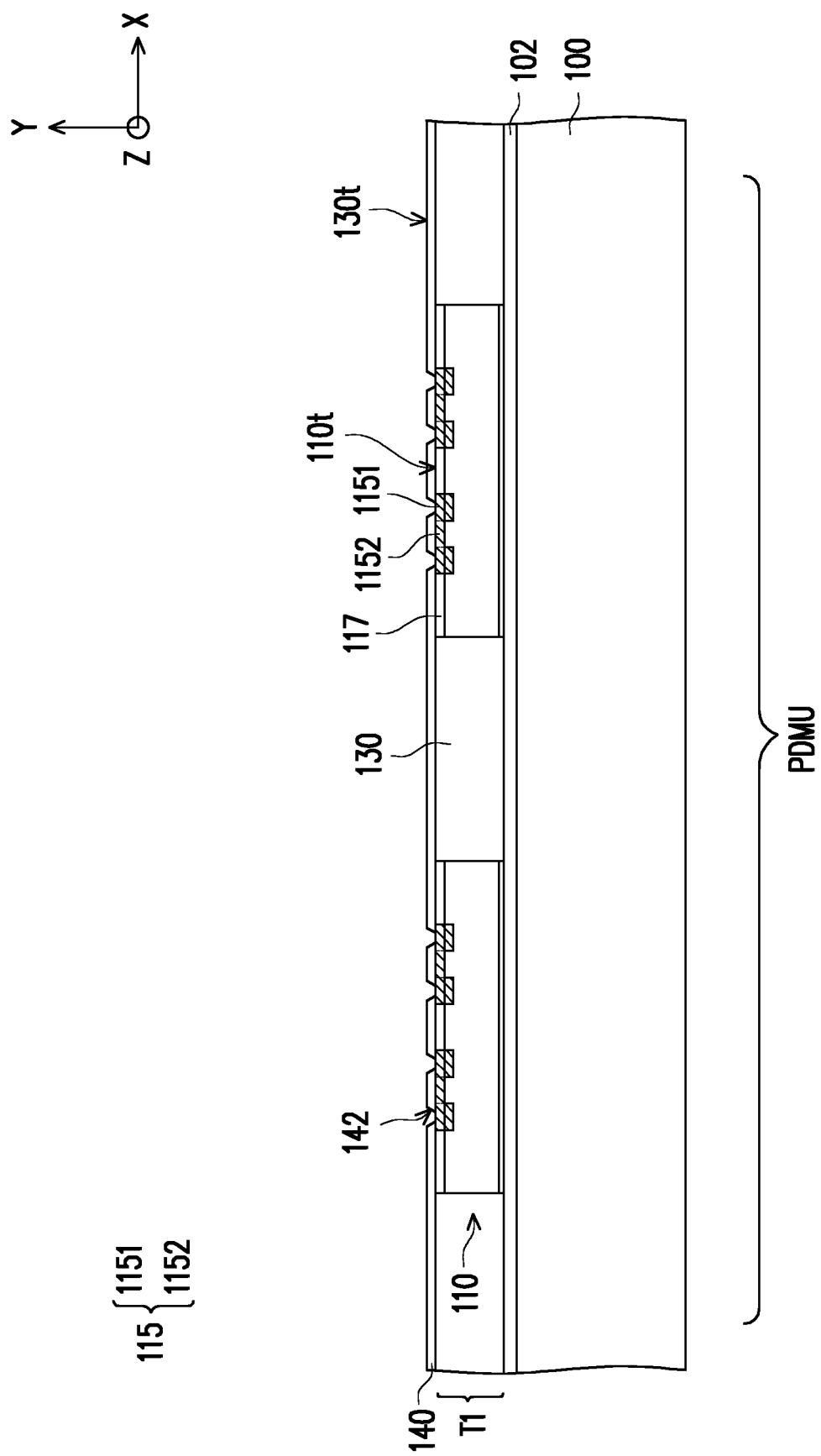

Referring to FIG. 1B, an encapsulant 130 is formed over the carrier 100 to laterally encapsulate the semiconductor chips 110. In some embodiments, the encapsulant 130 includes a molding compound, a molding underfill, a resin (such as an epoxy resin), or the like. In some embodiments, the encapsulant 130 is formed by an over-molding process. In some embodiments, the encapsulant 130 is formed by a compression molding process. In some embodiments, formation of the encapsulant 130 includes forming an encapsulating material (not shown) fully covering the semiconductor chips 110, followed by removal of a portion of the encapsulating material by a planarization process until the contact posts 115 of the semiconductor chips 110 are exposed. In some embodiments, a portion of the protective layer 117 may be removed during the planarization process to expose the contact posts 115. In some embodiments, the planarization of the encapsulating material includes performing a mechanical grinding process and/or a chemical mechanical polishing (CMP) process. In some embodiments, portions of the contact posts 115 are removed during the planarization step. Following planarization, top surfaces 110t of the semiconductor chips 110 may be defined by the protective layers 117 and the contact posts 115. That is, following the planarization step, the contact posts 115 may be exposed and available for electrically connecting the semiconductor chips 110 to subsequently formed components or elements. In some embodiments, the top surfaces 110t of the semiconductor chips 110 exposing the contact posts 115 are indicated as contact surfaces. In some embodiments, the contact surfaces 110t of the semiconductor chips 110 may be substantially coplanar with a top surface 130t of the encapsulant 130. In some embodiments, as shown in FIG. 1B, the encapsulant 130 fills the gaps between the semiconductor chips 110. In some embodiments, with formation of the encapsulant 130, a reconstructed wafer is obtained. In some embodiments, the reconstructed wafer includes a plurality of passive device modules units PDMU. In other words, the exemplary process may be performed at a reconstructed wafer level, so that multiple passive device module units PDMU are processed in the form of a reconstructed wafer. In the cross-sectional view of FIG. 1B, one passive device module unit PDMU is shown for simplicity, but, of course, this is for illustrative purposes only, and the disclosure is not limited by the number of passive device module units PDMU being produced in the reconstructed wafer. In some embodiments, the semiconductor chips 110 and the encapsulant 130 in which they are embedded may be considered as a lower tier T1 of the passive device module unit PDMU.

Referring to FIG. 1B, in some embodiments, a dielectric layer 140 is formed on the semiconductor chips 110 and the encapsulant 130. The dielectric layer 140 is patterned to include openings 142 exposing the underlying contact posts 115. In some embodiments the openings 142 may expose the portions 1151 of the contact posts 115 overlying the contact pads 113, while the portions 1152 of the contact posts 115 remain covered by the dielectric layer 140. However, the disclosure is not limited thereto, and in some alternative embodiments the portions 1152 may also be exposed. The dielectric layer 140 may be a single layer or a multi-layered structure, and may include polymer, such as PBO, other suitable dielectric materials, or combinations thereof. The dielectric layer 140 may be formed by suitable fabrication techniques such as spin-on coating, chemical vapor deposition (CVD), or the like.

Figure 1C:
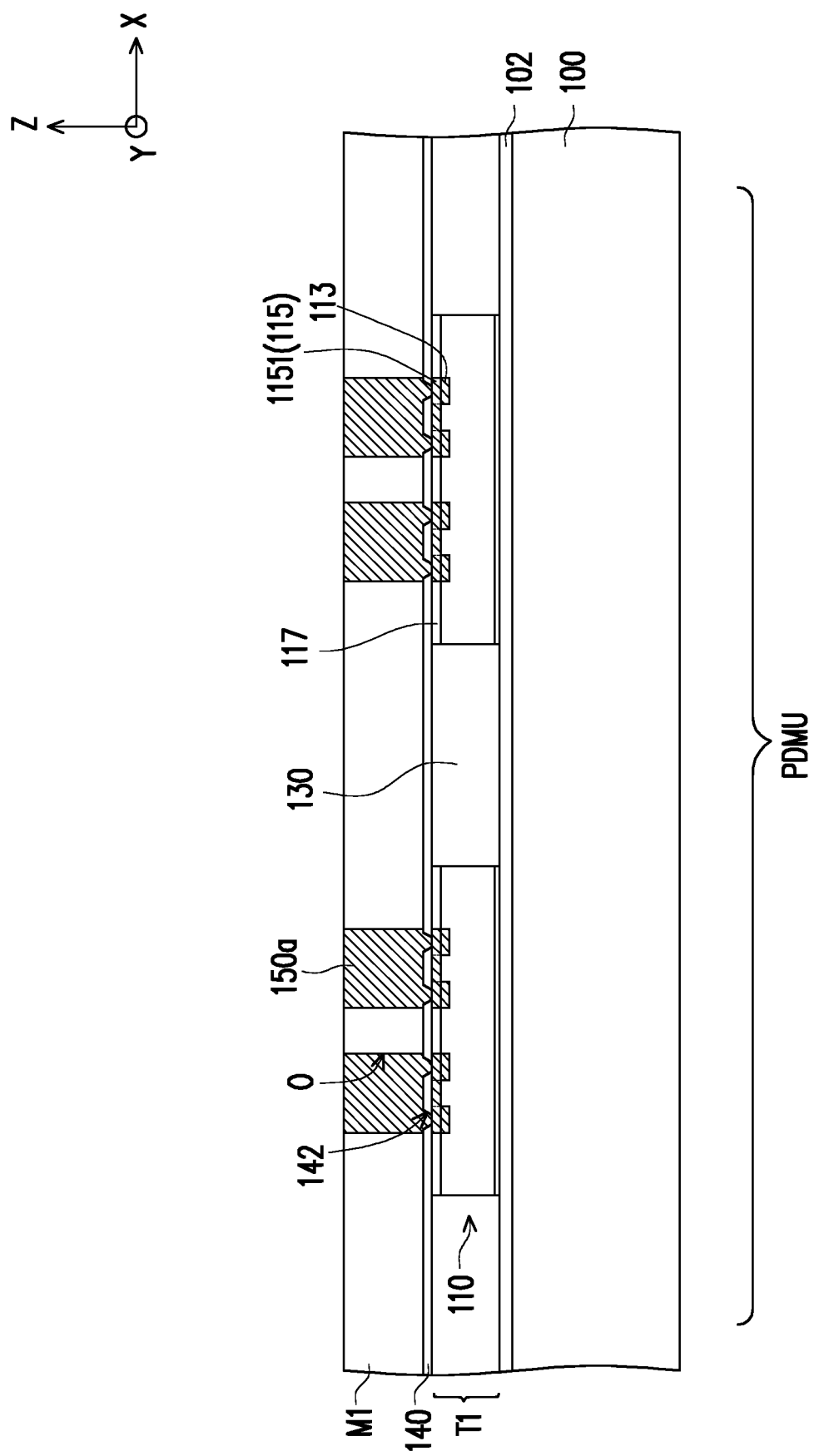
Figure 1D:
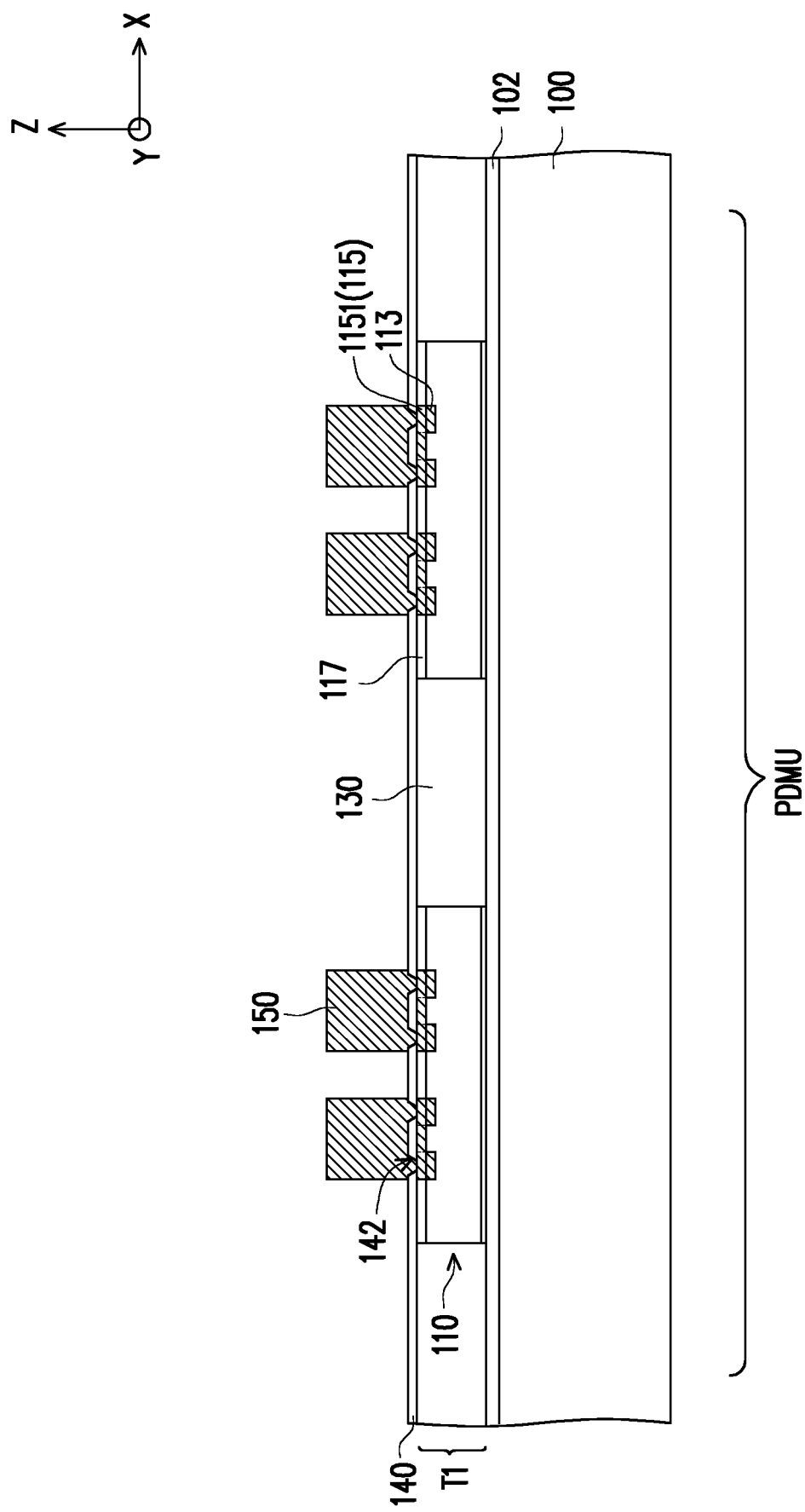

Referring to FIG. 1C and FIG. 1D, in some embodiments through insulator walls (TIWs) 150 are formed over the semiconductor chips 110. In some embodiments, the TIWs 150 are plated on the exposed portions (e.g., the portions 1151) of the contact posts 115. In some embodiments, the TIWs 150 may have an elongated shape in a first direction (e.g., the X direction) different from the thickness direction (i.e., the Z direction) of the semiconductor chips 110. In some embodiments, the TIWs 150 protrude through the dielectric layer 140 to establish electrical connection with the semiconductor chips 110. In some embodiments, the TIWs 150 may be formed as described below. First, a seed material layer (not shown) is formed over the dielectric layer 140. In some embodiments, the seed material layer includes a titanium/copper composite layer and is formed by a sputtering process to conformally cover the dielectric layer 140. The seed material layer may extend within the openings 142 to contact the exposed portions of the contact posts 115. Thereafter, a patterned auxiliary mask M1 with openings O is formed on the seed material layer. The openings O of the auxiliary mask M1 expose the intended locations for the subsequently formed TIWs 150. For example, the openings O of the auxiliary mask M1 are formed in correspondence of the locations of the openings 142. In some embodiments, an individual opening O of the auxiliary mask M1 may expose multiple openings 142. Afterwards, a plating process is performed to form a metal material layer 150a (e.g., a copper layer) on the seed material layer exposed by the openings O of the auxiliary mask M1. Subsequently, the auxiliary mask M1 and the seed material layer not covered by the metal material layer 150a are removed, for example via a stripping process and an etching process, to form the TIWs 150. However, the disclosure is not limited thereto. In some alternative embodiments, other suitable methods may be utilized to form the TIWs 150. For example, pre-fabricated TIWs 150 (e.g., pre-fabricated copper pieces) may be picked-and-placed onto the dielectric layer 140 in correspondence of the openings 142.

Figure 1E:
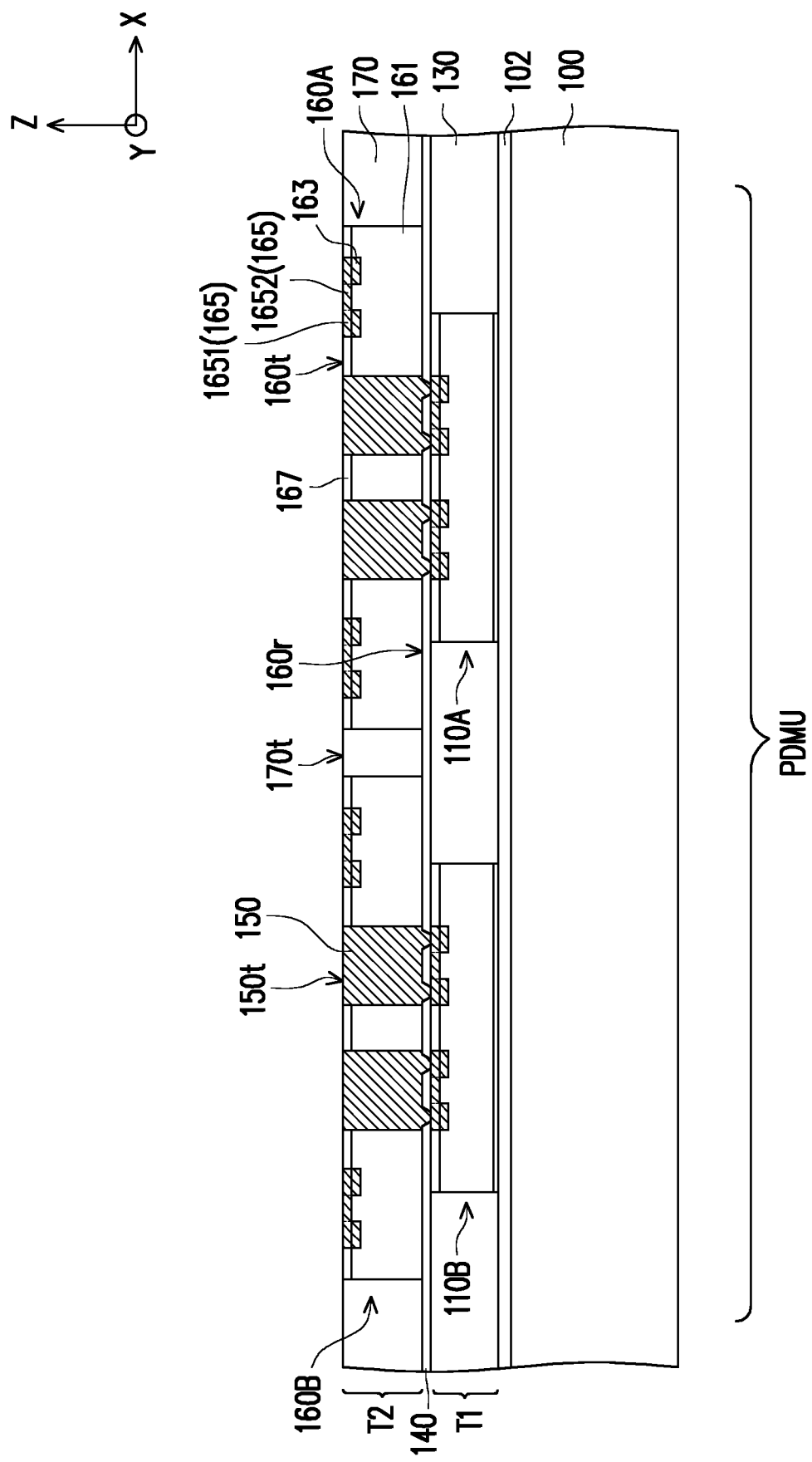

Referring to FIG. 1E, in some embodiments, semiconductor chips 160A, 160B are provided on the dielectric layer 140 beside the TIWs 150. In some embodiments, the semiconductor chips 160A, 160B are placed onto the dielectric layer 140 through a pick-and-place method. The semiconductor chip 160A may be vertically stacked with the semiconductor chip 110A and the semiconductor chip 160B may be vertically stacked with the semiconductor chip 110B. That is, the semiconductor chip 160A at least partially overlaps with the semiconductor chip 110A, and the semiconductor chip 160B at least partially overlaps with the semiconductor chip 110B. The semiconductor chips 160A, 160B may be similar to the semiconductor chips 110A, 110B. Briefly, the semiconductor chips 160 may include a semiconductor substrate 161, contact pads 163, contact posts 165 and a protective layer 167. The contact posts 165 may extend over multiple contact pads 163, and include portions 1651 extending directly over the contact pads 163, and portions 1652 extending over the semiconductor substrate 161. In some embodiments, the semiconductor chips 160A, 160B are chips of integrated passive devices.

In some embodiments, an encapsulant 170 is formed over the dielectric layer 140 to laterally encapsulate the TIWs 150 and the semiconductor chips 160. In some embodiments, the encapsulant 170 may be produced following similar processes and with similar materials as the encapsulant 130. In some embodiments, the encapsulants 130 and 170 may include different materials. In some alternative embodiments, a material of the encapsulant 130 and a material of the encapsulant 170 may be the same. The encapsulant 170 is formed so as to leave exposed the top surfaces 150t of the TIWs 150 as well as the contact posts 165 at the top surfaces 160t of the semiconductor chips 160. In some embodiments, top surfaces 150t of the TIWs 150, top surfaces of the semiconductor chip 160 and the top surface 170t of the encapsulant 170 may be substantially flush with respect to each other. In some embodiments, the TIWs 150, the semiconductor chips 160 and the encapsulant 170 are considered part of an upper tier T2 of the passive device module unit PDMU.

Figure 1F:
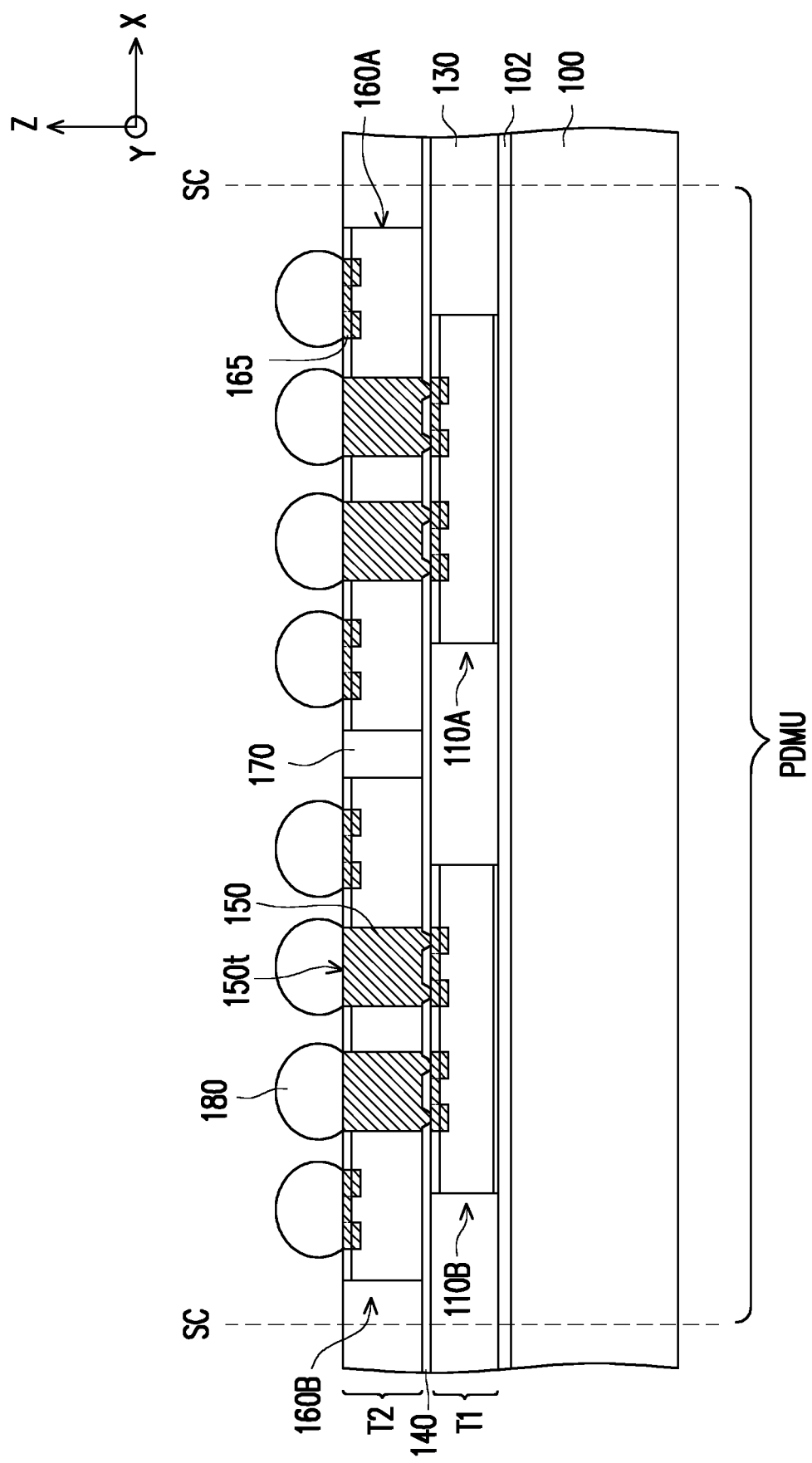

Referring to FIG. 1F, in some embodiments, connective terminals 180 are formed on the exposed top surfaces 150t of the TIWs 150 and the contact posts 165. The connective terminals 180 may include solder balls, ball grid array (BGA) connectors, metal pillars, controlled collapse chip connection (C4) bumps, micro bumps, bumps formed via electroless nickel—electroless palladium—immersion gold technique (ENEPIG), a combination thereof (e.g., a metal pillar with a solder ball attached), or the like. The connective terminals 180 are electrically connected to the semiconductor chips 110 through the TIWs 150. In some embodiments, after formation of the connective terminals 180, the reconstructed wafer may be diced, for example by cutting along the scribe lines SC, to separate the individual passive device module units PDMU. In some embodiments, the carrier 100 and the de-bonding layer 102 may be removed to produce the passive device modules PDM1 shown in FIG. 1G.

Figure 1G:
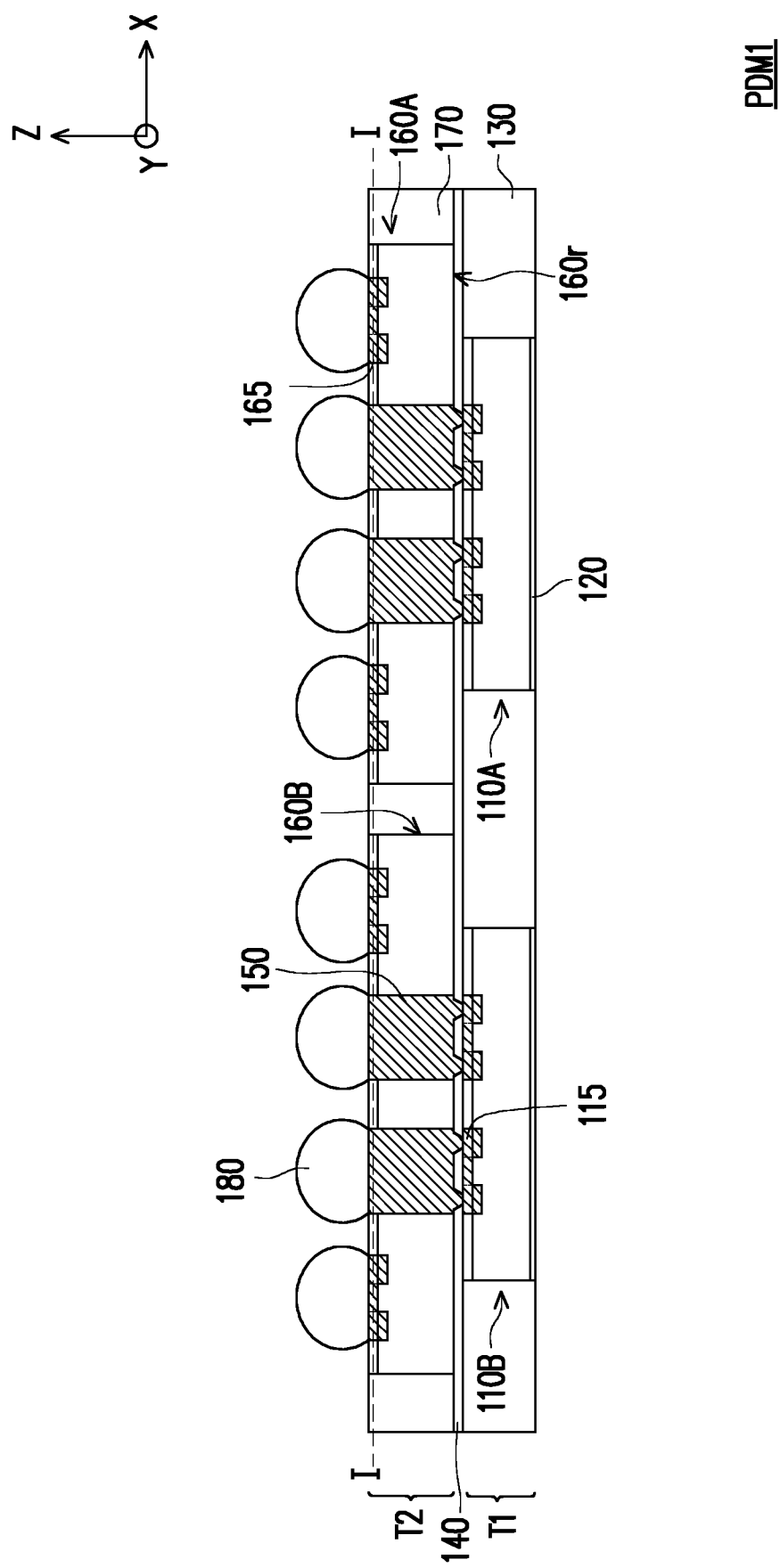
Figure 2A:
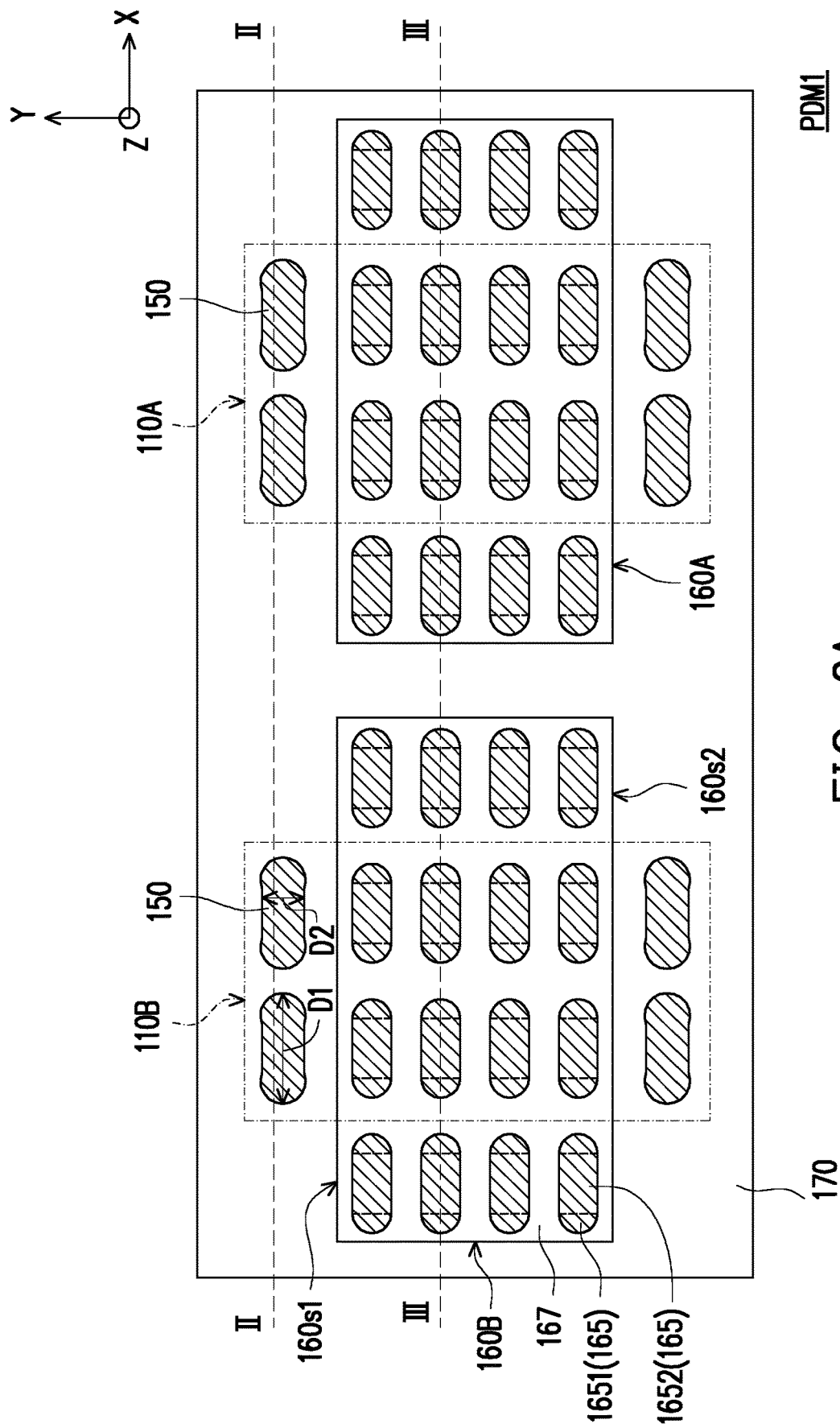
FIG. 2A to FIG. 2D are schematic cross-sectional views of a passive device module according to some embodiments of the present disclosure.
Figure 2B:
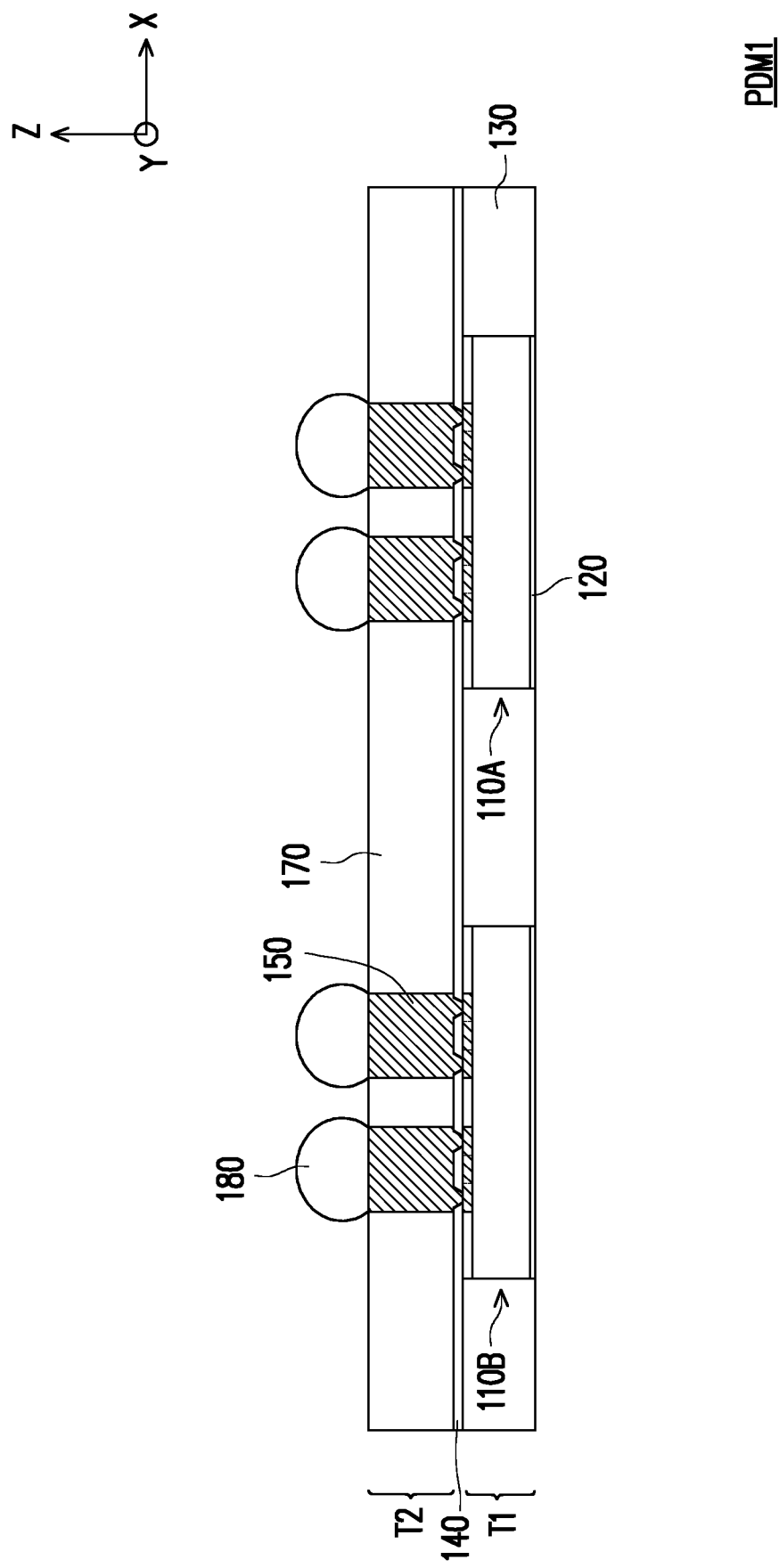
Figure 2C:
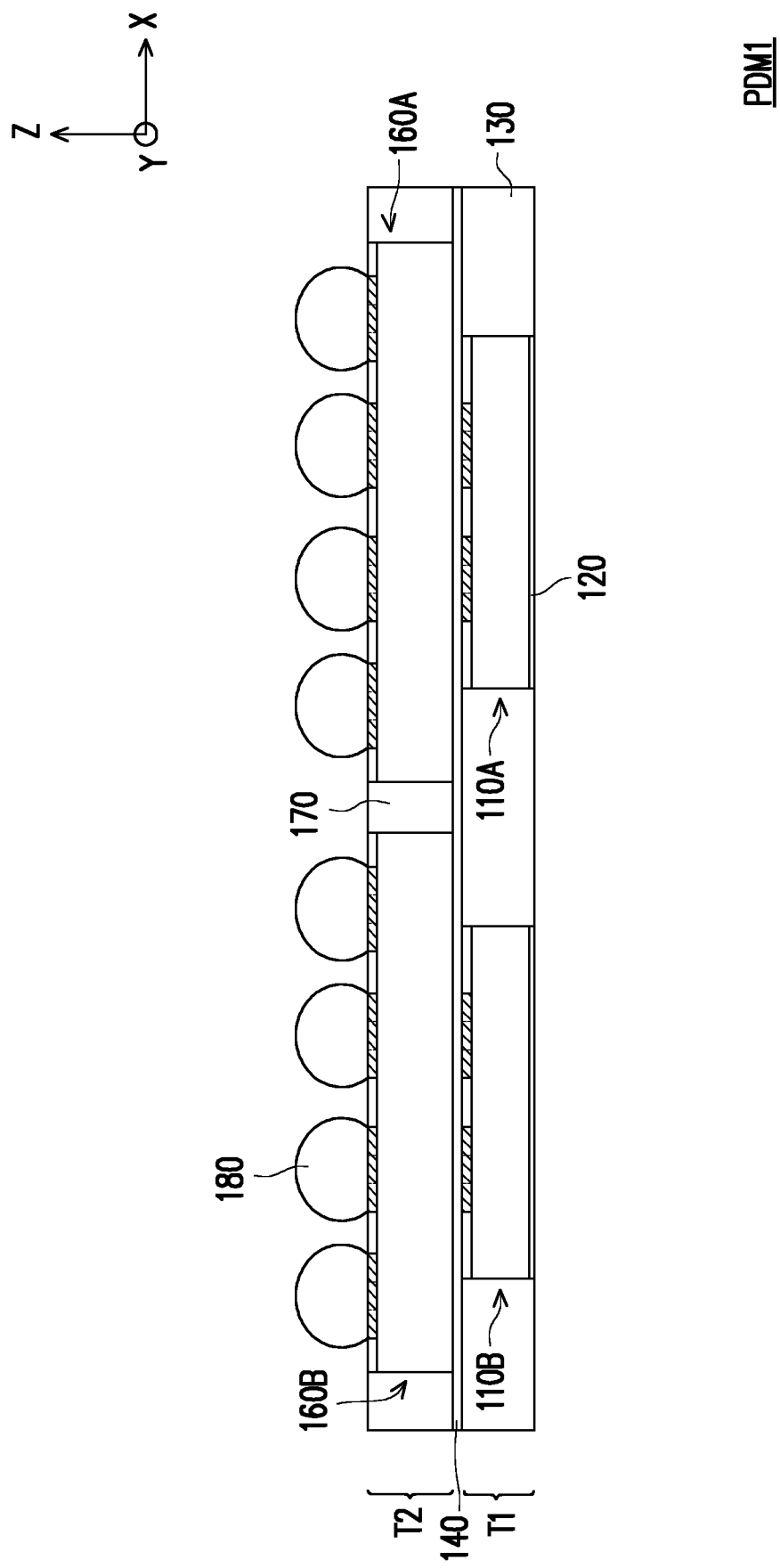

FIG. 1G is a schematic side view of a passive device module PDM1 according to some embodiments of the disclosure. FIG. 2A is a schematic cross-sectional view of the passive device module PDM1 according to some embodiments of the disclosure. The cross-sectional view of FIG. 2A is in taken at a plane defined by the directions X and Y at the level height I-I (shown in FIG. 1G) in the Z direction. In FIG. 2A the footprints of the semiconductor chips 110A, 110B are shown as dash-dotted lines for discussion purpose, even though the semiconductor chips 110A, 110B do not extend within the XY plane at which the cross-sectional view is taken. FIG. 2B and FIG. 2C are schematic cross-sectional views of the passive device module PDM1 taken in planes defined by the X and Z directions according to some embodiments of the disclosure. The schematic cross-sectional view of FIG. 2B is taken at a level height II-II in the Y direction illustrated in FIG. 2A. The schematic cross-sectional view of FIG. 2C is taken at a level height III-III in the Y direction illustrated in FIG. 2A. Referring to FIG. 1G and FIG. 2A to FIG. 2C, in some embodiments, the passive device module PDM1 includes semiconductor chips 110 encapsulated in an encapsulant 130 in a lower tier T1, and semiconductor chips 160 encapsulated in an encapsulant 170 in an upper tier T2. In some embodiments, the semiconductor chips 110 face the rear surfaces 160r of the overlying semiconductor chips 160. The semiconductor chips 160 of the upper tier T2 partially overlap with the semiconductor chips 110 of the lower tier T1. That is, at least a portion of the semiconductor chips 110 of the lower tier T1 is not covered by the semiconductor chips 160 of the upper tier T2. For example, the semiconductor chips 110 may have an elongated profile (e.g., a rectangular footprint) with the longest side disposed along the Y direction, and the semiconductor chips 160 may have an elongated profile (e.g., a rectangular footprint) with the longest side disposed along the X direction. As such, the semiconductor chips 110 may have a greater extension in the Y direction than the overlaying semiconductor chips 160. The TIWs 150 may be formed on contact posts 115 which are not covered by the semiconductor chips 160. In some embodiments, as illustrated in FIG. 2A, the semiconductor chips 110 may protrude from both opposite sides of the semiconductor chips 160 in the Y direction, and the TIWs 150 may be disposed on opposite sides of the semiconductor chips 160. As such, opposite side surfaces 160s1, 160s2 of the semiconductor chips 160 may both face TIWs 150 along the Y direction. The TIWs 150 may extend through the encapsulant 170 on the side of the semiconductor chip 160 to provide electrical connection between the connective terminals 180 formed on the upper tier T2 and the semiconductor chips 110. In some embodiments, the TIWs 150 may have an elongated profile, with a dimension D1 along the X direction (the direction of the side surfaces 160s1 and 160s2) being larger than a dimension D2 along the Y direction. In some embodiments, a ratio of the dimension D1 to the dimension D2 is in the range from 1 to 5. As illustrated in FIG. 2B, in some embodiments cross-sectional views of the passive device module PDM1 taken at the level height II-II in the Y direction (shown in FIG. 2A) may reveal only the semiconductor chips 110 of the lower tier T1, together with the overlying TIWs 150. Similarly, in FIG. 2C, the cross-sectional view of the passive device module PDM1 taken at the level height III-III in the Y direction (shown in FIG. 2A) may reveal the stacked semiconductor chips 110, 160, while the TIWs 150 may not be visible. In some embodiments, the connective terminals 180 may be used to integrate the passive device module PDM1 in larger devices (not shown). In some embodiments, by packaging the semiconductor chips 110, 160 as disclosed herein it is possible to achieve higher density of integrated passive devices within a passive device module PDM1, reducing the form factor and the parasitic inductance of the same.

Figure 2D:
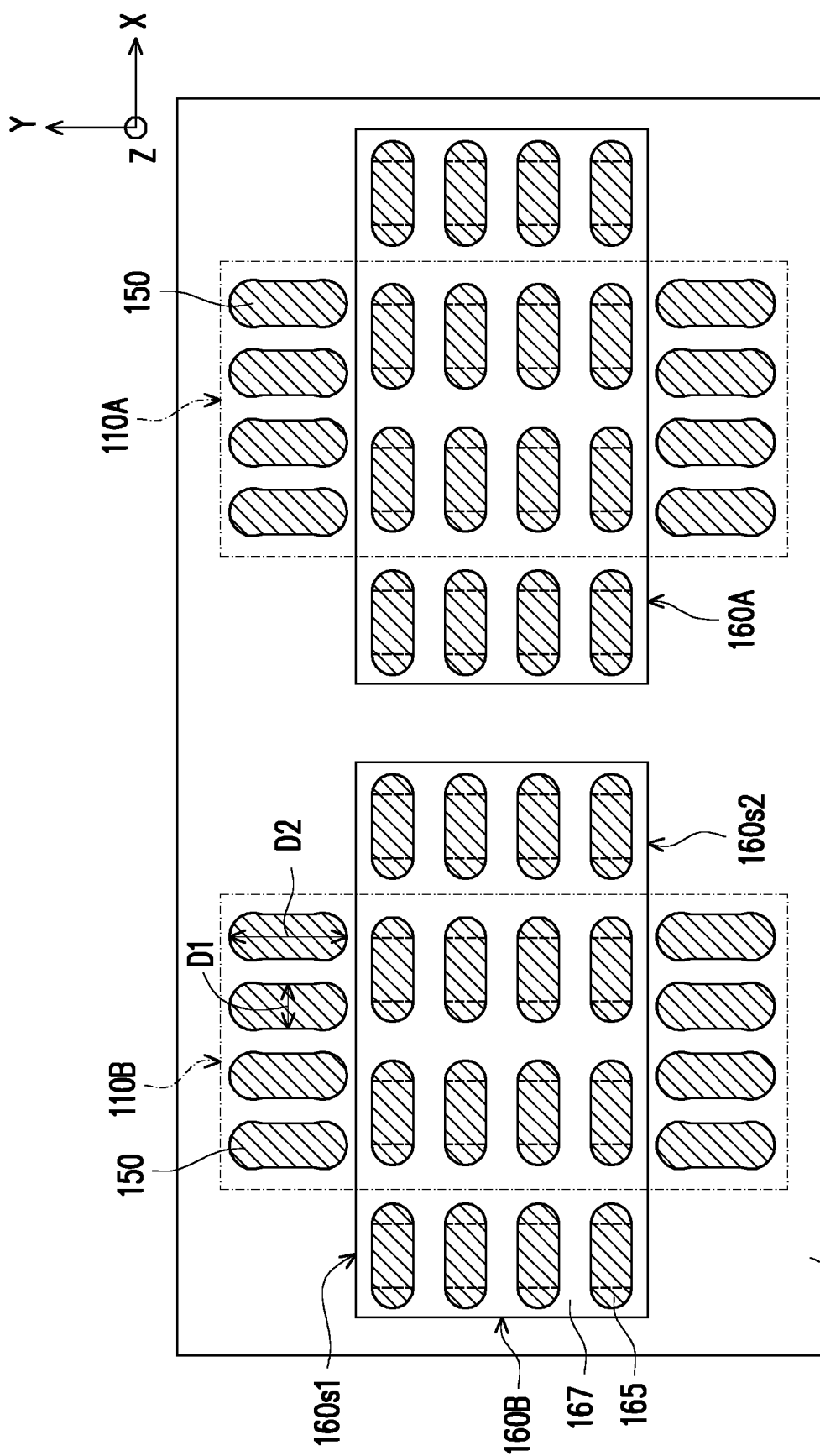

FIG. 2D is a schematic cross-sectional view of a passive device module PDM1B according to some embodiments of the disclosure. The cross-sectional view of FIG. 2D is taken at the same level height I-I (shown in FIG. 1G) of the cross-sectional view of FIG. 2A. In some embodiments, a difference between the passive device module PDM1B of FIG. 2D and the passive device module PDM1 of FIG. 2A lies in the orientation of the TIWs 150. That is, the TIWs 150 of the passive device module PDM1B may have the dimension D1 along the X direction smaller than the dimension D2 along the Y direction. Alternatively stated, the TIWs 150 may have the larger dimension (e.g., the dimension D2) oriented along a different direction (e.g., the direction Y) than the extending direction (e.g., the direction X) of the facing side surface (e.g., 160s1) of the adjacent semiconductor chip 160 (the semiconductor chip 160 directly faced by the TIWs 150).

Figure 2E:
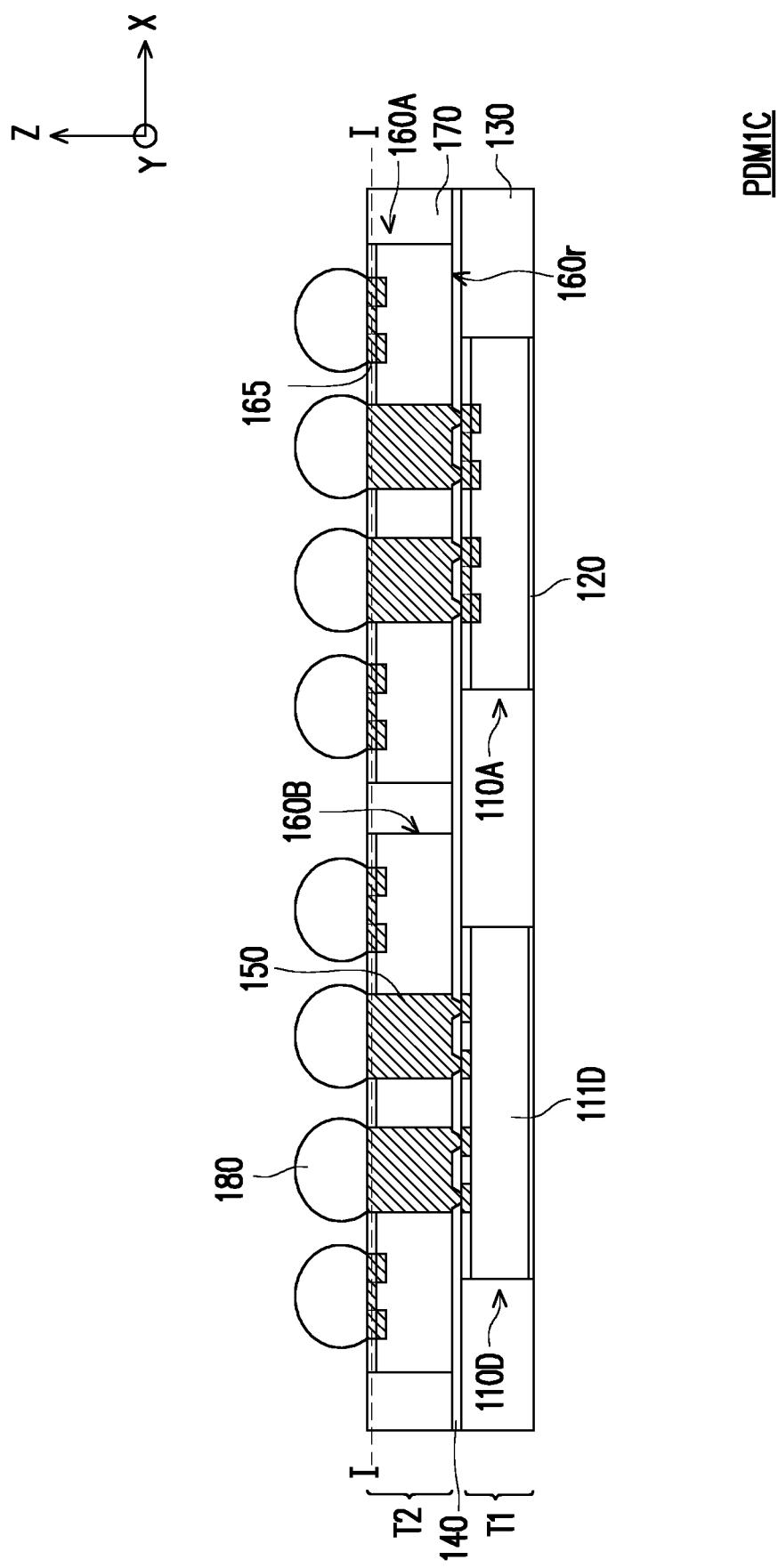
FIG. 2E is a schematic side view of a passive device module according to some embodiments of the present disclosure.

FIG. 2E is a schematic side view of a passive device module PDM1C according to some embodiments of the disclosure. In some embodiments, a difference between the passive device module PDM1C of FIG. 2E and the passive device module PDM1 of FIG. 1G lies in that one or more of the semiconductor chips 110, 160 have been replaced by semiconductor dies including active devices. For example, a semiconductor die 110D is disposed in the lower tier T1 in place of the semiconductor chip 110B. The semiconductor die 110D includes active devices formed in the semiconductor substrate 111D, and may function as a logic die. In some alternative embodiments, the semiconductor die 110D may function as a memory die. That is, the semiconductor die 110D may be or function as an active device. In some embodiments, a passive device module includes a greater number of integrated passive devices than active devices.

Figure 3A:
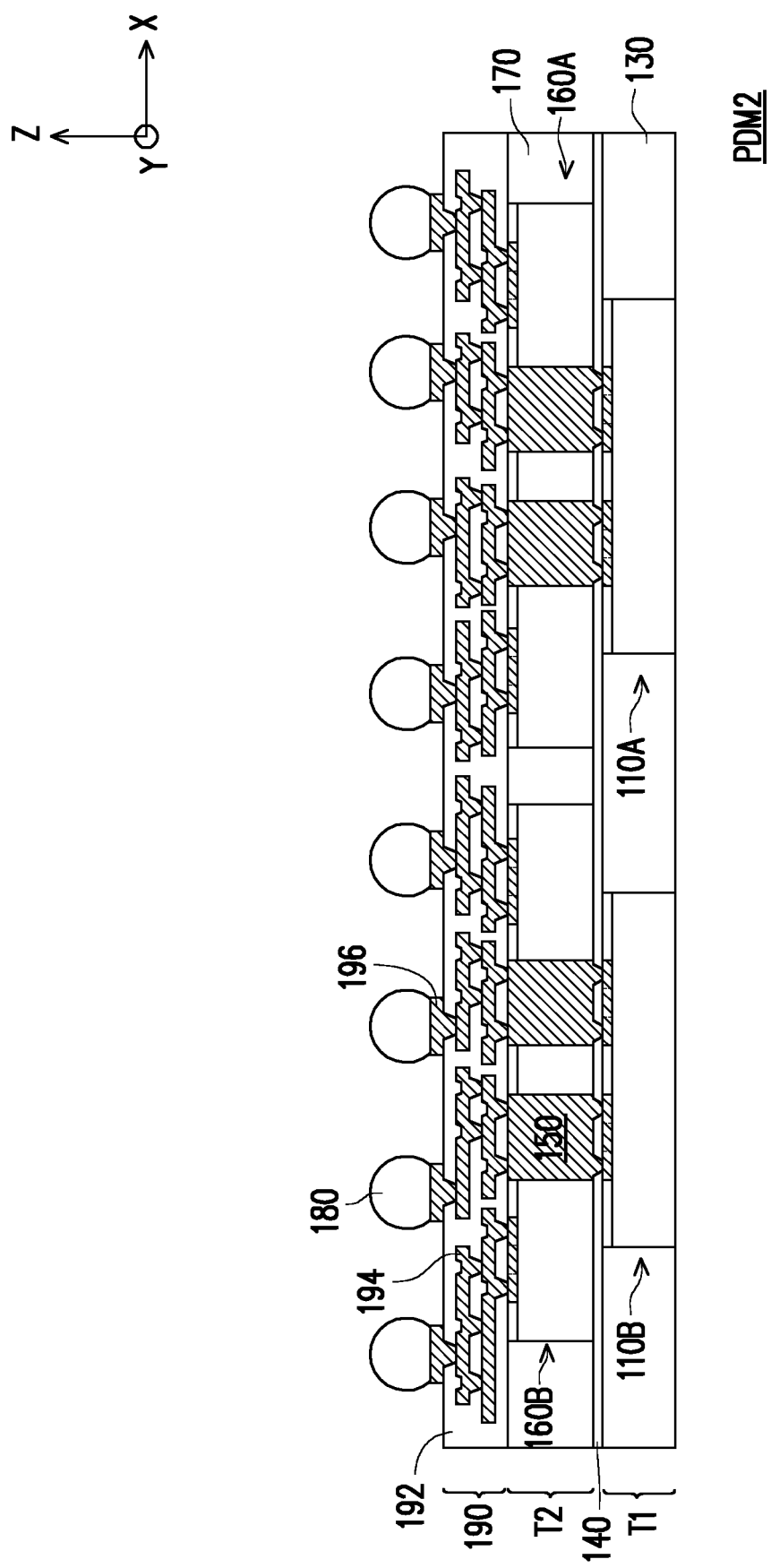
FIG. 3A and FIG. 3B are schematic side views of passive device modules according to some embodiments of the present disclosure.

FIG. 3A is a schematic side view of a passive device module PDM2 according to some embodiments of the disclosure. In some embodiments, the passive device module PDM2 is similar to the passive device module PDM1 of FIG. 1G and further includes a redistribution structure 190 formed on the upper tier T2 and interposed between the semiconductor chips 160A, 160B, the TIWs 150 and the connective terminals 180. In some embodiments, the redistribution structure 190 includes a dielectric layer 192, a redistribution conductive layer 194, and a plurality of under-bump metallurgies 196. For simplicity, the dielectric layer 192 is illustrated as a single dielectric layer and the redistribution conductive layer 194 is illustrated as embedded in the dielectric layer 192. Nevertheless, from the perspective of the manufacturing process, the dielectric layer 192 is constituted by at least two dielectric layers. The redistribution conductive layer 194 may be constituted by a plurality of redistribution conductive patterns. The redistribution conductive patterns of the redistribution conductive layer 194 are sandwiched between the two adjacent dielectric layers. Some of the redistribution conductive patterns may extend vertically through the dielectric layer 192 to establish electrical connection between different metallization tiers of the redistribution structure 190. In some embodiments, the (outermost) dielectric layer 192 may be patterned to expose the underlying redistribution conductive layer 194. The under-bump metallurgies 196 may optionally be conformally formed in the openings of the (outermost) dielectric layer 192 exposing the redistribution conductive layer 194 and may further extend over portions of the exposed surface of the (outermost) dielectric layer 192. In some embodiments, the under-bump metallurgies 196 include multiple stacked layers. For example, the under-bump metallurgies 196 may include one or more metallic layers stacked on a seed layer.

In some embodiments, materials of the redistribution conductive layer 194 and the under-bump metallurgies 196 include aluminum, titanium, copper, nickel, tungsten, or alloys thereof. The redistribution conductive layer 194 and the under-bump metallurgies 196 may be formed by, for example, electroplating, deposition, and/or photolithography and etching. In some embodiments, the material of the dielectric layer 192 includes polyimide, epoxy resin, acrylic resin, phenol resin, benzocyclobutene (BCB), polybenzo-oxazole (PBO), or any other suitable polymer-based dielectric material. The dielectric layer 192, for example, may be formed by suitable fabrication techniques such as spin-on coating, chemical vapor deposition (CVD), plasma-enhanced chemical vapor deposition (PECVD), or the like. It should be noted that the number of the redistribution conductive layers 194 and the number of the dielectric layers 192 illustrated in FIG. 1A are merely for illustrative purposes, and the disclosure is not limited thereto. In some alternative embodiments, fewer or more layers of the redistribution conductive layer 194 and fewer or more layers of the dielectric layer 192 may be formed depending on the circuit design. When more layers of the redistribution conductive layer 194 and more layers of the dielectric layer 192 are required, the layers of the redistribution conductive layers 194 are still stacked alternately with the layers of the dielectric layer 192.

In some embodiments, the passive device module PDM2 of FIG. 3A may be fabricated following a similar process described above for the passive device module PDM1 with respect to FIG. 1A to FIG. 1F. For example, the redistribution structure 190 may be formed on the structure illustrated in FIG. 1E before forming the connective terminals 180. Thereafter, the connective terminals 180 may be provided, the passive device modules PDM2 may be diced and the carrier 100 may be removed.

Figure 3B:
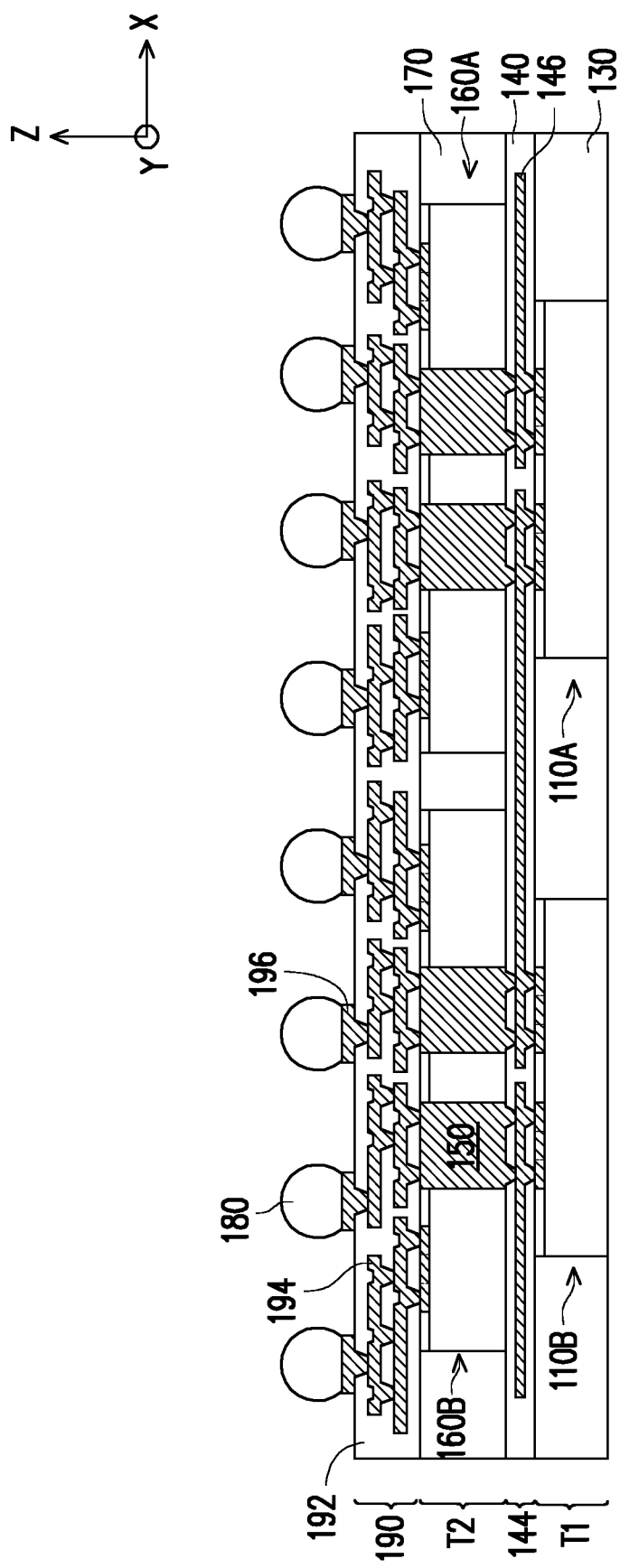

FIG. 3B is a schematic side view of a passive device module PDM2B according to some embodiments of the disclosure. In some embodiments, the passive device module PDM2B is similar to the passive device module PDM2 of FIG. 3A and further includes a redistribution structure 144 formed on the lower tier T1 and interposed between the lower tier T1 and the upper tier T2. In some embodiments, the redistribution structure 144 may include the dielectric layer 140 and redistribution conductive layers 146 embedded in the dielectric layer 140. In some embodiments, the redistribution conductive layer 144 may interconnect the semiconductor chips 110A, 110B of the lower tier T1, and further provide electrical connection between the semiconductor chips 110A, 110B and the TIWs 150.

Figure 4A:
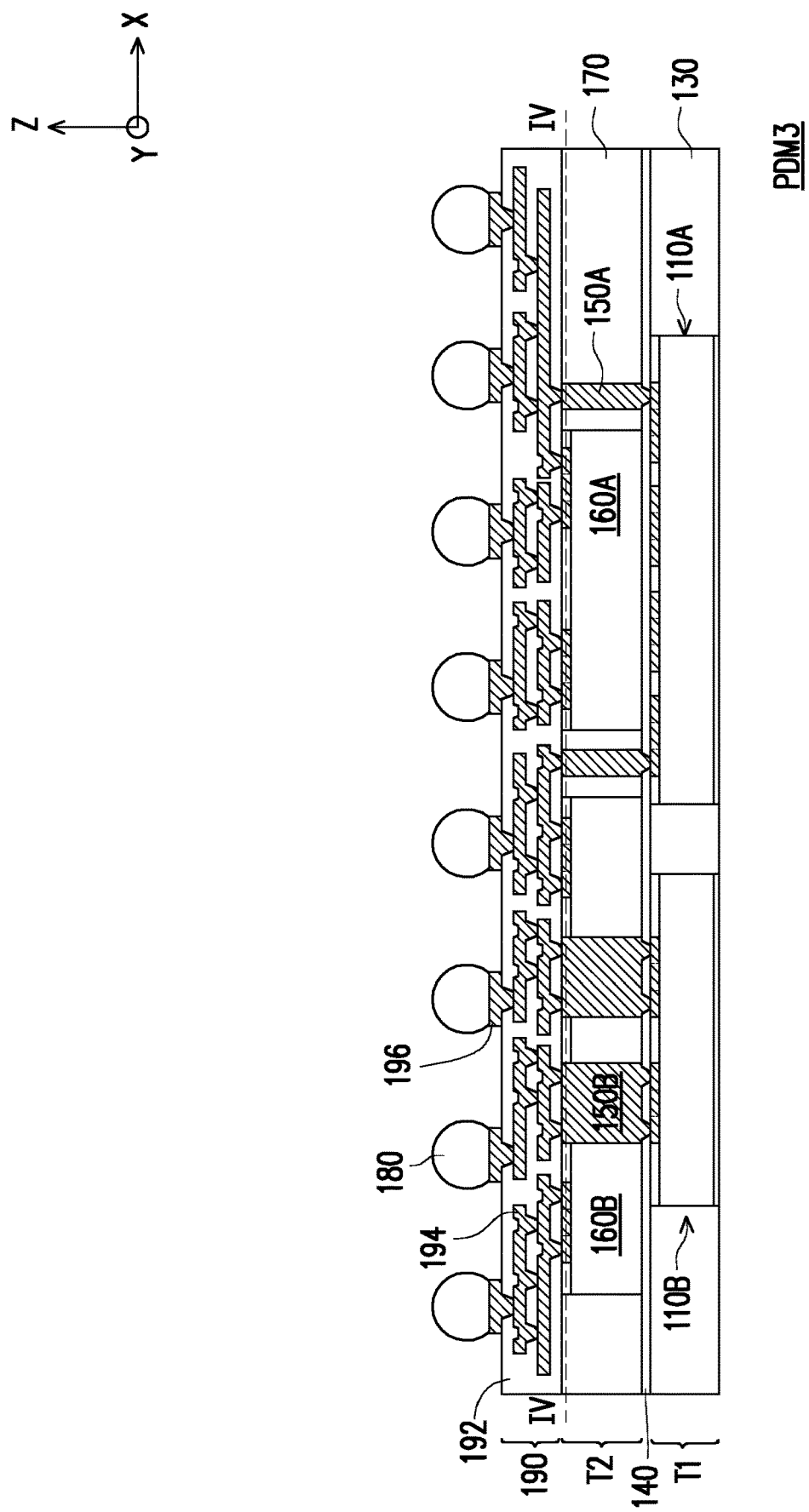
FIG. 4A is a schematic side view of a passive device module according to some embodiments of the present disclosure.
Figure 4B:
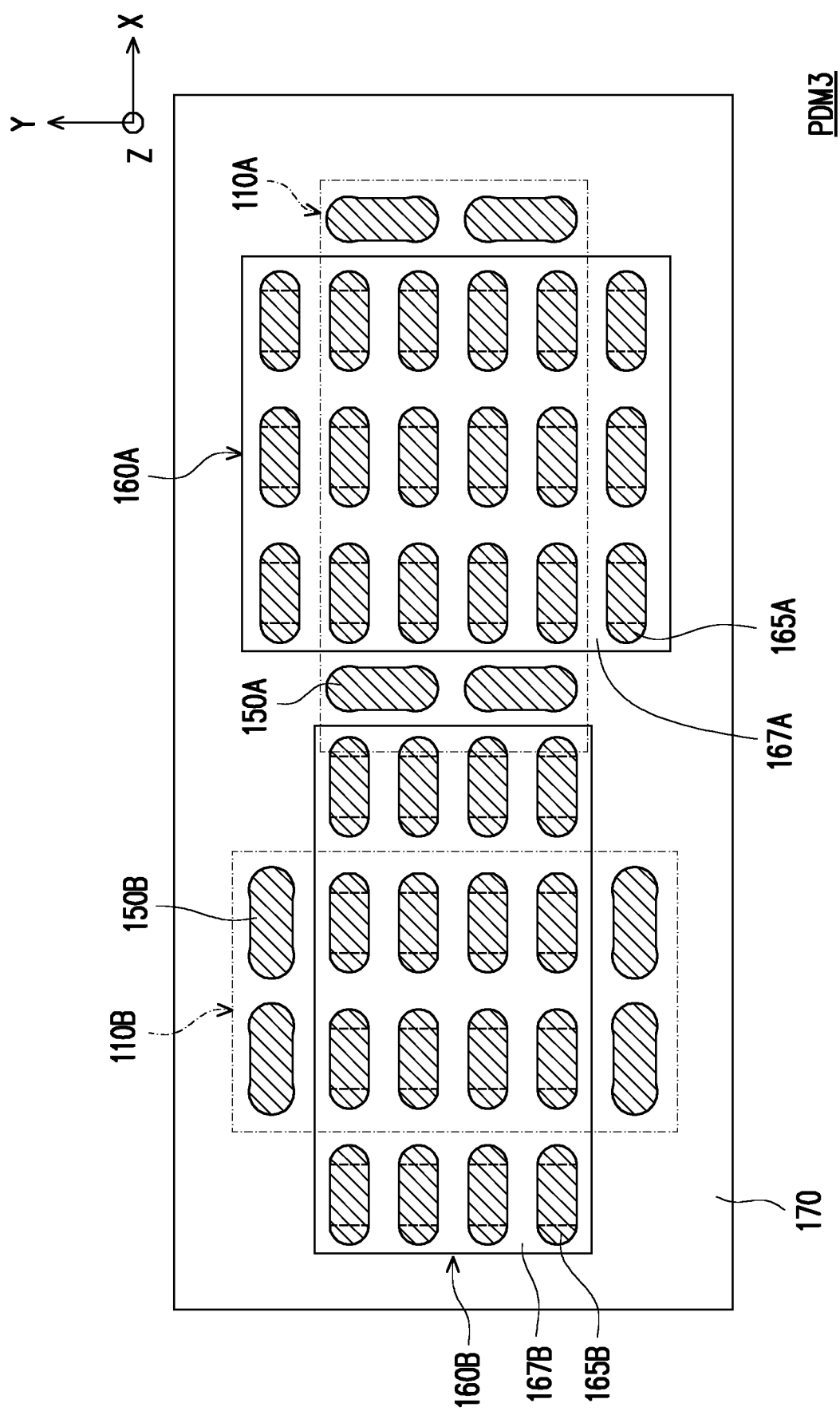
FIG. 4B is a schematic cross-sectional view of a passive device module according to some embodiments of the present disclosure.

FIG. 4A is a schematic side view of a passive device module PDM3 according to some embodiments of the disclosure. FIG. 4B is a schematic cross-sectional view of the passive device module PDM3 of FIG. 4A in the XY plane, taken at the level height IV-IV in the Z direction (shown in FIG. 4A). In some embodiments, the semiconductor chips 110, 160 and the TIWs 150 may be oriented along different directions than what illustrated in the passive device modules PDM1 and PDM2 previously discussed. For example, in the semiconductor device PDM3 a semiconductor chip 110A of the lower tier T1 may protrude along the X direction with respect to the overlying semiconductor chip 160A of the upper tier T2, and another semiconductor chip 110B of the lower tier T1 may protrude along the Y direction with respect to the overlying semiconductor chip 160B of the upper tier T2. In some embodiments, the semiconductor chips 110, 160 may have an elongated shape (e.g., a rectangular footprint). In some embodiments, the semiconductor chip 110A may have the longer sides of the footprint extending along the X direction and the semiconductor chip 110B may have the longer sides extending along the Y direction. In some embodiments, the semiconductor chip 160A may have the longer sides extending along the Y direction and the semiconductor chip 160B may have the longer sides extending along the X direction. In some embodiments, the semiconductor chip 160B may partially overlap with both of the semiconductor chips 110A and 110B of the lower tier T1. In some embodiments, the TIWs 150A formed on the semiconductor chips 110A may have an elongated shape, with the longer dimension extending along the Y direction. Some of the TIWs 150A may be disposed between the semiconductor chips 160A and 160B of the upper tier T2. The TIWs 150B formed on the semiconductor chip 110B may also have an elongated shape, with the longer dimension extending along the X direction. In some embodiments, the semiconductor chip 160B may face TIWs 150A and 150B formed on each one of the semiconductor chips 110A and 110B. In some embodiments, the semiconductor chip 160B has TIWs 150A and 150B extending along three sides.

Figure 5A:
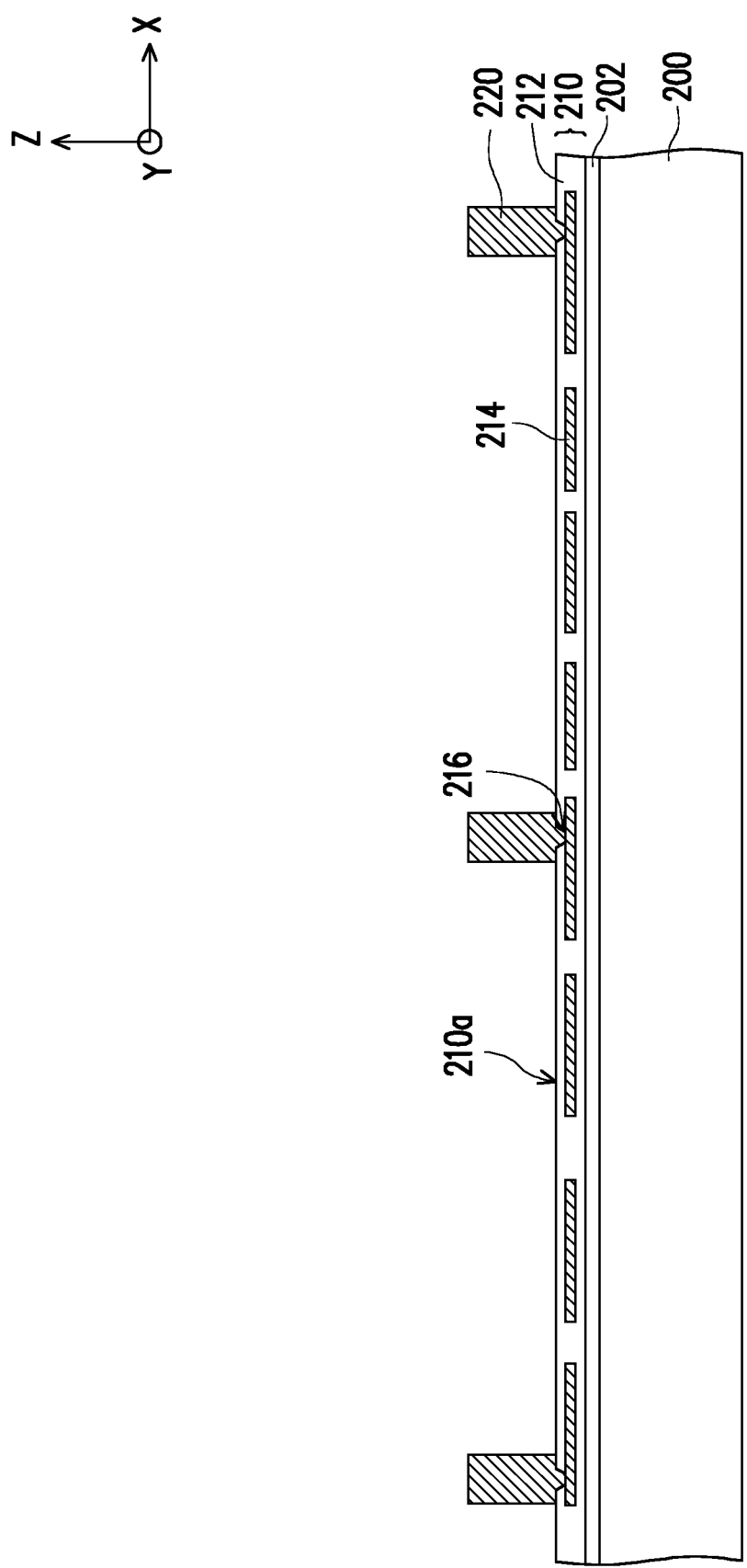
FIG. 5A to FIG. 5G are schematic side views of structures produced at various stages of a manufacturing method of a passive device module according to some embodiments of the present disclosure.

FIG. 5A to FIG. 5G are schematic side views of structures produced during a manufacturing process of a passive device module PDM4. Referring to FIG. 5A, a carrier 200 (optionally with a de-bonding layer 202 formed thereon) is provided. In some embodiments, the carrier 200 is a glass substrate, a metal plate, a plastic supporting board or the like, but other suitable substrate materials may be used as long as the materials are able to withstand the subsequent steps of the process. In some embodiments, the de-bonding layer 202 includes a light-to-heat conversion (LTHC) release layer. In some embodiments, a backside redistribution structure 210 is formed on the carrier 200. The backside redistribution structure 210 includes a dielectric layer 212 and a redistribution conductive layer 214 embedded in the dielectric layer 210. In some embodiments, the dielectric layer 212 blanketly extends over the carrier 200, and includes openings 216 of a surface 210a further away from the carrier 200. Portions of the redistribution conductive layer 214 are exposed through the openings 216. In some embodiments, the backside redistribution structure 210 may be fabricated following similar processes as described above for the redistribution structure 190. In some embodiments, TIWs 220 may be formed on the backside redistribution structure 210 in correspondence of the openings 216. The TIWs 220 may fill the openings 216 to contact the redistribution conductive layer 214. Briefly, the TIWs 220 may be fabricated by depositing a conductive material in the openings of an auxiliary mask (not shown) which is subsequently removed, or may be formed by pick-and-placing pre-fabricated metal pieces on the backside redistribution structure 210.

Figure 5B:
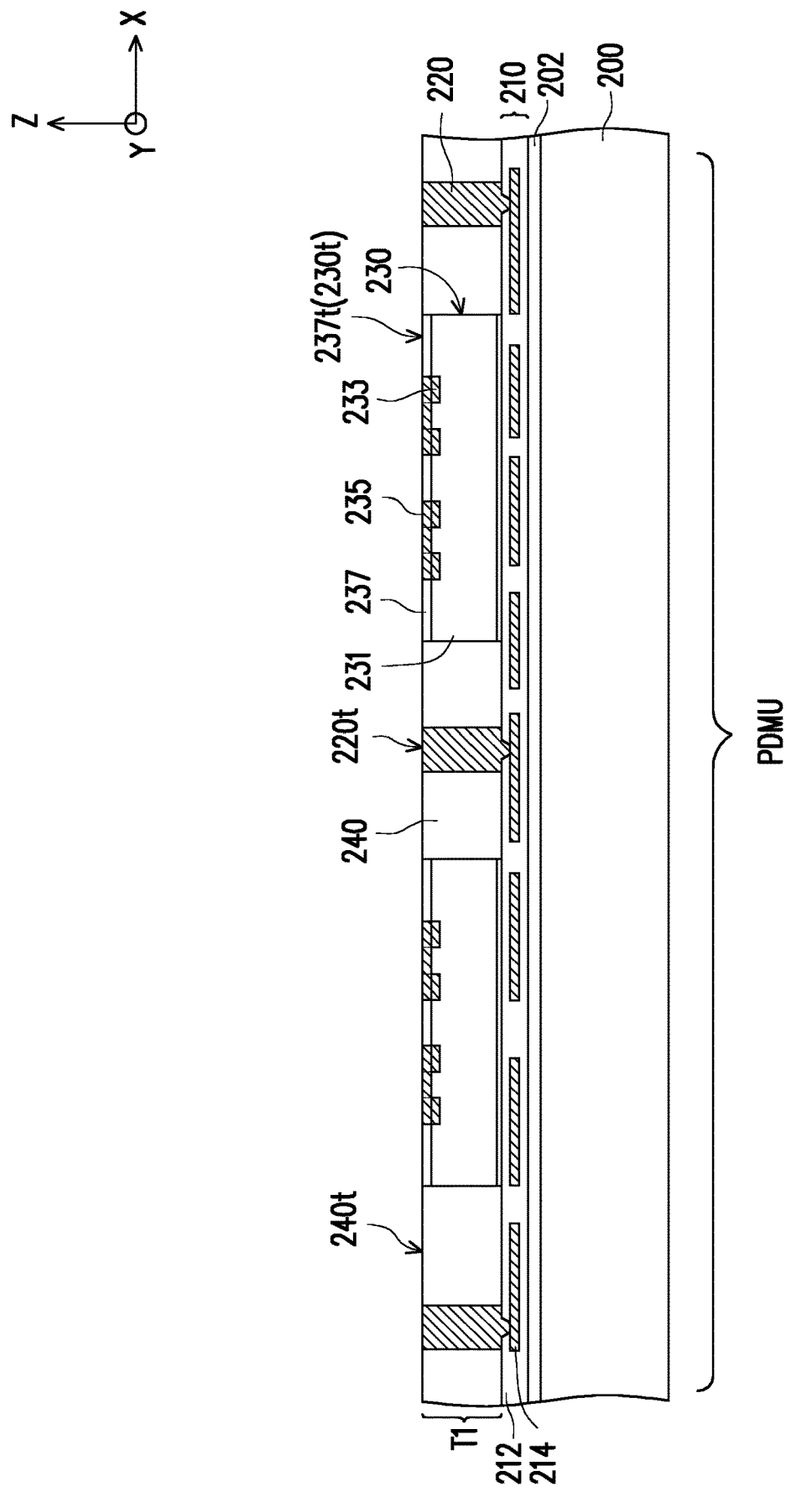

Referring to FIG. 5B, semiconductor chips 230 may be disposed on the backside redistribution structure 210 in between the TIWs 220. In some embodiments, each semiconductor chip 230 includes a semiconductor substrate 231, contact pads 233 formed on the semiconductor substrate 231, contact posts 235 formed on the contact pads 233 and a protective layer 237 covering the top surface of the semiconductor substrate 231. In some embodiments, the semiconductor chips 230 are disposed in a face-up configuration, with top surfaces 230t where the contact posts 235 are exposed (contact surfaces) further away from the backside redistribution structure 210. In some embodiments, the semiconductor chips 230 are chips of integrated passive devices. In some embodiments, an encapsulant 240 is formed on the backside redistribution structure 210 to laterally wrap the TIWs 220 and the semiconductor chips 230. In some embodiments, a material and a fabrication process of the encapsulant 240 may be similar to the material and fabrication process discussed above for the encapsulant 130. In some embodiments, the top surface 240t of the encapsulant is substantially flush with the top surfaces 220t of the TIWs 220 and the contact surfaces 230t of the semiconductor chips 230. In some embodiments, the semiconductor chips 230 and the TIWs 220 embedded in the encapsulant 240 may be considered a lower tier T1 of the passive device module unit PDMU.

Figure 5C:
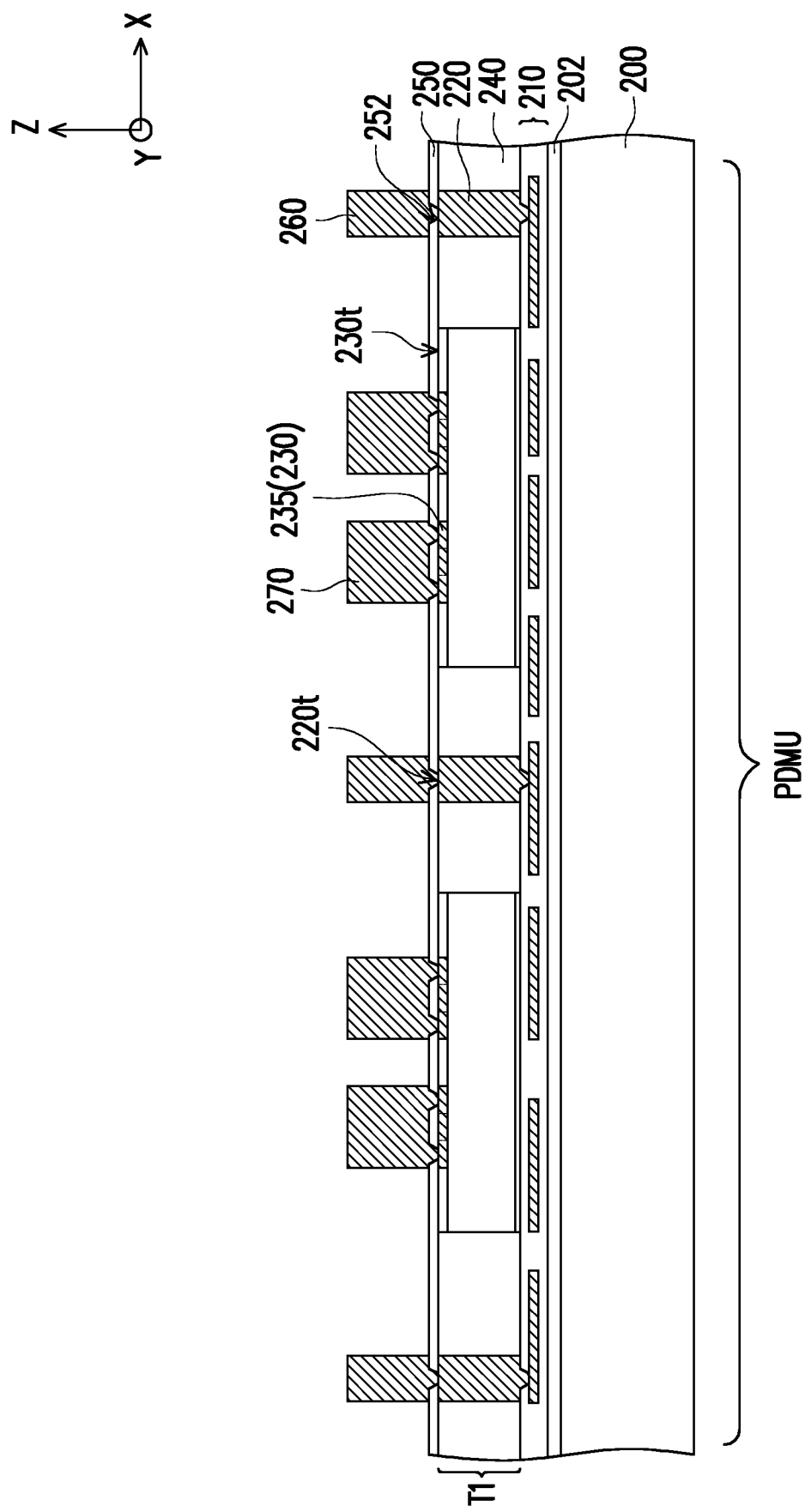

Referring to FIG. 5C, in some embodiments, a dielectric layer 250 is formed on the TIWs 220, the semiconductor chips 230, and the encapsulant 240. The dielectric layer 250 is patterned to include openings 252 exposing the underlying contact posts 235 of the semiconductor chips 230 and the top surfaces 220t of the TIWs 220. The dielectric layer 250 may be a single layer or a multi-layered structure, and may include polymer such as PBO, other suitable dielectric materials, or combinations thereof. The dielectric layer 250 may be formed by suitable fabrication techniques such as spin-on coating, chemical vapor deposition (CVD), or the like. In some embodiments, TIWs 260 are formed over the TIWs 220 and TIWs 270 are formed over the semiconductor chips 230. In some embodiments, as for the TIWs 220, the TIWs 260 and the TIWs 270 may be plated on the exposed portions of the TIWs 220 and the contact posts 115, respectively, or may be pre-fabricated metal pieces. In some embodiments, the TIWs 260 are electrically connected to the backside redistribution structure 210 via the TIWs 220. That is, the TIWs 260 may be stacked over the TIWs 220, and the TIWs 270 may be stacked over the semiconductor chips 230.

Figure 5D:
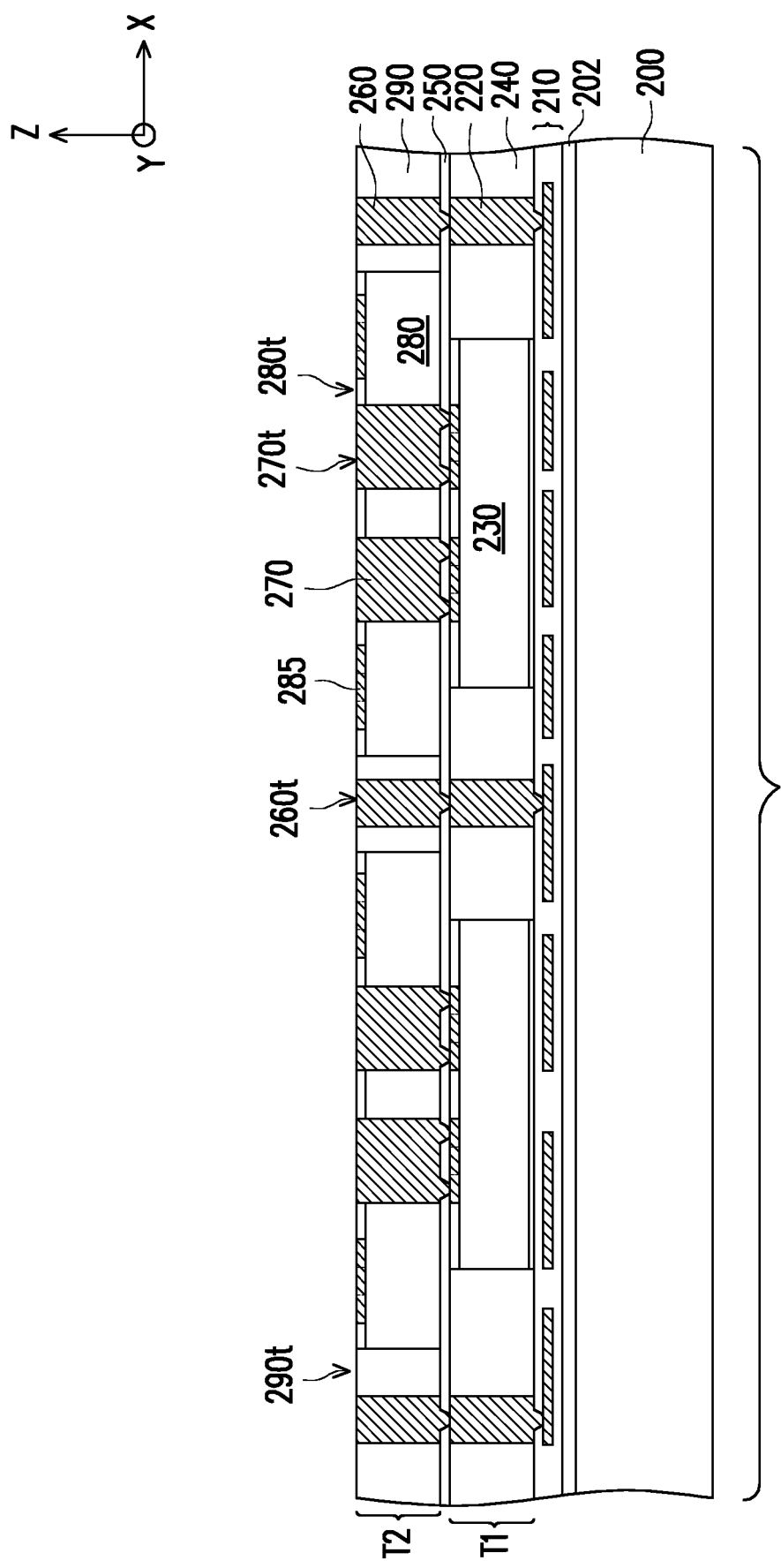

Referring to FIG. 5D, in some embodiments, semiconductor chips 280 are provided on the dielectric layer 250 beside the TIWs 260. In some embodiments, the semiconductor chips 280 are placed onto the dielectric layer 250 through a pick-and-place method. The semiconductor chips 280 may be disposed on the dielectric layer 250 with the top surfaces 280t exposing the contact posts 285 further away from the dielectric layer 250. The semiconductor chips 280 may be vertically stacked and partially overlap with the semiconductor chips 230. That is, at least a portion of each semiconductor chip 230 may be left exposed by the overlying semiconductor chip(s) 280. The semiconductor chips 280 may be similar to the semiconductor chips 230. In some embodiments, the semiconductor chips 280 are integrated passive devices. In some embodiments, an encapsulant 290 is formed over the dielectric layer 250 to laterally encapsulate the TIWs 260, 270 and the semiconductor chips 280. In some embodiments, the encapsulant 290 may be produced following similar processes and with similar materials as described above for the encapsulant 130. The encapsulant 290 is formed so as to leave exposed the top surfaces 260t, 270t of the TIWs 260, 270 as well as the contact posts 285 at the top surfaces 280t of the semiconductor chips 280. In some embodiments, top surfaces 260t, 270t of the TIWs 260, 270, top surfaces 280t of the semiconductor chips 280 and the top surface 290t of the encapsulant 290 may be substantially flush with respect to each other. In some embodiments, the TIWs 260, 270, the semiconductor chips 280 and the encapsulant 290 are considered part of an upper tier T2 of the passive device module unit PDMU.

Figure 5E:
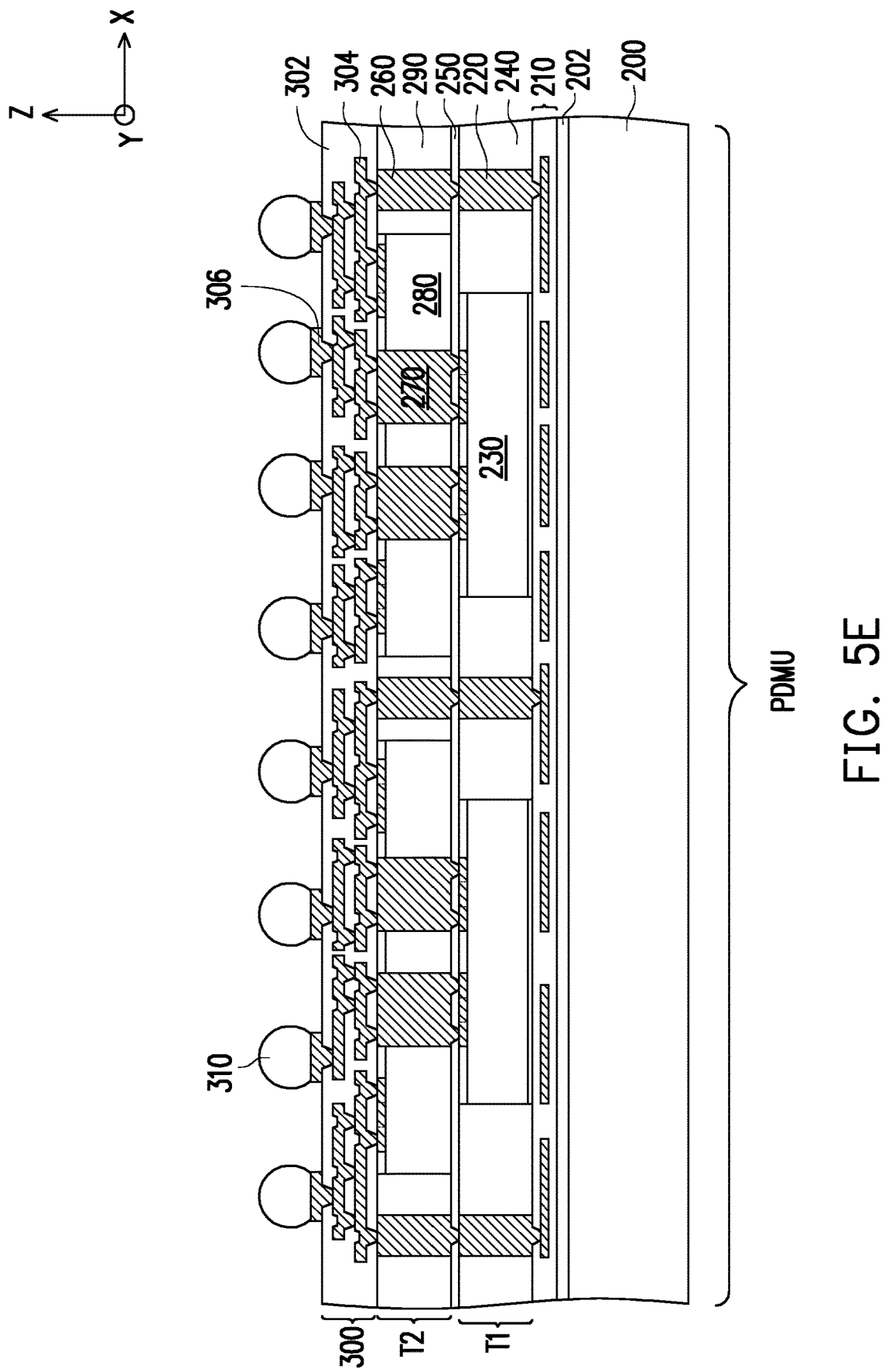

Referring to FIG. 5E, in some embodiments a redistribution structure 300 may be formed over the encapsulant 290, the semiconductor chips 280 and the TIWs 260, 270. The redistribution structure 300 includes a dielectric layer 302, a redistribution conductive layer 304 embedded in the dielectric layer 302, and, optionally, under-bump metallurgies 306 disposed on an opposite side of the redistribution structure 300 with respect to the semiconductor chips 280. In some embodiments, the redistribution structure 300 is directly electrically connected to the semiconductor chips 280, is electrically connected to the semiconductor chips 230 through the TIWs 270, and is electrically connected to the backside redistribution structure 210 through the TIWs 260 and 220. Connective terminals 310 may be provided on the under-bump metallurgies 306. Materials and fabrication processes for the redistribution structure 300 and the connective terminals 310 may be similar to the ones previously described for the redistribution structure 190 and the connective terminals 180, respectively.

Figure 5F:
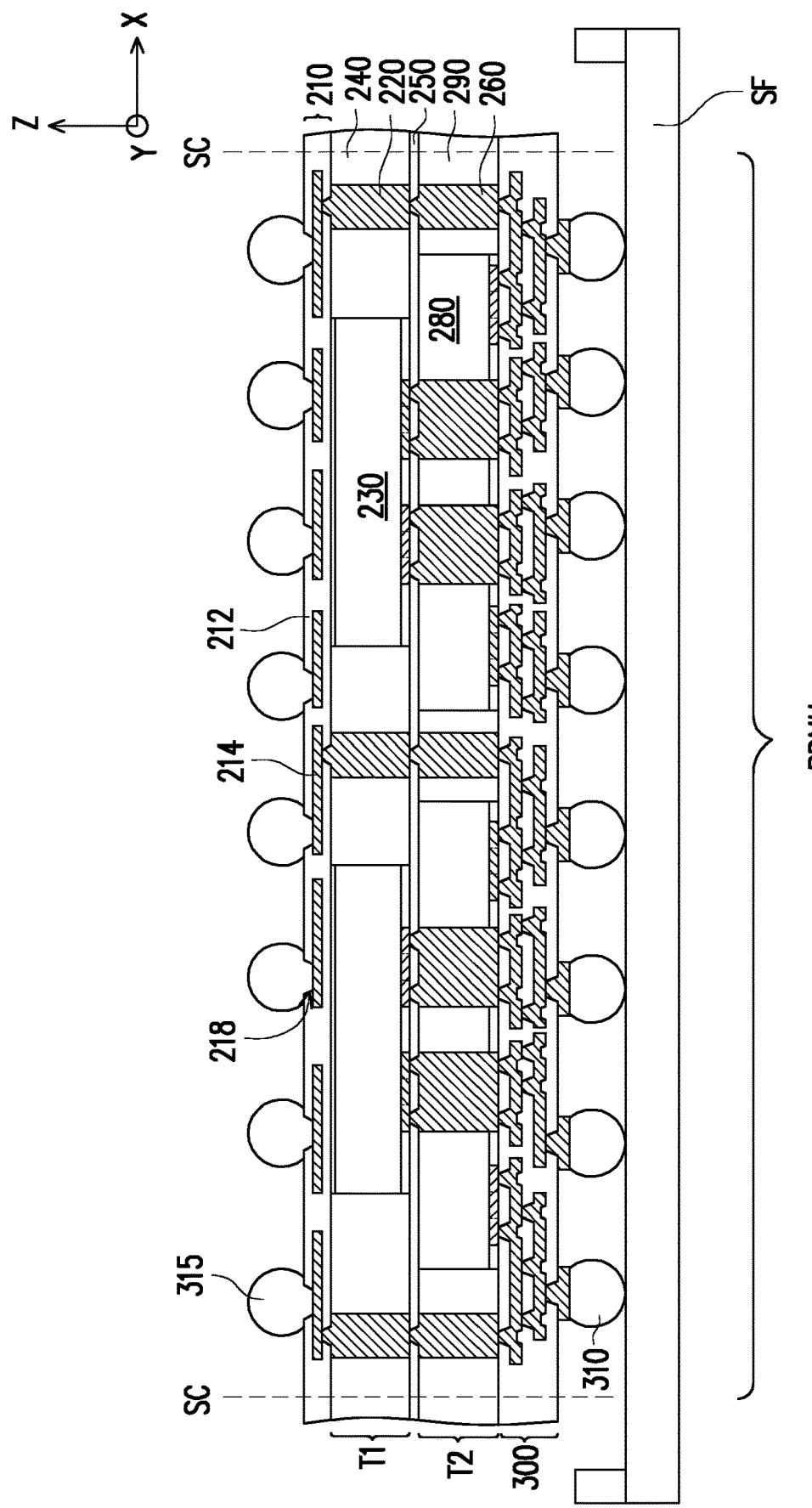

Referring to FIG. 5E and FIG. 5F, the reconstructed wafer may be overturned over a supporting frame SF to continue the manufacturing process. In some embodiments, the surface of the redistribution structure 300 where the connective terminals 310 have been formed is disposed closer to the supporting frame SF. The carrier 200 is removed to expose the backside redistribution structure 210 for further processing. In some embodiments, the connective terminals 310 may be embedded in a protective tape (not shown). In some embodiments, openings 218 may be formed in the dielectric layer 212 of the backside redistribution structure 210 to expose portions of the redistribution conductive layer 214, for example by laser drilling. Connective terminals 315 may be formed in correspondence of the openings 218 to be electrically connected with the redistribution conductive layer 214. In some embodiments, under-bump metallurgies (not shown) may be optionally formed before forming the connective terminals 315. In some embodiments, after formation of the connective terminals 315, the reconstructed wafer may be diced, for example by cutting along the scribe lines SC, to separate the individual passive device module units PDMU.

Figure 5G:
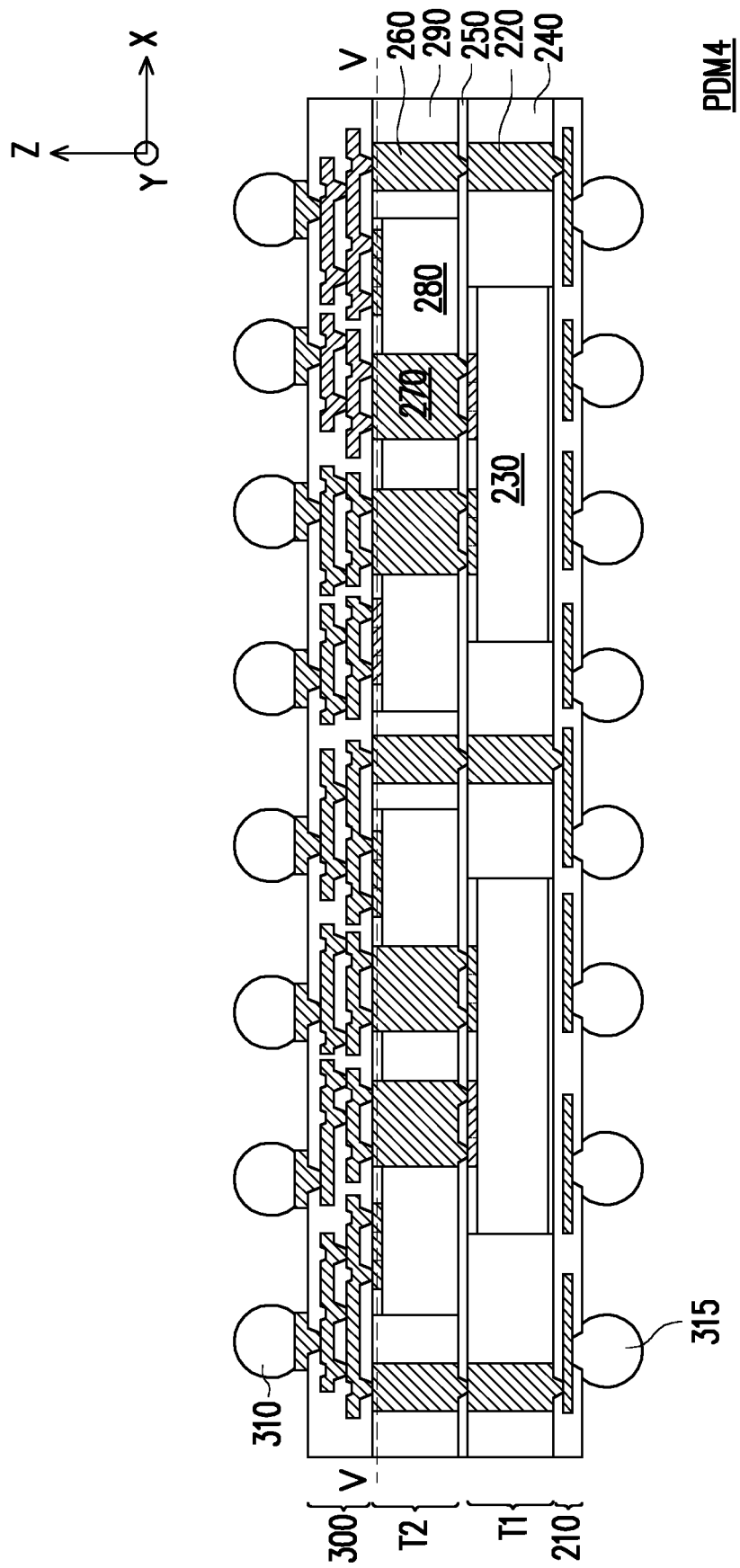
Figure 6:
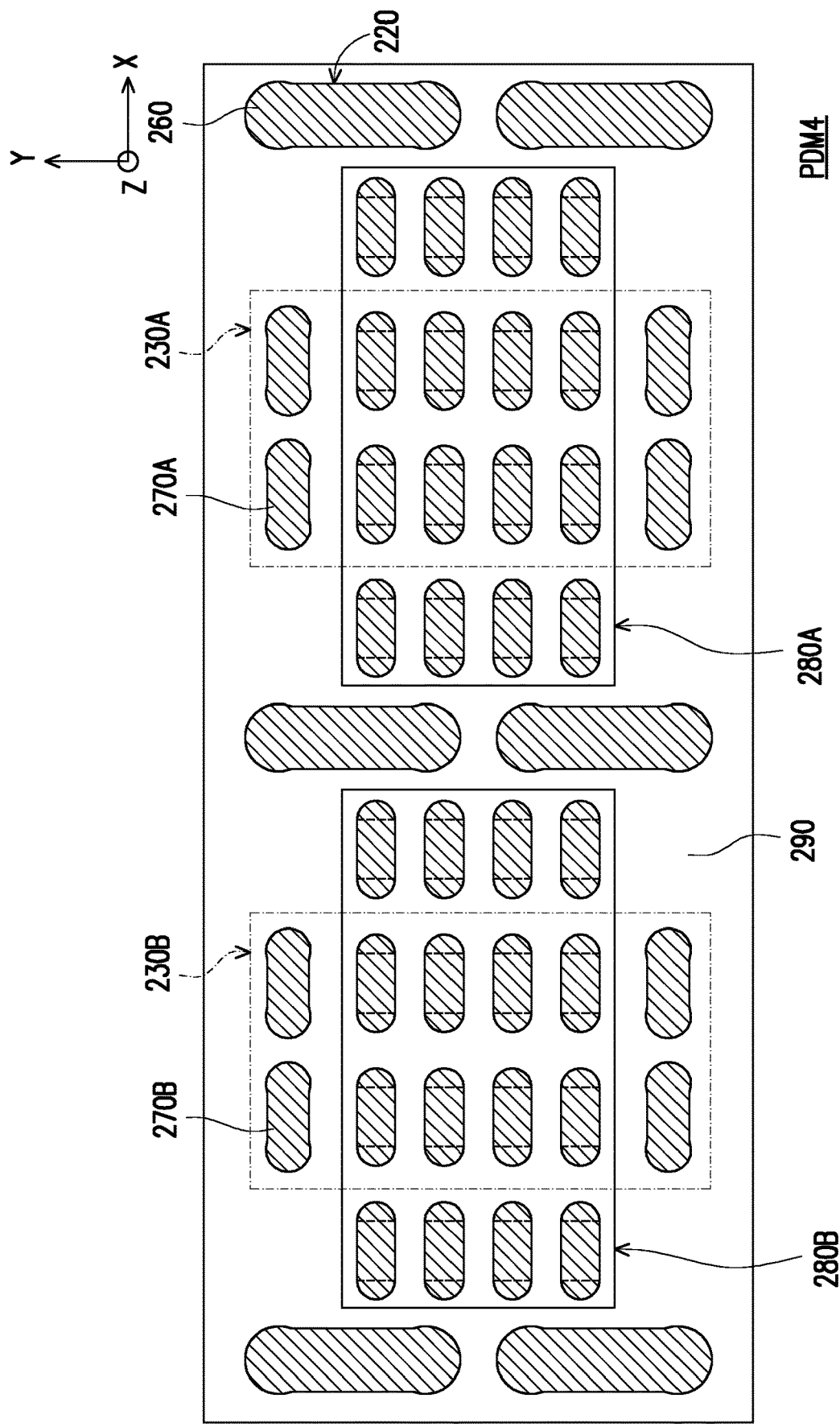
FIG. 6 is a schematic cross-sectional view of a passive device module according to some embodiments of the present disclosure.

FIG. 5G is a schematic side view of a passive device module PDM4 according to some embodiments of the disclosure. FIG. 6 is a schematic cross-sectional view of the passive device module PDM4. The cross-sectional view of FIG. 6 is in taken at a plane defined by the directions X and Y at the level height V-V (shown in FIG. 5G) in the Z direction. In FIG. 6 the footprints of the semiconductor chips 230 are shown as dash-dotted lines for discussion purpose, even though the semiconductor chips 230 do not extend within the XY plane at which the cross-sectional view of FIG. 6 is taken. Referring to FIG. 5G and FIG. 6, in some embodiments, the passive device module PDM4 includes semiconductor chips 230 of a lower tier T1 and semiconductor chips 280 of an upper tier T2 sandwiched between a redistributions structure 300 and a backside redistribution structure 210. The semiconductor chips 230 of the lower tier T1 are encapsulated by the encapsulant 240, and the TIWs 220 extend from the backside redistribution structure 210 through the encapsulant 240 towards the upper tier T2. The semiconductor chips 280 of the upper tier T2 are encapsulated by the encapsulant 290, and the TIWs 260 extend from the lower tier T1 through the encapsulant 290 towards the redistribution structure 300. The TIWs 270 also extend from the lower tier T1 through the encapsulant 290 towards the redistribution structure 300. Connective terminals 310 and 315 are disposed on the redistribution structure 300 and the backside redistribution structure 210, respectively, to allow dual-side vertical integration of the passive device module PDM4. In some embodiments, the TIWs 260 and the TIWs 270 have an elongated shape. In some embodiments, the direction of elongation for the TIWs 260 and the TIWs 270 may differ. For example, the TIWs 260 may have a longest dimension extending substantially along the Y direction, while the TIWs 270 may have a longest dimension extending substantially along the X direction. In some embodiments, the TIWs 260 may be disposed in between the semiconductor chips 280 of the upper tier T2. In some embodiments, the semiconductor chips 230 may have a greater extension in the direction of elongation of the TIWs 260 (e.g., Y direction in FIG. 6) than the semiconductor chips 280, and the TIWs 270 may be formed facing both opposite sides of the semiconductor chips 280 along the elongation direction of the TIWs 260. That is, the semiconductor chips 280 may be surrounded by the TIWs 260 and 270 on four sides. In some embodiments, in the lower tier T1, the TIWs 220 may have a footprint substantially corresponding to the footprint of the overlying TIWs 260. That is, the TIWs 220 may extend along the sides of the semiconductor chips 230 and in between the semiconductor chips 230. In some embodiments, two opposite side surfaces of the semiconductor chips 230 may face the TIWs 220 along the X direction. In some embodiments, a footprint of the TIWs 260 and 220 (providing vertical electrical connection between the redistribution structure 300 and the backside redistribution structure 210) may be larger than the footprint of the TIWs 270 (providing electrical connection between the semiconductor chips 230 and the redistribution structure 300).

Figure 7:
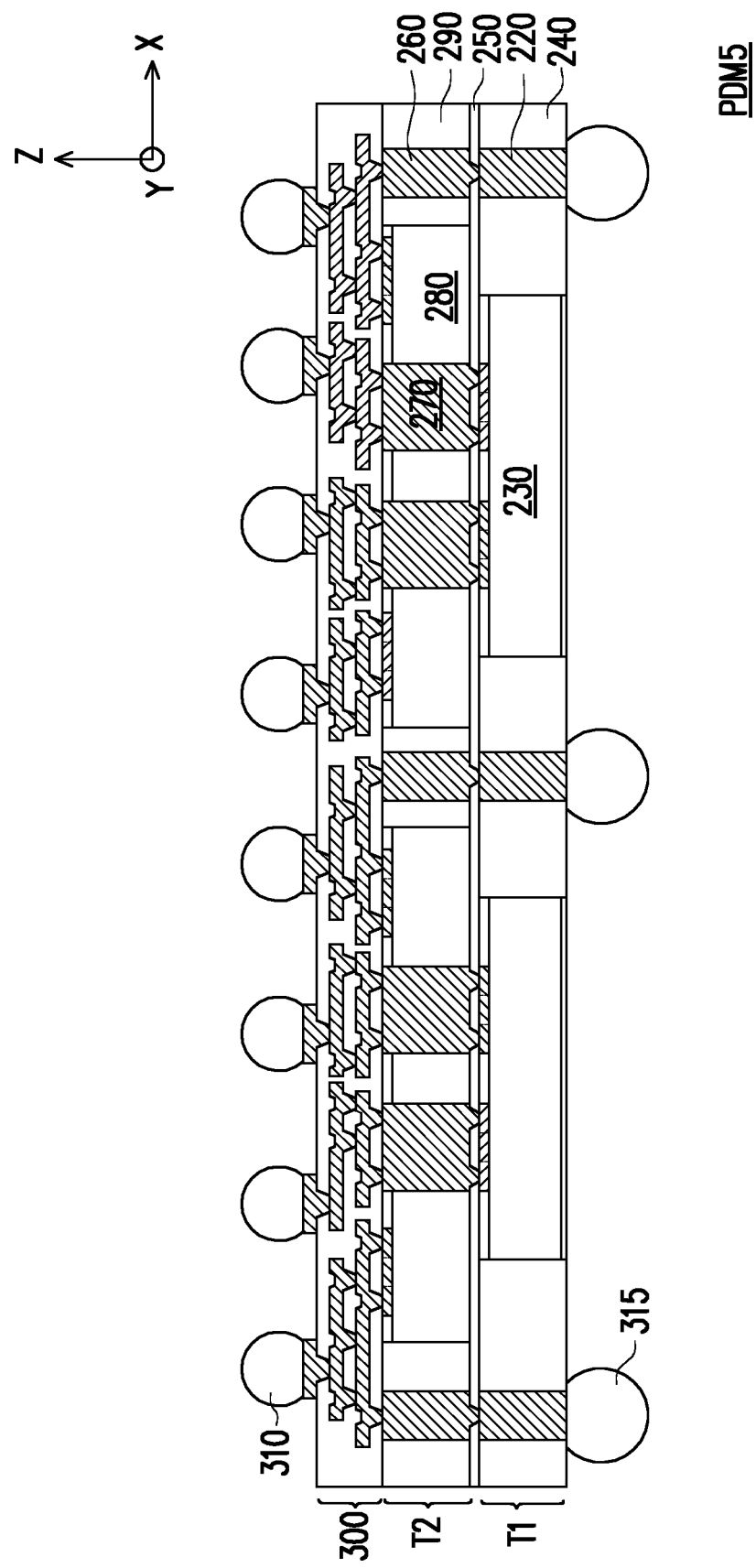
FIG. 7 is a schematic side view of a passive device module according to some embodiments of the present disclosure.

FIG. 7 is a schematic side view of a passive device module PDM5 according to some embodiments of the disclosure. In the passive device module PDM5, the connective terminals 315 may be formed directly on the TIWs 220. That is, formation of the backside redistribution structure 210 (shown in FIG. 5G) may be skipped. In some embodiments, the passive device module PDM5 may be formed following a similar process to the one described for the passive device module PDM4, skipping the formation of the backside redistributions structure 210 (shown in FIG. 5A). For example, the TIWs 220 and the semiconductor chips 230 may be provided directly on the carrier 200 (or the de-bonding layer 202, both shown in FIG. 5A). Furthermore, when the reconstructed wafer is overturned over the supporting frame SF (as shown in FIG. 5F), the connective terminals 315 may be directly formed on the TIWs 220.

Figure 8A:
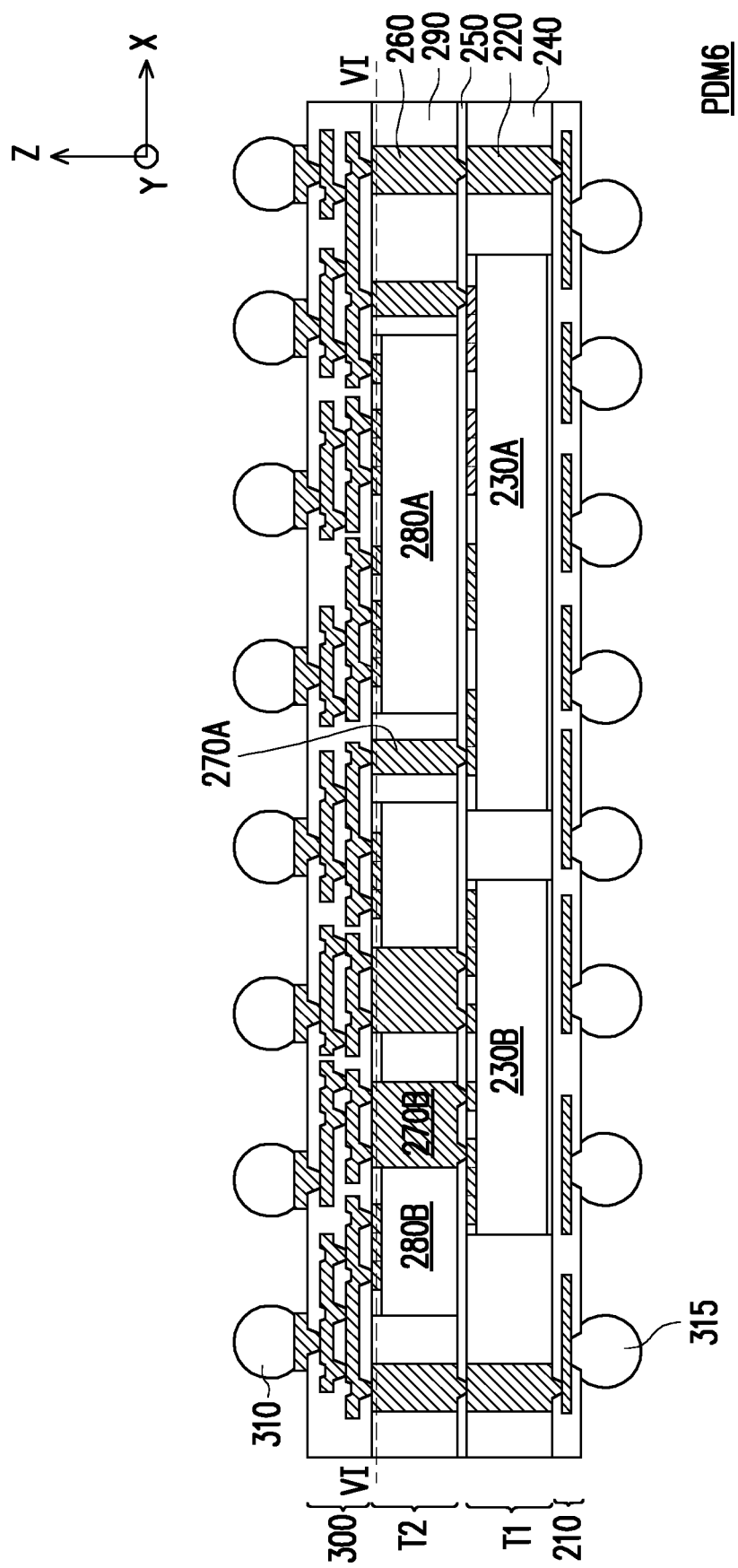
FIG. 8A is a schematic side view of a passive device module according to some embodiments of the present disclosure.
Figure 8B:
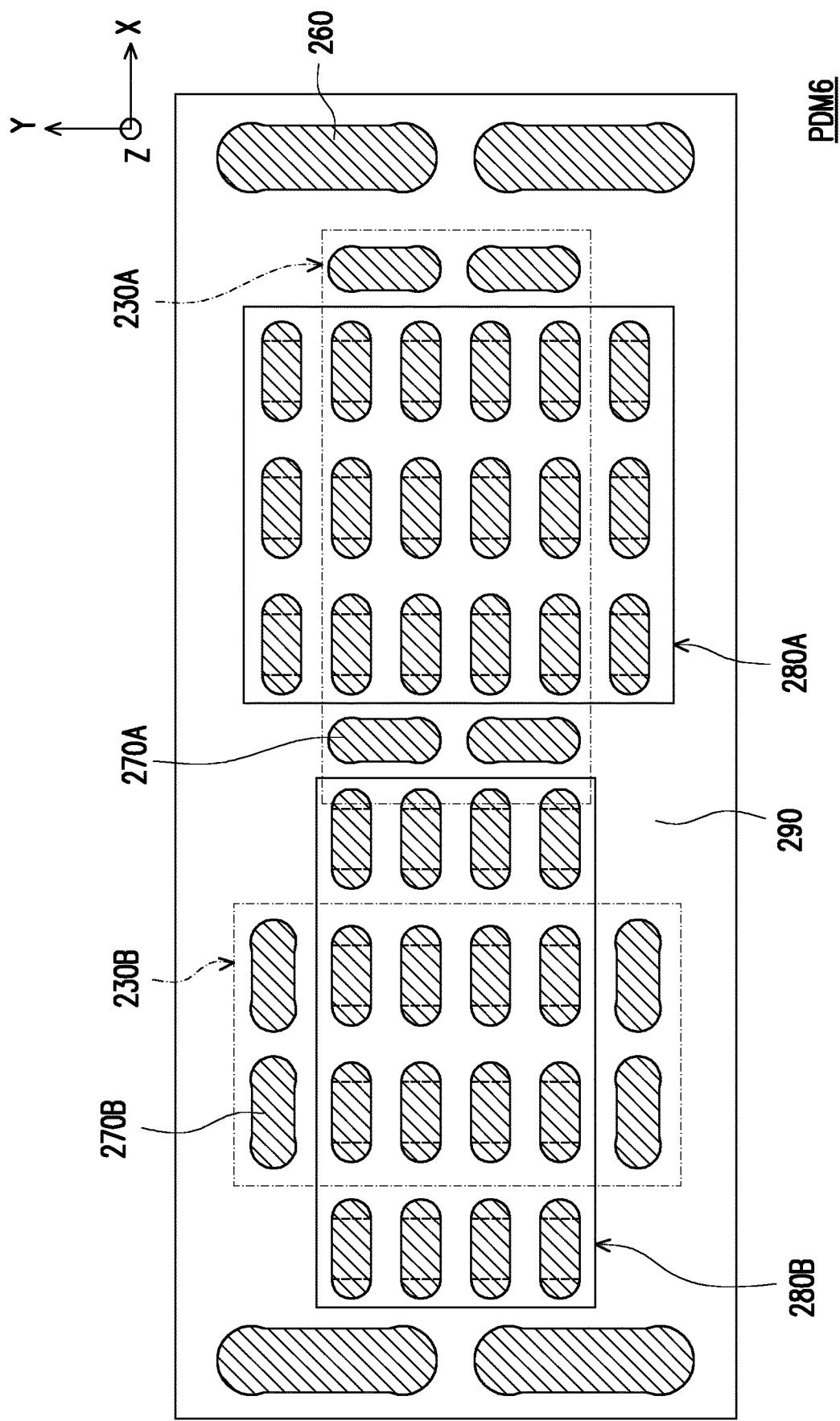
FIG. 8B is a schematic cross-sectional view of a passive device module according to some embodiments of the present disclosure.

FIG. 8A is a schematic side view of a passive device module PDM6 according to some embodiments of the disclosure. FIG. 8B is a schematic cross-sectional view of the passive device module PDM6 of FIG. 8A in the XY plane, taken at the level height VI-VI in the Z direction (shown in FIG. 8A). In some embodiments, the semiconductor chips 230, 280 and the TIWs 270 may be oriented along different directions than what is illustrated for the passive device modules PDM4 and PDM5 previously discussed. For example, in the semiconductor device PDM6 a semiconductor chip 230A of the lower tier T1 may protrude along the X direction with respect to the overlying semiconductor chip 280A of the upper tier T2, and another semiconductor chip 230B of the lower tier T1 may protrude along the Y direction with respect to the overlying semiconductor chip 280B of the upper tier T2. In some embodiments, the semiconductor chips 230, 280 may have an elongated shape (e.g., a rectangular footprint). In some embodiments, the semiconductor chip 230A may have the longest side extending along the X direction and the semiconductor chip 230B may have the longest side extending along the Y direction. In some embodiments, the semiconductor chip 280A may have the longest side extending along the Y direction and the semiconductor chip 280B may have the longest side extending along the X direction. In some embodiments, the semiconductor chip 280B may partially overlap with both the semiconductor chips 230A and 230B of the lower tier T1. In some embodiments, the TIWs 270A formed on the semiconductor chips 230A may have an elongated shape, with the longer dimension extending along the Y direction. Some of the TIWs 270A may be disposed between the semiconductor chips 280A and 280B. That is, in the passive device module PDM6, TIWs 270A may be interposed between the semiconductor chips 280A and 280B, rather than the TIWs 260 (as shown for the passive device module PDM4 in FIG. 6). In some embodiments, the TIWs 270A may be interposed between the semiconductor chip 280A and the TIWs 260, while the semiconductor chip 280B may directly face the TIWs 260.

Figure 9:
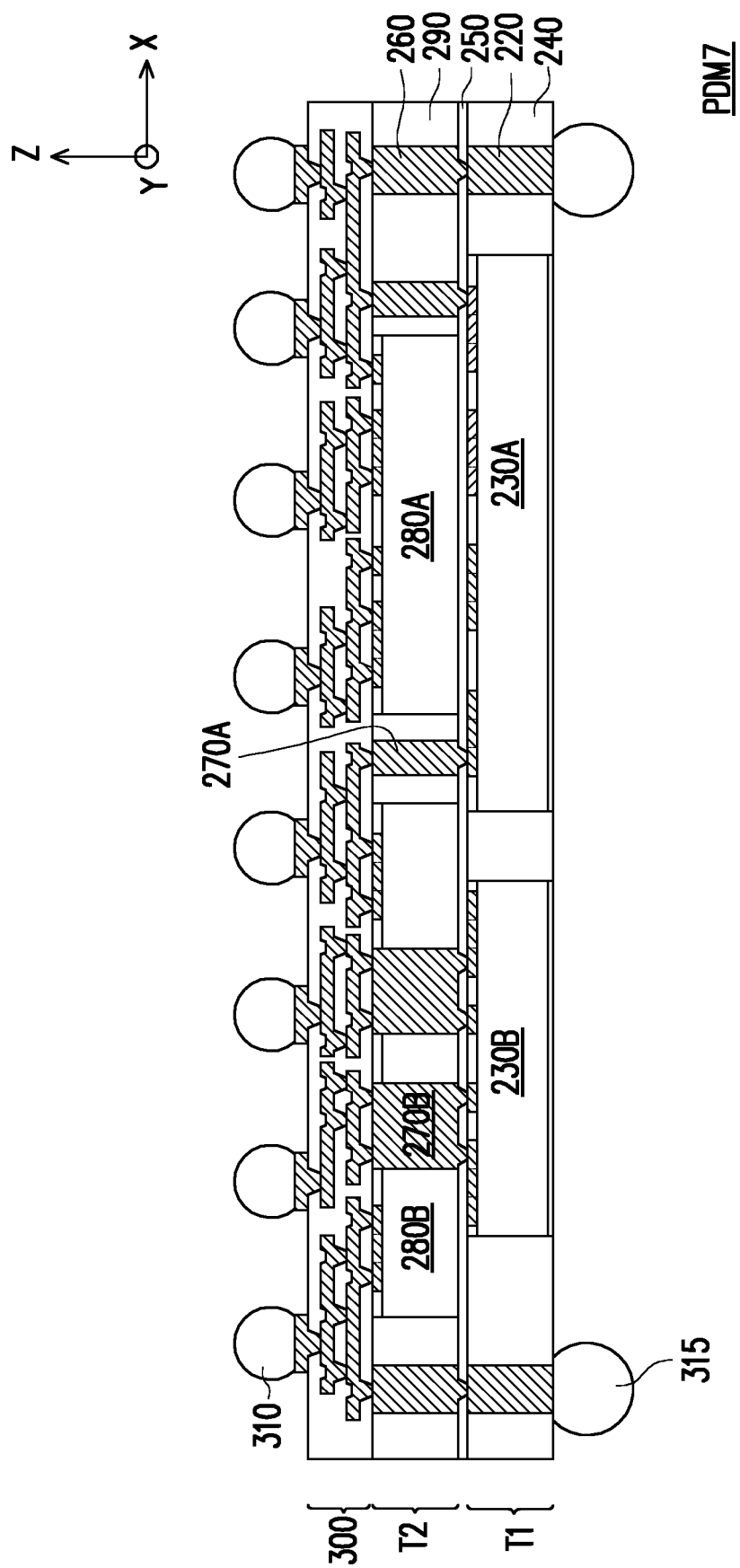
FIG. 9 is a schematic side view of a passive device module according to some embodiments of the present disclosure.

FIG. 9 is a schematic side view of a passive device module PDM7 according to some embodiments of the disclosure. In the passive device module PDM7, the connective terminals 315 may be formed directly on the TIWs 220. That is, formation of the backside redistribution structure 210 (shown in FIG. 8A) may be skipped. In the passive device module PDM7, a disposition of the semiconductor chips 230A, 230B, 280A, 280B may be similar to the disposition illustrated in FIG. 8B for the passive device module PDM7. For example, the semiconductor chips 230A and 280B may have a longer side extending along the direction X, and a shorter side extending along the direction Y, while the semiconductor chips 230B and 280A may have a longer side extending along the direction Y and a shorter side extending along the direction X. In some embodiments, the semiconductor chip 280B partially overlaps with multiple semiconductor chips 230A, 230B of the lower tier T1. In some embodiments, the redistribution structure 300 and the TIWs 260, 220 may establish electrical connection between one or more of the semiconductor chips 230A, 230B of the lower tier T1 and the connective terminals 315.

Figure 10A:
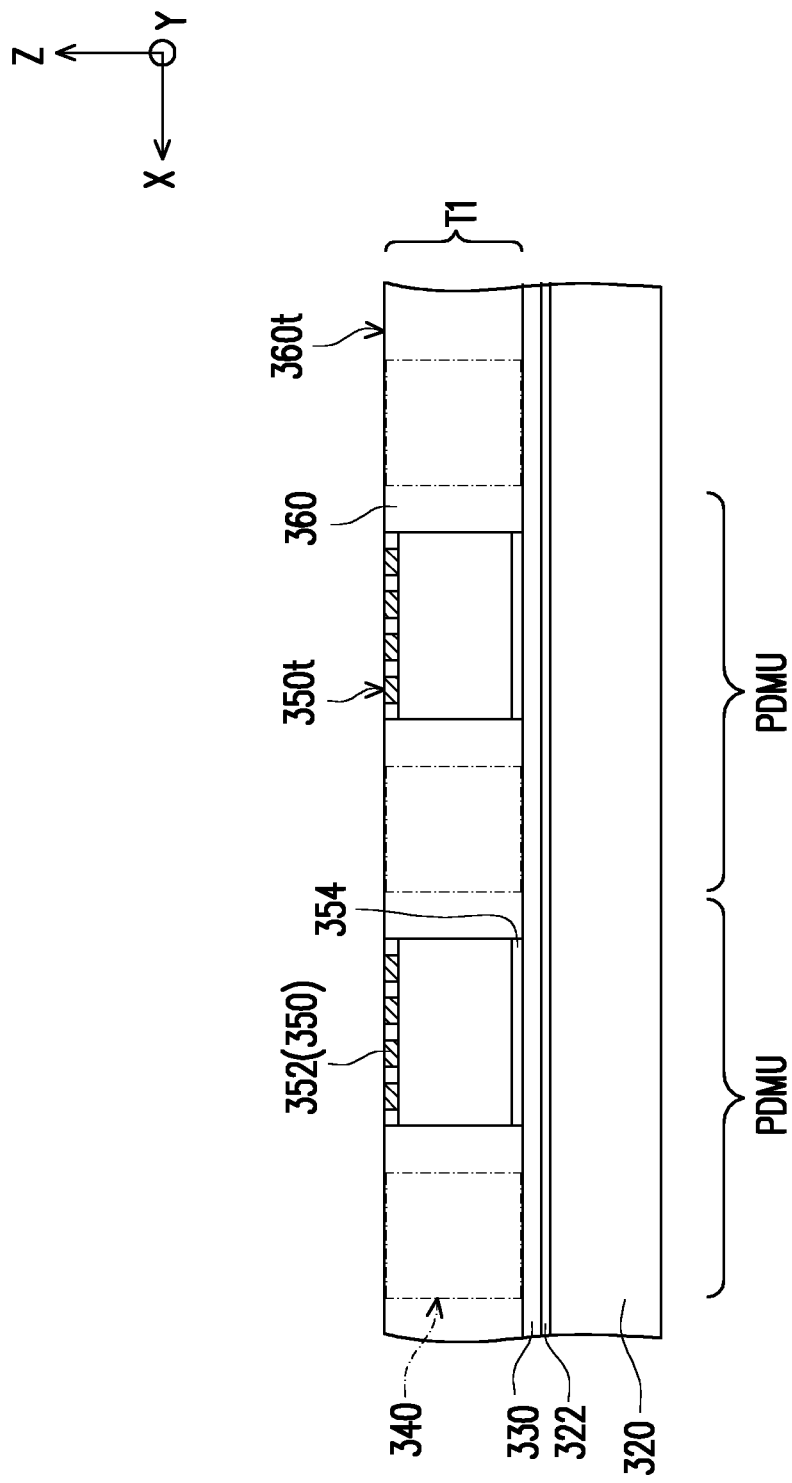
FIG. 10A to FIG. 10G are schematic cross-sectional views of structures produced at various stages of a manufacturing method of a passive device module according to some embodiments of the present disclosure.

FIG. 10A to FIG. 10G are schematic cross-sectional views of structure produced during a manufacturing method of a passive device module PDM8 according to some embodiments of the disclosure. Referring to FIG. 10A, in some embodiments a carrier 320 optionally having a de-bonding layer 322 formed thereon is provided. A dielectric layer 330 may be blanketly provided over the carrier 320. Thereafter, TIWs 340 may be formed on the dielectric layer 330. The cross-sectional view of FIG. 10A is taken in a XZ plane at a level in the Y direction in which no TIWs 340 is visible. For this reason, projections of the TIWs 340 in the XZ plane of FIG. 10A are shown as dash-dotted lines. In some embodiments, semiconductor chips 350 are disposed on the dielectric layer 330 with contact posts 352 further away from the dielectric layer 330. In some embodiments, the semiconductor chips 350 may be secured to the dielectric layer by portions of die attach film 354. An encapsulant 360 may be formed on the dielectric layer 330 to laterally cover the semiconductor chips 350 and the TIWs 340. In some embodiments, the top surface 360t of the encapsulant, the top surfaces 350t of the semiconductor chips 350 and the top surfaces of the TIWs 340 are substantially flush. In some embodiments, the encapsulated TIWs 340 and the semiconductor chips 350 may be considered a lowest tier T1 of a passive device module unit PDMU. In the cross-sectional view of FIG. 10A two passive device module units PDMU are shown for illustration purposes, but the disclosure is not limited thereto.

Figure 10B:
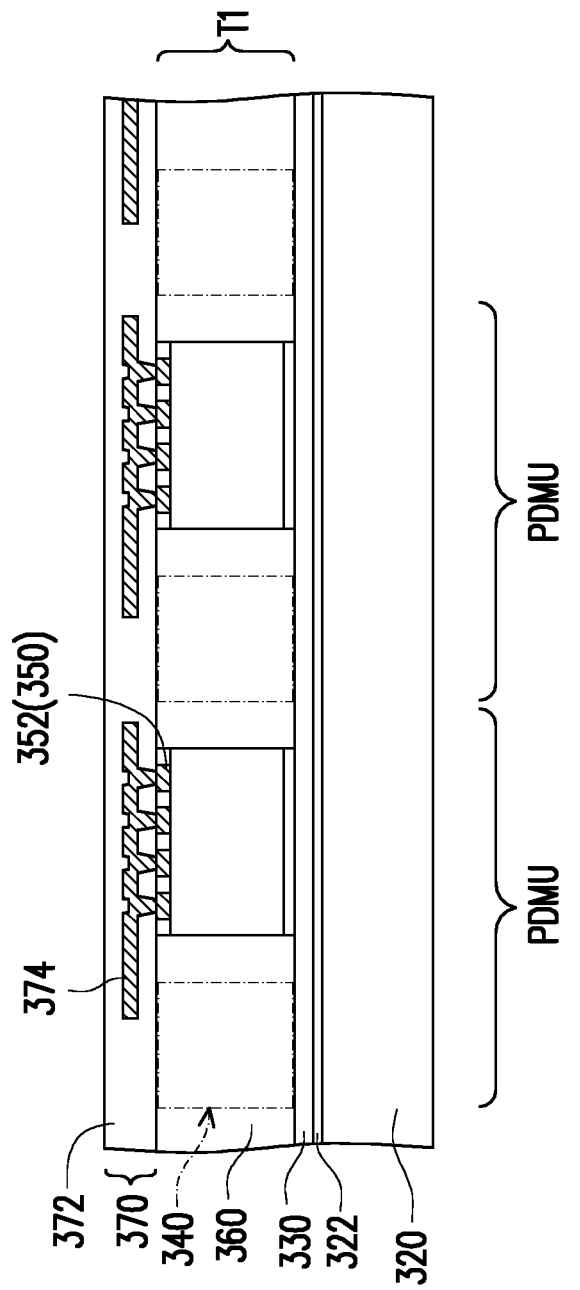
Figure 10C:
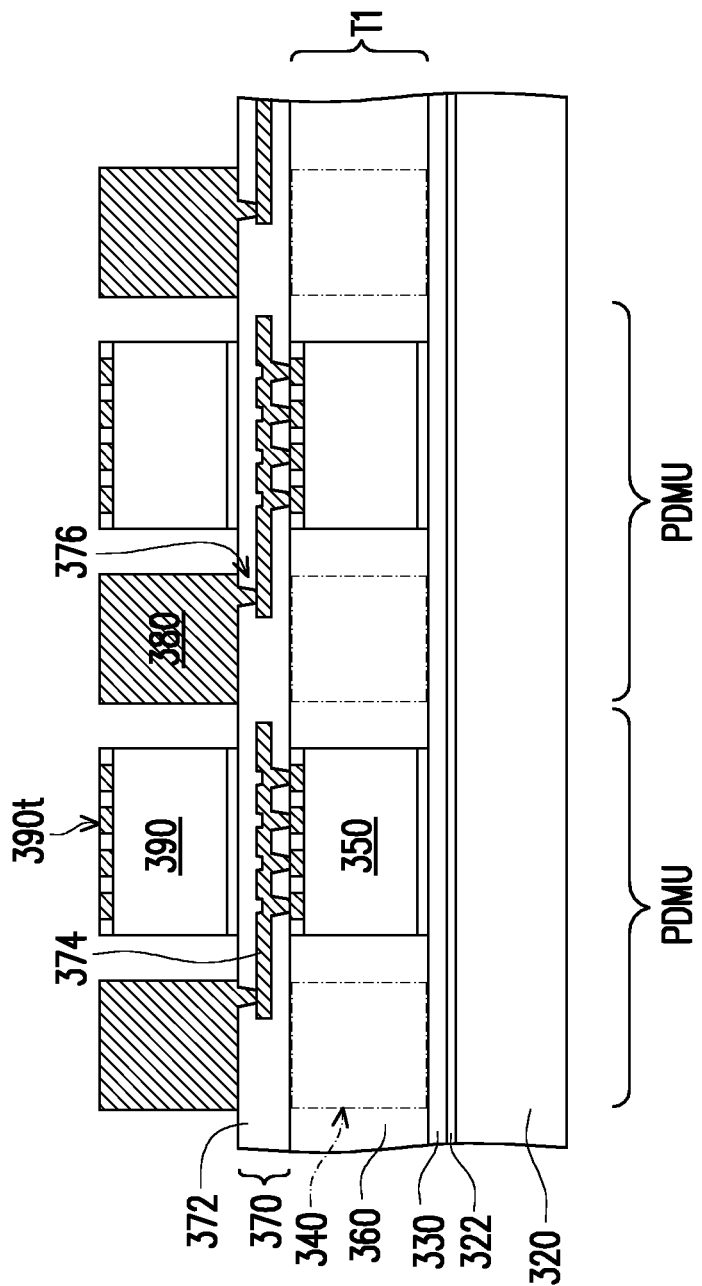

Referring to FIG. 10B, a redistribution structure 370 may be formed on the lowest tier T1 to interconnect the semiconductor chips 350 with the adjacent TIWs 340 belonging to the same passive device module unit PDMU. In some embodiments, the redistribution structure 370 includes a dielectric layer 372 and a redistribution conductive layer 374 which may be in electrical contact with the semiconductor chips 350 through the contact posts 352 and with the TIWs 340. Referring to FIG. 10C, the dielectric layer 372 may be patterned to expose portions of the redistribution conductive layer 374. TIWs 380 may then be formed over the redistribution structure 370. The TIWs 380 fill the openings of the dielectric layer 372 to establish electrical contact with the redistribution conductive layer 374. In some embodiments, the TIWs 380 may be formed so as to be vertically misaligned with the TIWs 340 of the lowest tier T1. For example, the TIWs 380 and the TIW 340 may be vertically misaligned along the Y direction. As such, the TIWs 380 may be visible in the XZ plane of view of FIG. 10C, while the TIWs 340 may be not visible in the same XZ plane of view. Semiconductor chips 390 may be disposed beside the TIWs 380 with top surfaces 390t facing away from the redistribution structure 370. The semiconductor chips 390 may be vertically stacked with the semiconductor chips 350 of the lowest tier T1.

Figure 10D:
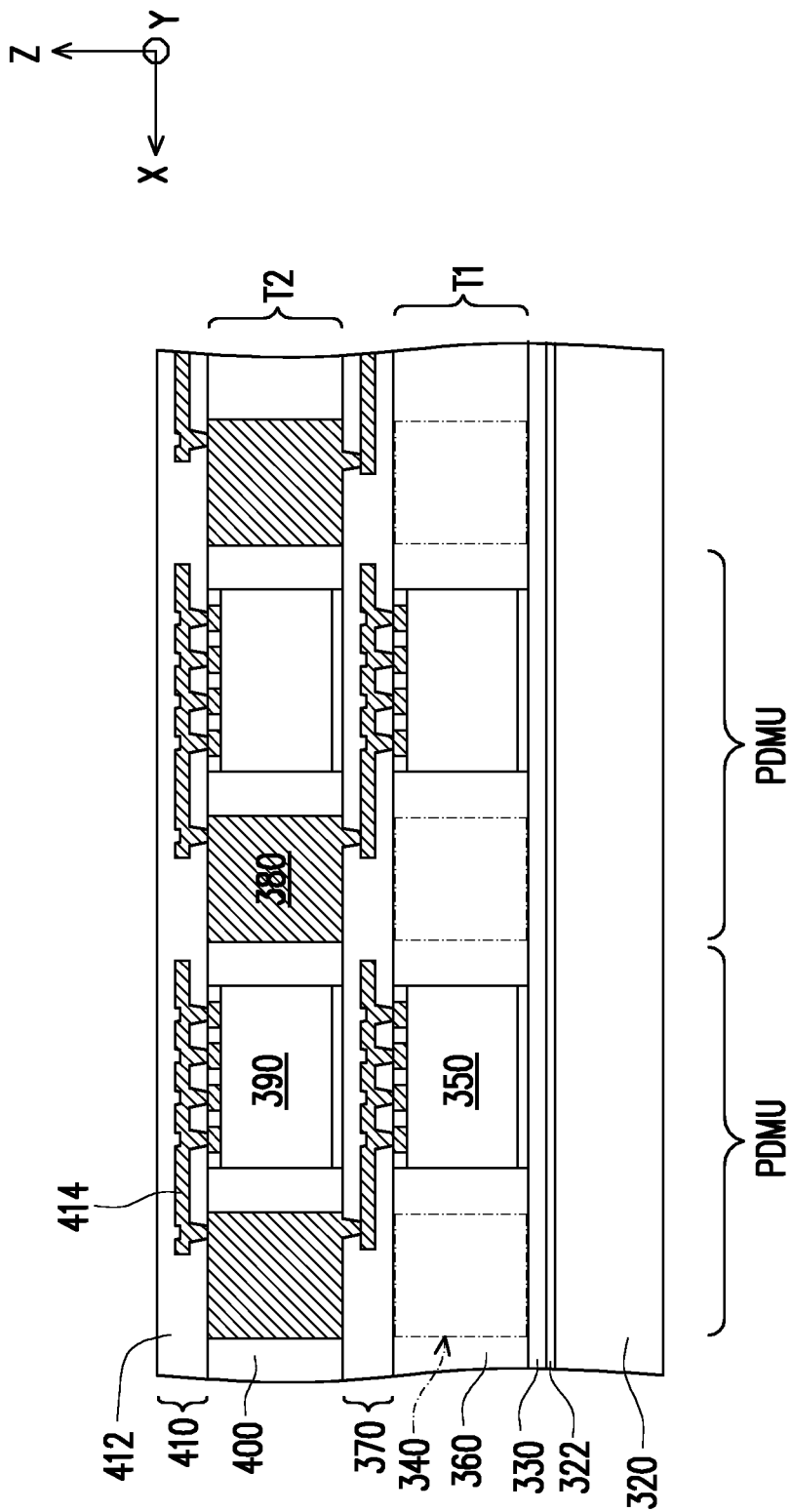

Referring to FIG. 10D, the TIWs 380 and the semiconductor chips 390 may be laterally encapsulated in an encapsulant 400, and be collectively referred to as a lower intermediate tier T2 of the passive device module unit PDMU. A redistribution structure 410 comprising a dielectric layer 412 and a redistribution conductive layer 414 may be provided over the lower intermediate tier T2 to electrically interconnect the semiconductor chips 390 to the TIWs 380 of the same passive device module unit PDMU. In some embodiments, the TIWs 380 provide vertical electrical connection between the redistribution structure 370 on the lowest tier T1 and the redistribution structure 400 on the lower intermediate tier T2. That is, the TIWs 380 may vertically extend through the encapsulant 400 to contact the redistribution conductive layer 374 and the redistribution conductive layer 414.

Figure 10E:
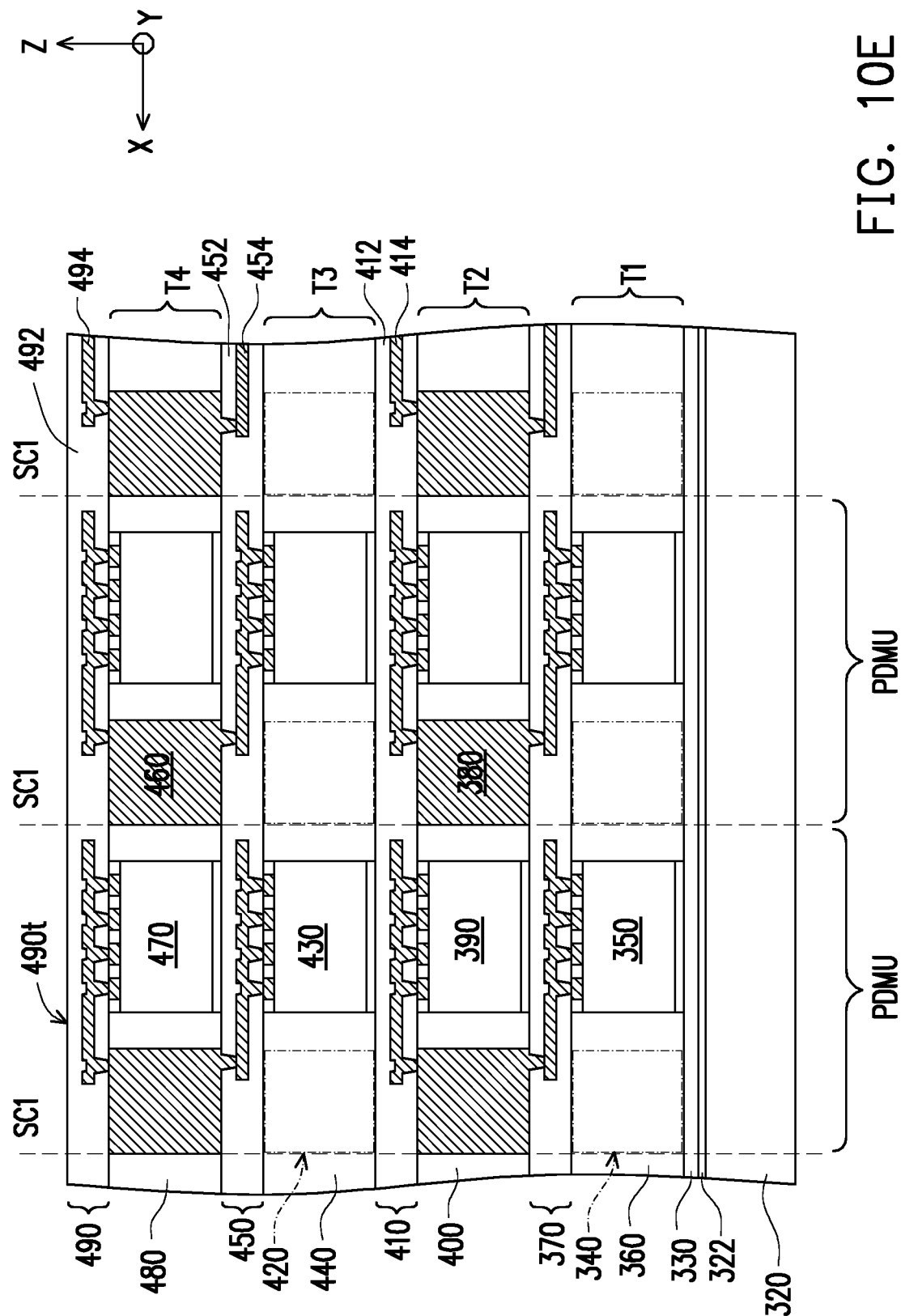

Referring to FIG. 10E, in some embodiments, an upper intermediate tier T3 and a highest tier T4 may be added over the redistribution structure 410, following similar processes as previously described for the tiers T1 and T2. Briefly, the dielectric layer 412 of the redistribution structure 410 is patterned to expose portions of the redistribution conductive layer 414. TIWs 420 are formed on the redistribution structure 410, electrically connected to the redistribution conductive layer 414. The TIWs 420 may be vertically misaligned (in a Y direction) with respect to the TIWs 380 of the lower intermediate tier T2, while may vertically overlap with the TIWs 340 of the lowest tier T1. That is, in a passive module unit, TIWs formed in every other tier (e.g., TIWS 420 of tier T3 and TIWs 340 of tier T1) may be vertically aligned with each other. Semiconductor chips 430 are provide besides the TIWs 420, vertically stacked with the semiconductor chips 390 and 350 of the lower tiers T2 and T1, respectively. The semiconductor chips 430 may be disposed in a face-up configuration with respect to the underlying redistribution structure 410 (e.g., with a contact surface further away from the redistribution structure 410). An encapsulant 440 is formed to laterally wrap the semiconductor chips 430 and the TIWs 420. A redistribution structure 450 including a dielectric layer 452 and a redistribution conductive layer 454 is formed on the upper intermediate tier T3. The highest tier T4, comprising TIWs 460, semiconductor chip 470 and the encapsulant 480, followed by the redistribution structure 490 are formed over the upper intermediate tier T3. In some embodiments, the upper surface 490t (the surface further away from the semiconductor chip 470 in the Z direction) of the redistribution structure 490 may be left without patterning. That is, the redistribution conductive layer 494 of the redistribution structure 490 may be connected on one side with the semiconductor chips 470 and the TIWs 460, while being covered by the dielectric layer 492 on the opposite side.

In some embodiments, a singulation process may be performed by cutting the reconstructed wafer including the multiple passive device module units PDMU along the scribe lines SC1. In some embodiments, the outer edges of the TIWs 340, 380, 420 and 460 of the tiers T1-T4 of a same passive device module unit PDMU further away in the X direction from the semiconductor chips 350, 390, 430, 470 belonging to the same passive device module unit PDMU all lie substantially within the same YZ plane. That is, while the TIWs 340, 380, 420 and 460 may be vertically misaligned (when viewed in a YZ plane) because they are distributed along the Y direction, the outer edges of the TIWs 340, 380, 420 and 460 may be located at a same level along the X direction. In some embodiments, the scribe lines SC1 may run along the aligned outer edges of the TIWs 340, 380, 420 and 460. That is, the passive device module units PDMU may be singulated by cutting at the interfaces between the TIWs 340, 380, 420 and 460 and the corresponding encapsulants 360, 400, 440, 480. In some embodiments, the semiconductor chips 350, 390, 430, 470 may be vertically overlapping at one side of a passive device module unit PDMU, while the TIWs 340, 380, 420 and 460 may be alternately vertically aligned at an opposite side of the passive device module unit PDMU. For example, in a given tier (e.g., the lower tier T1) the TIWs (e.g., the TIWs 340) may be disposed on a left-hand side, and the semiconductor chips (e.g., the semiconductor chips 350) may be disposed on a right-hand side. A similar distribution may be repeated in all the tiers (e.g., T2-T4) of a passive device module unit. As such, even though before singulation a semiconductor chip (e.g., the semiconductor chip 390) in a given tier (e.g., the tier T2) may have a TIW (e.g., the TIWs 380) on both sides along the X direction, the redistribution structures 370, 410, 450 or 490 may interconnect the semiconductor chip with the TIWs disposed only at one side of the semiconductor chip. In some embodiments, following the singulation steps, a passive device module unit PDMU may be substantially parallelepipedal, and expose the dielectric layer 330, the encapsulants 360, 400, 440 and 480 of the several tiers T1-T4 and the dielectric layers 372, 412, 452, 492 of the redistribution structures 370, 410, 450, 490 on three sides, the dielectric layer 330 on a fourth side, the dielectric layer 492 on a fifth side, and the encapsulants 360, 400, 440 and 480, the dielectric layers 330, 372, 412, 452, 492 and the TIWs 340, 380, 420, 460 on a sixth side.

Figure 10F:
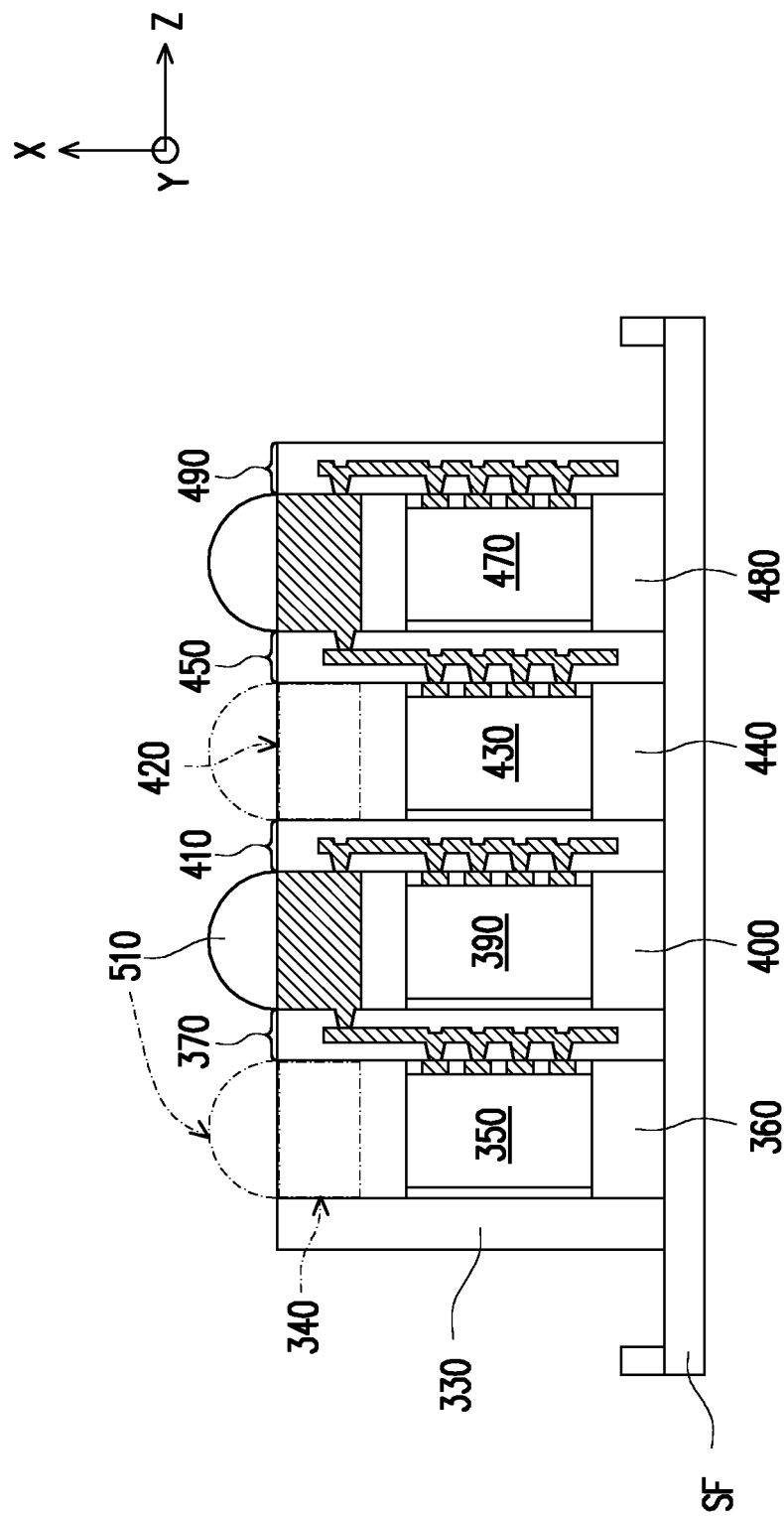
Figure 10G:
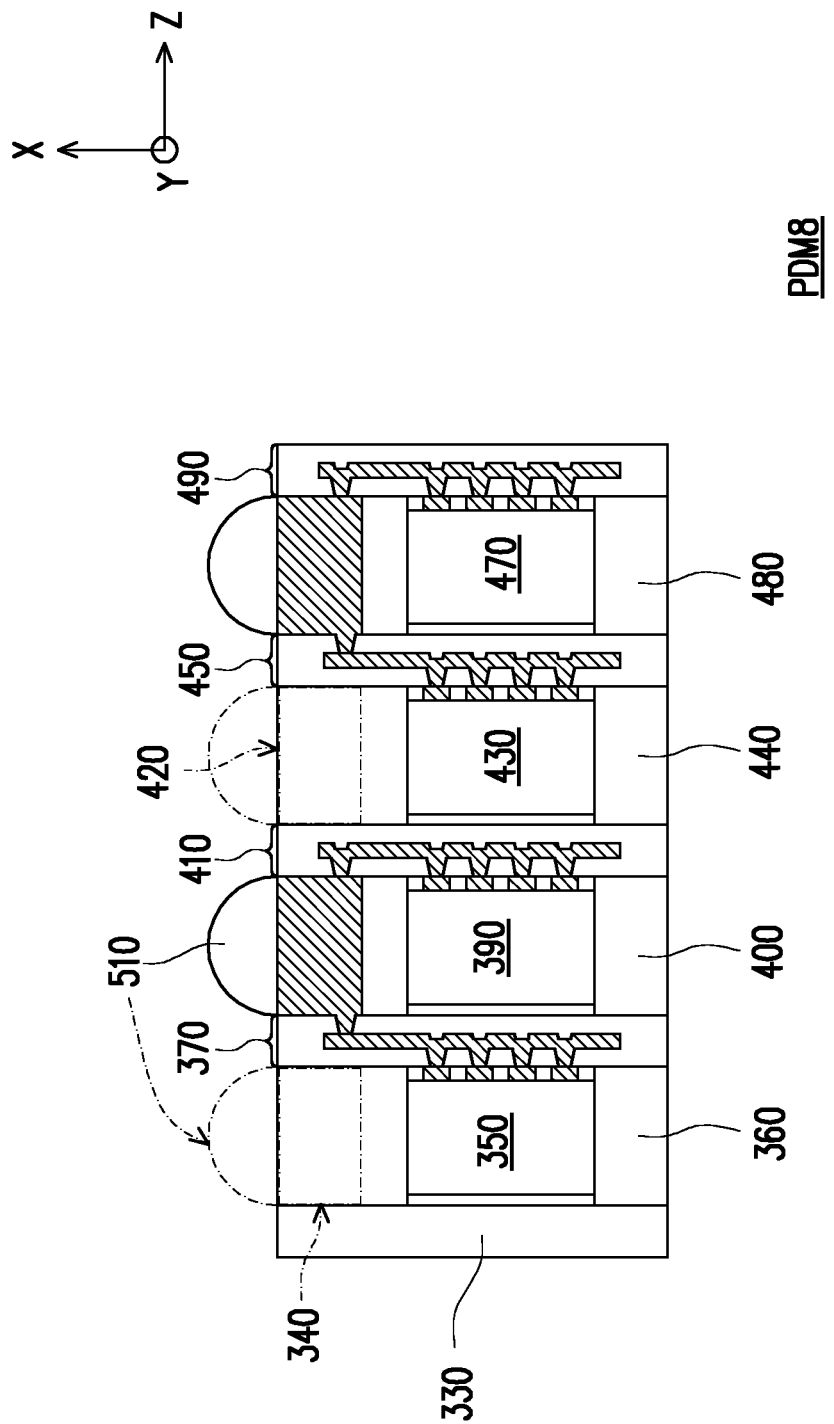

Referring to FIG. 10E and FIG. 10F, in some embodiments, the carrier 320 may be removed, and the singulated passive device module units PDMU may be rotated and disposed over a supporting frame SF. In some embodiments, a 90 degrees (or an equivalent) rotation is performed, to dispose the passive module units PDMU on the supporting frame SF with the sixth side (the side exposing the TIWs 340, 380, 420, 460) exposed and available for further processing (e.g., with a side opposite to the sixth side facing the supporting frame SF). In some embodiments, connective terminals 510 are installed on the exposed outer edges of the TIWs 340, 380, 420, and 460. That is, the TIWs 380, 420, 460 of the tiers T2-T4 may be sandwiched between pairs of adjacent redistribution structures 370, 410, 450, 490, with one end connected to one redistribution structure of the pair and the other end connected to the other redistribution structure of the pair, and further have the connection terminals 510 disposed on the exposed outer edge. That is, the TIWs 380 may be directly electrically connected to three different elements (e.g., two redistribution structures and a connective terminal 510). In some embodiments, the connective terminals 510 are installed at a 90-degree angle with respect to the contact surfaces of the semiconductor chips 350, 390, 430, and 470. The connective terminals 510 may be used for integration with larger devices (not shown). Referring to FIGS. 10F and 10G, in some embodiments, after removal of the supporting frame SF a passive device module PDM 8 is obtained.

Figure 11A:
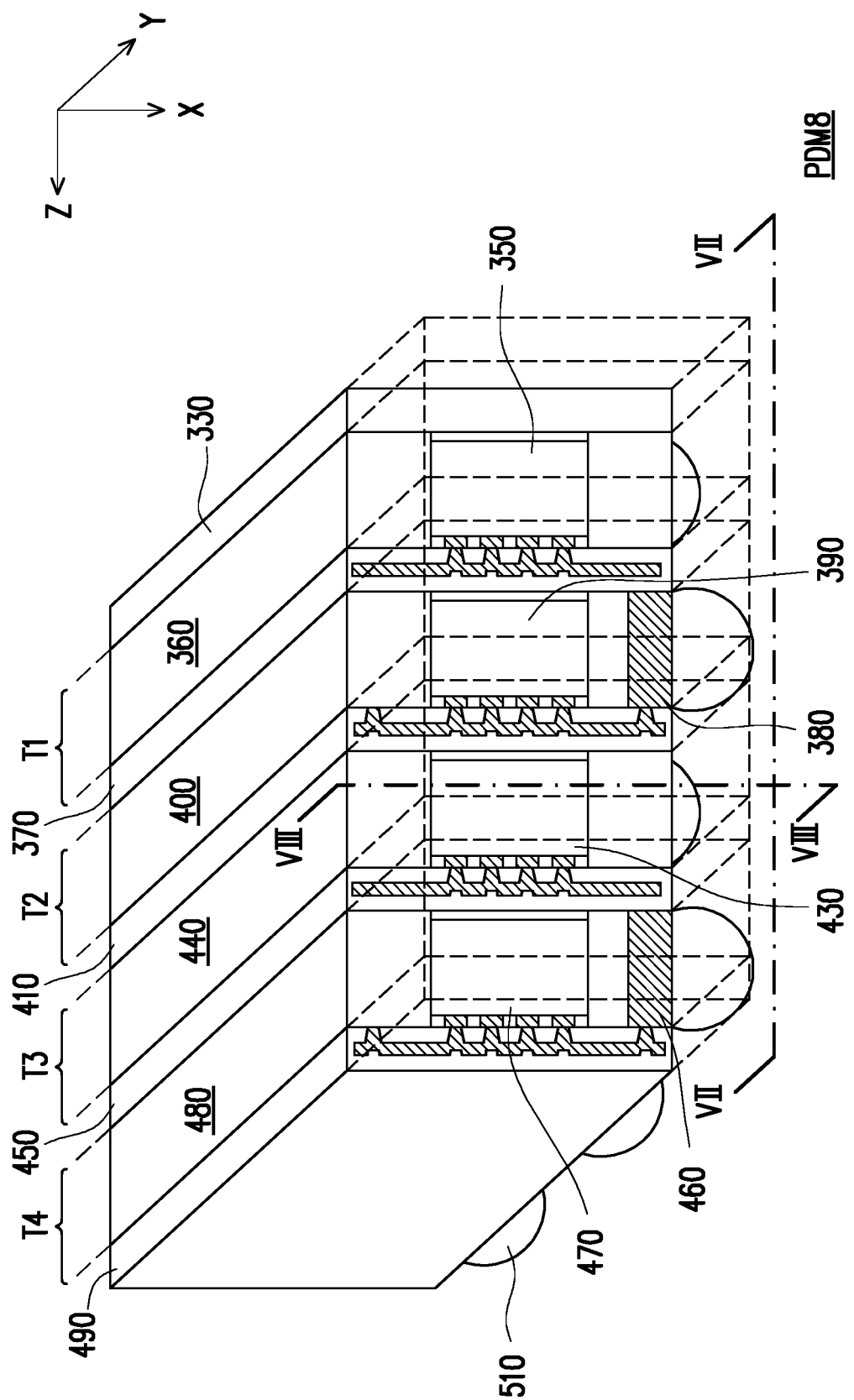
FIG. 11A is a schematic three-dimensional view of a passive device module according to some embodiments of the present disclosure.
Figure 11B:
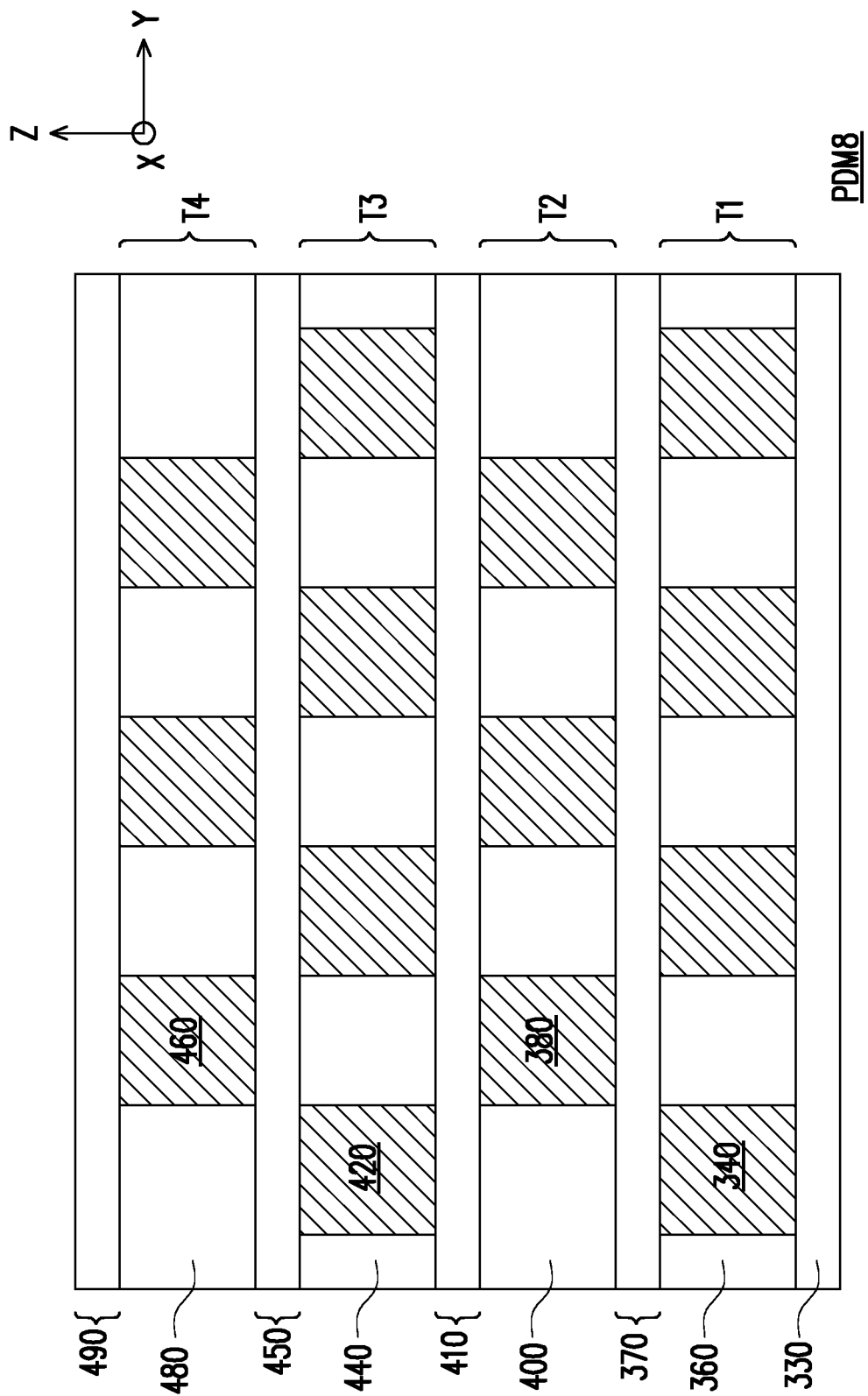
FIG. 11B and FIG. 11C are schematic cross-sectional views of a passive device module according to some embodiments of the present disclosure.
Figure 11C:
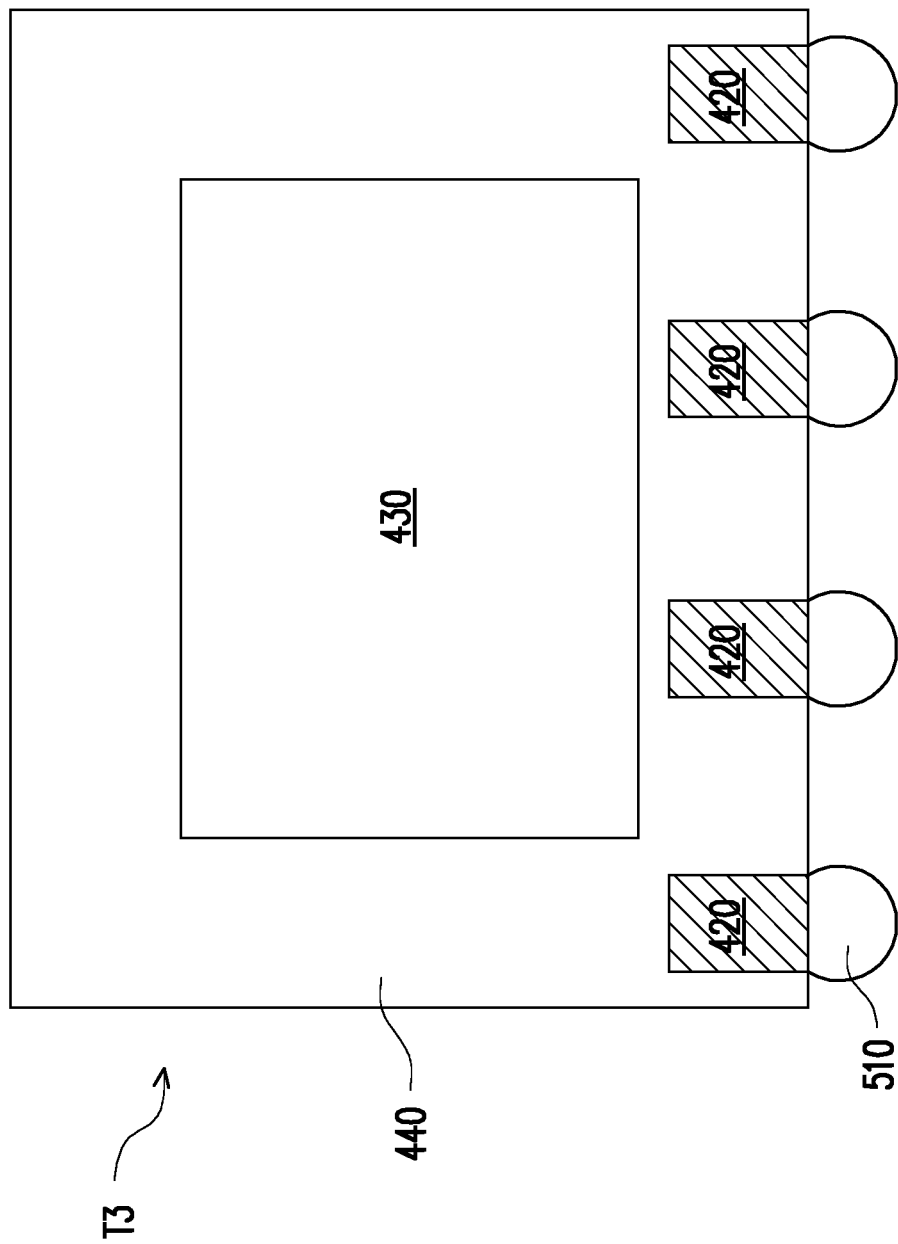

FIG. 10G is a schematic cross-sectional view in the XZ plane of the passive device module PDM8 according to some embodiments of the disclosure. FIG. 11A is a perspective three-dimensional view of the passive device module PDM8 according to some embodiments of the disclosure. FIG. 11B is a schematic cross-sectional view in a ZY plane of the passive device module PDM8 according to some embodiments of the disclosure. The cross-sectional view of FIG. 11B may be taken at the level height VII-VII along the X direction illustrated in FIG. 11A. FIG. 11C is a schematic cross-sectional view in a XY plane of the passive device module PDM8 according to some embodiments of the disclosure. The cross-sectional view of FIG. 11C may be taken at the level height VIII-VIII along the Z direction illustrated in FIG. 11A. Referring to FIG. 10G and FIG. 11A to FIG. 11C, the passive device module PDM8 may include multiple stacked tiers T1-T4, each tier T1-T4 comprising encapsulated semiconductor chips 350, 390, 430, 470 and TIWs 340, 380, 420, 460. The TIWs 340, 380, 420, and 460 may be exposed at one side of the passive device module PDM8, and have connective terminals 510 disposed thereon. In some embodiments, the TIWs 340, 380, 420, 460 and the encapsulants 360, 400, 440, 480 may be exposed on the side of the passive device module PDM8 so as to define a checkerboard pattern. That is, moving along the Y direction within a given tier (e.g., tier T2), exposed portions of encapsulant 400 and TIWs 380 may alternate. Similarly, moving along the Z direction through the different tiers T1-T4, portions of the encapsulant and portions of the TIWs may be alternately exposed. For example, proceeding along the Z direction at a given Y level, the TIWs 340 and 420 of the tiers T1 and T3 are encountered, together with the portions of encapsulants 400 and 480 of the tiers T2 and T4. At a different Y level, the TIWs 380 and 460 of the tiers T2 and T4 are encountered together with the encapsulants 360 and 440. Between adjacent tiers are disposed the dielectric layers of the intervening redistribution structures 370, 410, 450. As illustrated in FIG. 11A and FIG. 11C, at a given Z level the encapsulant (e.g., encapsulant 440) of a tier (e.g., the tier T3) may be exposed on all sides, while the TIWs (e.g., the TIWs 420) may be exposed on only one side.

Figure 12A:
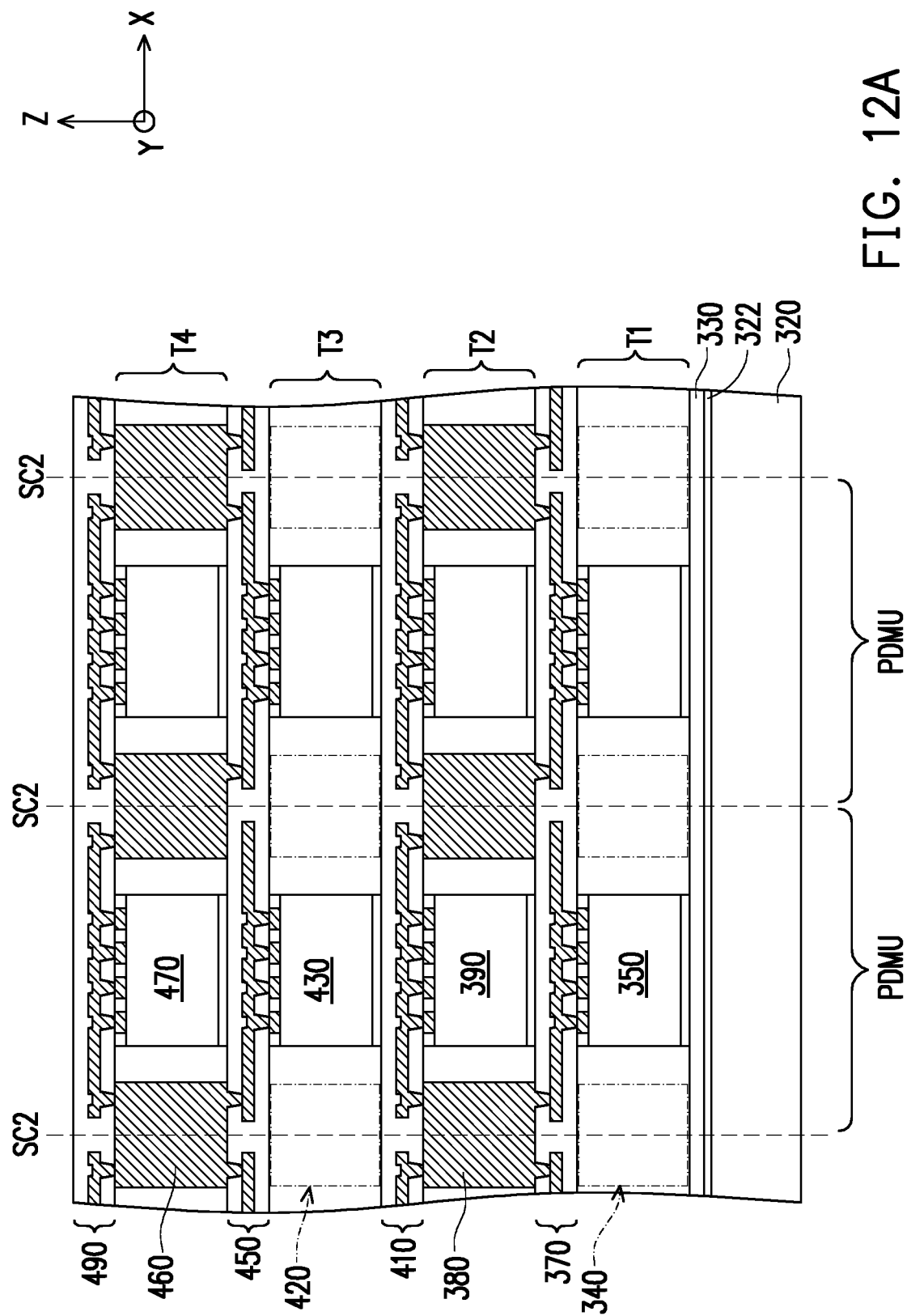
FIG. 12A is a schematic cross-sectional view of a structure produced during a manufacturing method of a passive device module according to some embodiments of the disclosure.
Figure 12B:
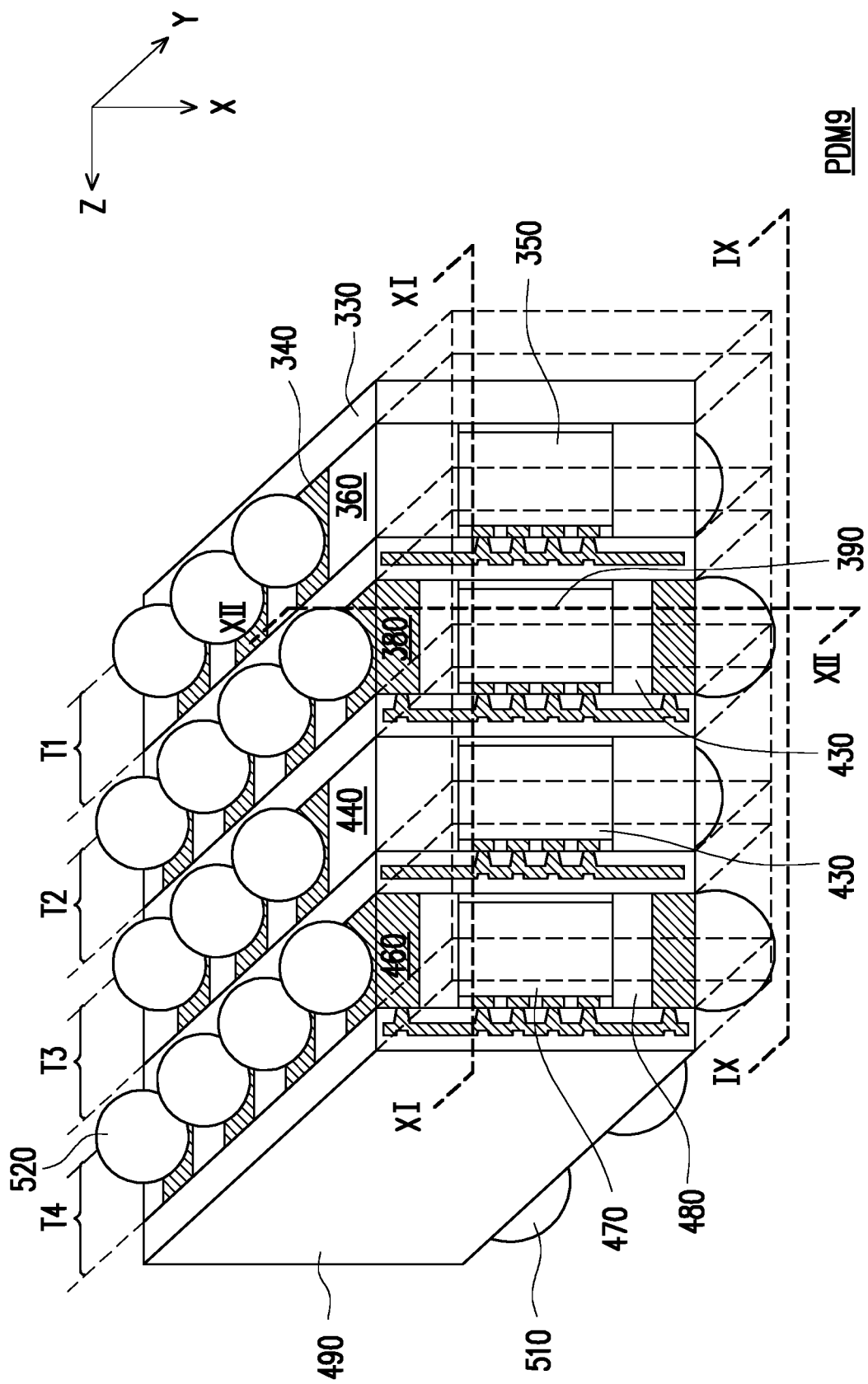
FIG. 12B is a schematic three-dimensional view of a passive device module according to some embodiments of the present disclosure.

FIG. 12A is a schematic cross-sectional view of a structure produced during a manufacturing method of a passive device module PDM9 (shown in FIG. 12B) according to some embodiments of the disclosure. FIG. 12B is a perspective view of the passive device module PDM9 according to some embodiments of the disclosure. FIG. 12C is a schematic cross-sectional view of the passive device module PDM9 in the XY plane taken at the level height XII-XII shown in FIG. 12B. In some embodiments, the structure of FIG. 12A may be formed following a similar process as described with respect to FIG. 10A to FIG. 10E. A difference between the structure of FIG. 12A and the structure of FIG. 10E is that the semiconductor chips 350, 390, 430, and 470 are electrically connected to the TIWs 340, 380, 420, 460 disposed on each side along the X direction. That is, taking the lower intermediate tier T2 as an example, the semiconductor chip 390 is electrically connected to both of the TIWs 380 illustrated on its right-hand side and on its left-hand side in FIG. 12A. In some embodiments, before the reconstructed wafer is singulated, semiconductor chips belonging to adjacent passive device module units PDMU may be connected to the same TIWs (share a TIW). In some embodiments, the passive device module units PDMU are singulated by cutting along scribe lines SC2 running through the TIWs 340, 380, 420, 460 of the several tiers T1-T4. As such, the TIWs 340, 380, 420 and 460 are exposed at two opposite sides of the passive device module PDM9. As illustrated in FIG. 12B, connective terminals 510 may be installed on the TIWs 340, 380, 420, 460 exposed at one side, and connective terminals 520 may be installed on the TIWs 340, 380, 420, 460 on the opposite side. In some embodiments, cross-sectional views of the passive device module PDM9 taken in the YZ planes at the level height IX-IX or XI-XI of FIG. 12B are similar to the cross-sectional view of the passive device module PDM8 illustrated in FIG. 11B. As illustrated in FIG. 12C, in some embodiments the TIWs (e.g., the TIWs 380) disposed at opposite sides of a semiconductor chip (e.g., the semiconductor chip 390) of a given tier (e.g., the tier T2) may be aligned along the X direction (may be disposed at a same level along the Y direction). However, the disclosure is not limited thereto.

Figure 13A:
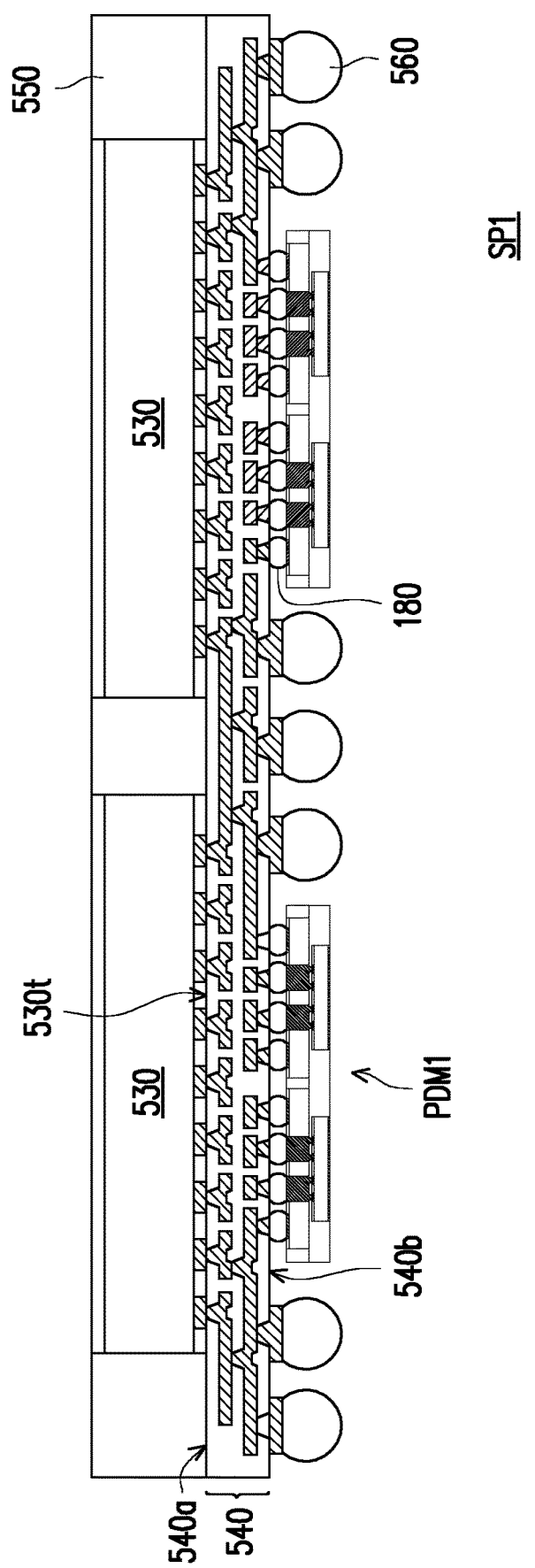
FIG. 13A to FIG. 13C are schematic side views of semiconductor packages according to some embodiments of the present disclosure.
Figure 13B:
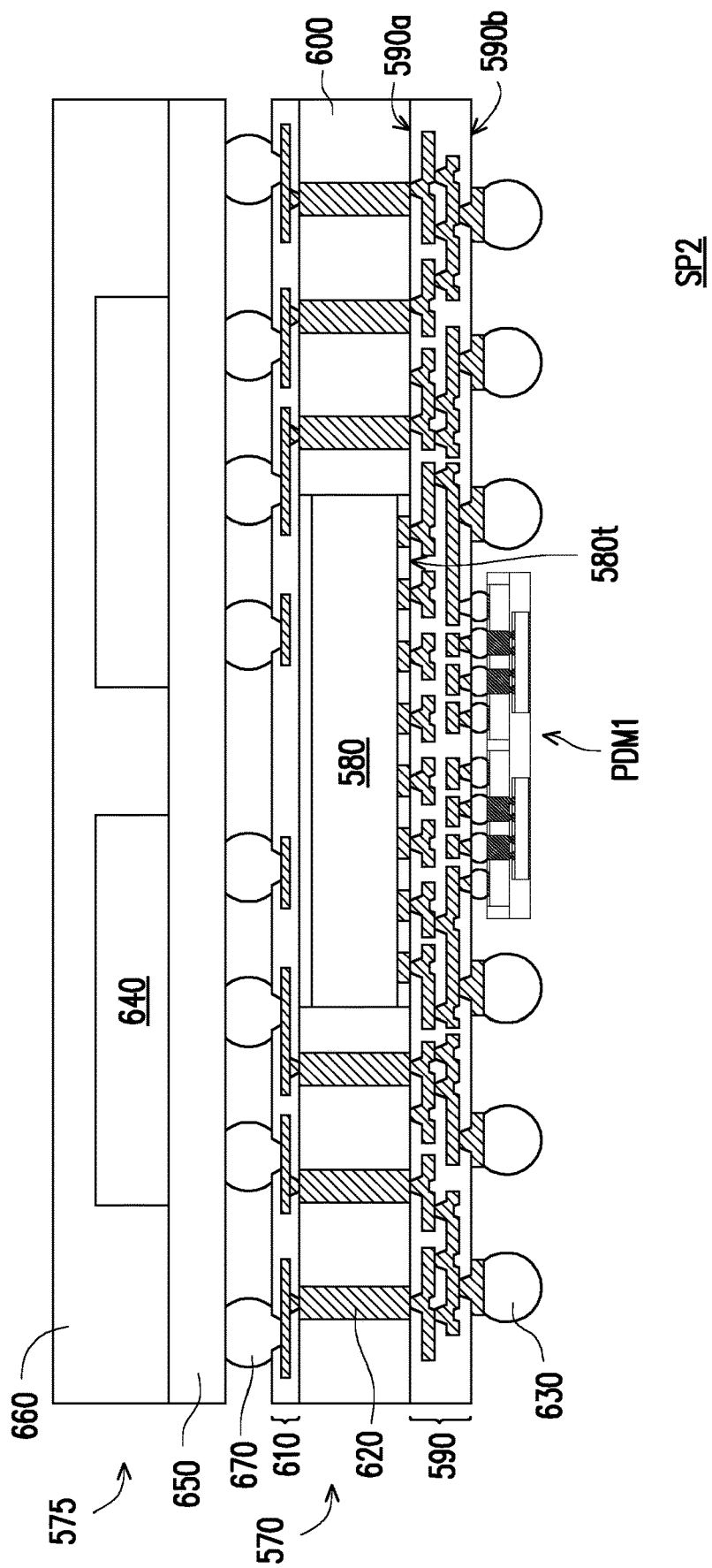
Figure 13C:
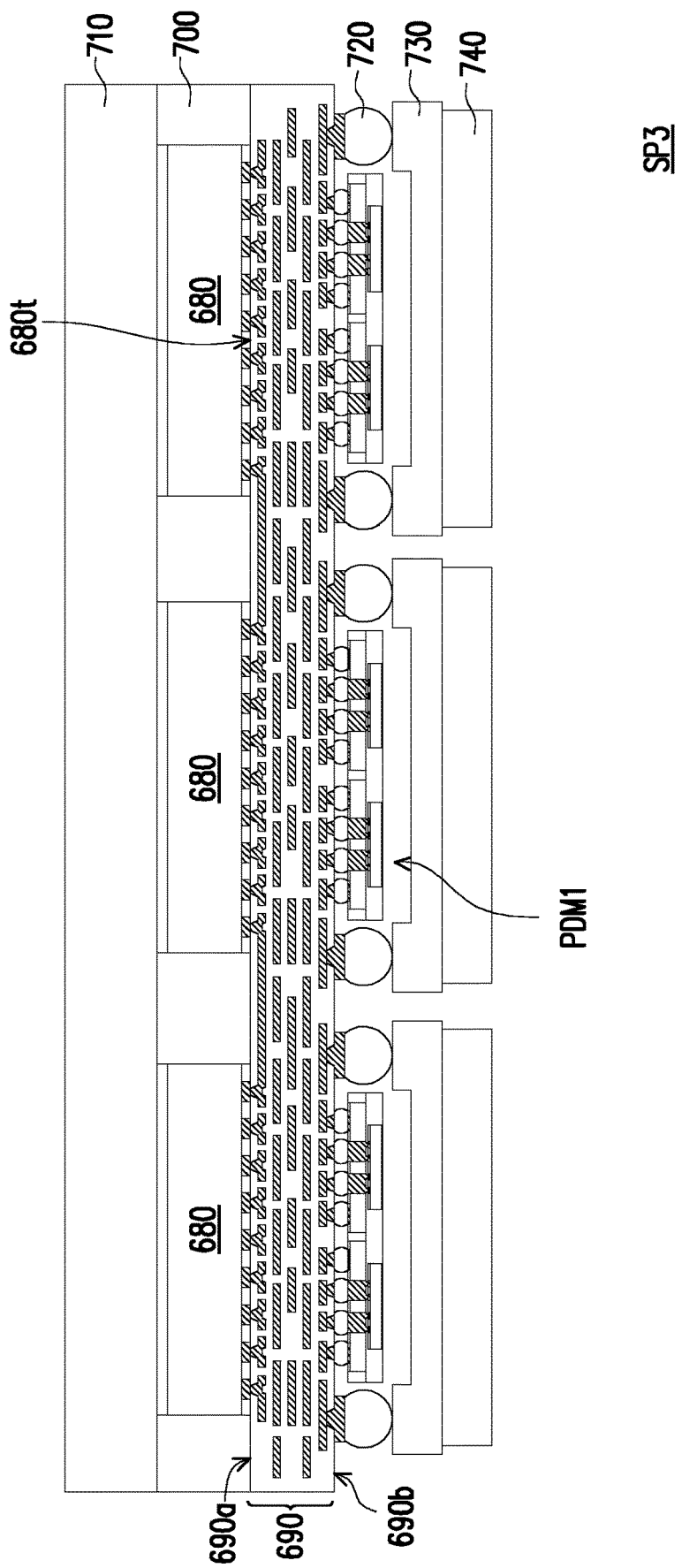

In some embodiments, the passive device modules disclosed herein may be integrated in any types of semiconductor package. FIG. 13A to FIG. 13C show schematic side views of exemplary semiconductor packages SP1-SP3 according to some embodiments of the disclosure. However, the disclosure is not limited by the type of semiconductor packages in which the passive device modules can be integrated. It should be noted that while the semiconductor packages SP1-SP3 are illustrated with the passive device module PDM1 integrated therein, any other passive device module falling within the scope of the disclosure may be used in a semiconductor package. Referring to FIG. 13A, a semiconductor package SP1 includes semiconductor dies 530, electrically connected to a redistribution structure 540. In some embodiments, each one of the semiconductor dies 530 may independently be or include a logic die or a memory die. In some embodiments, the redistribution structure 540a is formed on active surfaces 530t of the semiconductor dies 530. The semiconductor dies 530 may be disposed on a first side 540a of the redistribution structure 540 and be encapsulated by an encapsulant 550. Conductive terminals 560 may be disposed on a second side 540b of the redistribution structure 540 opposite to the first side 540a. In some embodiments, a passive device module (e.g., the passive device module PDM1) may be connected to the redistribution structure 540 from the second side 540b. That is, the passive device module may be disposed on the second side 540b of the redistribution structure 540 amongst the conductive terminals 560. In some embodiments, the connective terminals of the passive device module (e.g., the connective terminals 180 of the passive device module PDM1) may establish electrical connection between the redistribution structure 540 and the passive device module. In some embodiments, multiple passive device modules may be connected to the redistribution structure 540. For example, passive device modules may be disposed in correspondence of (vertically overlapping with) each of the semiconductor dies 530 disposed on the redistribution structure 590. In some embodiments, the semiconductor package SP1 may be an integrated fan-out semiconductor device.

In some embodiments, a semiconductor package SP2 may be a package on package semiconductor device. The semiconductor package SP2 may include a lower package 570 and an upper package 575 connected to the lower package. In some embodiments, the lower package 570 includes a semiconductor die 580 connected to a first side 590a of a redistribution structure 590. The redistribution structure 590 may be formed on an active surface 580*t* of the semiconductor die 580, and be referred to as a front-side redistribution structure. In some embodiments, the semiconductor die 580 may be encapsulated by an encapsulant 600, and a backside redistribution structure 610 may extend over the encapsulant 600 and the semiconductor die 580 an opposite side with respect to the front-side redistribution structure 590. Through insulator vias 620 may electrically connect the front-side redistribution structure 590 with the backside redistribution structure 610. In some embodiments, conductive terminals 630 are disposed on a second side 590*b* of the redistribution structure 590 opposite to the first side 590*a*. In some embodiments, the semiconductor die 580 of the lower package 570 is or includes a logic die. In some embodiments, the upper package 575 includes one or more semiconductor dies 640 connected to an interposer 650. In some embodiments, the semiconductor dies 640 are or include memory dies. The semiconductor dies 640 may be optionally encapsulated by an encapsulant 660. The upper package 575 may be connected to the backside redistribution structure 610 of the lower package 570 via conductive terminals 670. In some embodiments, a passive device module (e.g., the passive device module PDM1) may be connected to the front-side redistribution structure 590 from the second side 590*b*. That is, the passive device module may be disposed on the second side 590*b* of the redistribution structure 590 amongst the conductive terminals 630. In some embodiments, the connective terminals of the passive device module (e.g., the connective terminals 180 of the passive device module PDM1) may establish electrical connection between the redistribution structure 590 and the passive device module.

According to some embodiments of the disclosure, a semiconductor package SP3 may be a large scale (e.g., wafer-size or panel-size) semiconductor package. In some embodiments, the large-scale semiconductor package SP3 includes a plurality of semiconductor dies 680 electrically connected to a first side 690*a* of a redistribution structure 690. The semiconductor dies 680 may be disposed side-by-side in an array manner on the redistribution structure 690. In some embodiments, active surfaces 680*t* of the semiconductor dies 680 are in contact with the redistribution structure 690. An encapsulant 700 may be formed on the redistribution structure 690 to encapsulate the semiconductor dies 680. In some embodiments, a heat sink 710 may optionally be disposed on the encapsulant 700 on an opposite side with respect to the redistribution structure 690. Conductive terminals 720 may be disposed on a second side 690*b* of the redistribution structure 690 opposite to the first side 690*a* and may establish electrical connection with a socket 730. Additional modules 740 (e.g., memories, power modules, radiofrequency module, etc.) may be disposed on the socket 730. In some embodiments, one or more passive device modules are connected to the redistribution structure 690 from the second side 690*b*. The passive device modules (e.g., the passive device module PDM1) may be disposed amongst the conductive terminals 720, and may be located between the socket 730 and the redistribution structure 690.

In some embodiments, when passive device modules similar to the passive device modules PDM8 (shown in FIG. 11A) or PDM5 (shown in FIG. 12A) are used, the contact surfaces (with contact posts) of the semiconductor chips included in the passive device modules may lie in planes diverging (non-parallel) with respect to the planes in which the active surfaces of the semiconductor dies 530, 580 or 680 lie. In some embodiments, the planes of the contact surfaces of the semiconductor chips and the planes of the active surfaces of the semiconductor dies may intersect defining right angles.

In some embodiments, by integrating passive device in passive device modules according to the present disclosure, it is possible to achieve a higher density of integrated passive device modules, reducing the form factor, the parasitic resistance, and the inductance. As such, the performances of the semiconductor packages including the passive device modules according to the disclosure may be enhanced. In some embodiments, because of the integration of the passive devices in passive device modules, the enhancement in performance of the semiconductor package may be obtained without incurring into size penalty.

In accordance with some embodiments of the disclosure, a passive device module is provided. A passive device module includes a first tier, a second tier and connective terminals. The first tier includes a first semiconductor chip and a first encapsulant. The first semiconductor chip has contact posts. The encapsulant encapsulates the first semiconductor chip. The second tier is disposed on the first tier, and includes a second semiconductor chip, through interlayer walls, and a second encapsulant. The through interlayer walls are locate beside and face sidewalls of the second semiconductor chip and are electrically connected to the contact posts. The second encapsulant encapsulates the second semiconductor chip and the through interlayer walls. The connective terminals are disposed over the second tier and are electrically connected to the first semiconductor chip via the through interlayer walls. The first and second semiconductor chips include passive devices.

In accordance with some embodiments of the disclosure, a semiconductor package is provided. The semiconductor package includes a first redistribution structure, a semiconductor die, conductive terminals, and a passive device. The redistribution structure has a first side and a second side opposite to the first side. The semiconductor die is disposed on the first side of the redistribution structure. The conductive terminals are electrically disposed on the second side of the redistribution structure. The passive device module is disposed on the second side of the redistribution structure. The passive device module includes a first semiconductor chip, first through interlayer walls, a first encapsulant, a second semiconductor chip, a second encapsulant and connective terminals. The first through interlayer walls are disposed beside the first semiconductor chip. The first encapsulant laterally wraps the first semiconductor chip and the first through interlayer walls. The second semiconductor chip is vertically stacked with the first semiconductor chip and electrically connected to the first through interlayer walls. The second encapsulant laterally wraps the second semiconductor chip. At least one connective terminal is in contact with one through interlayer wall of the first through interlayer walls. The first and second semiconductor chips include passive devices.

In accordance with some embodiments of the disclosure, a manufacturing method of a passive device module is provided. The method includes at least the following steps. First semiconductor chips are provided. The first semiconductor chips are encapsulated in a first encapsulant. First through interlayer walls are formed over the first encapsulant. The first through interlayer walls are electrically connected to the first semiconductor chips. Second semiconductor chips are provided. The second semiconductor chips are vertically stacked on the first semiconductor chips. A second encapsulant is formed. The second encapsulant encapsulates the first semiconductor chips and the first through interlayer walls. Connective terminals are formed connected to the first semiconductor chips via the first through interlayer walls. The first and second semiconductor chips include passive devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A passive device module, comprising:
    a first tier including:
        a first semiconductor chip having contact posts; and
        a first encapsulant encapsulating the first semiconductor chip;
    a second tier, disposed on the first tier and including:
        a second semiconductor chip;
        first through interlayer walls, located beside and facing sidewalls of the second semiconductor chip and electrically connected to the contact posts;
        second through interlayer walls, located beside the second semiconductor chip and the first through interlayer walls; and
        a second encapsulant encapsulating the second semiconductor chip, the first through interlayer walls, and the second through interlayer walls; and
    connective terminals, disposed over the second tier and electrically connected to the second through interlayer walls and further electrically connected to the first semiconductor chip via the first through interlayer walls,
    wherein the first and second semiconductor chips include passive devices, one through interlayer wall of the first through interlayer walls has an elongated cross-section along a first direction, another one through interlayer wall of the second through interlayer walls has an elongated cross-section along a second direction, the cross-sections are taken in a same plane, and the first direction is orthogonal to the second direction.

2. The passive device module of claim 1, further comprising a semiconductor die disposed beside one of the first semiconductor chip or the second semiconductor chip, wherein the semiconductor die includes an active device.

3. The passive device module of claim 1, wherein the second semiconductor chip crosses over the first semiconductor chip and vertically overlaps with the first semiconductor chip.

4. The passive device module of claim 1, wherein at least one second through interlayer wall of the through interlayer walls is disposed between two second semiconductor chips.

5. The passive device module of claim 1, wherein the first tier further includes third through interlayer walls disposed beside the first semiconductor chip and encapsulated by the first encapsulant.

6. The passive device module of claim 1, further comprising a redistribution structure disposed over the second tier, wherein the connective terminals are connected to the first through interlayer walls and the second semiconductor chip via the redistribution structure.

7. The passive device module of claim 5, further comprising additional connective terminals directly connected to the third through interlayer walls, and electrically connected to the second through interlayer walls via the third through interlayer walls.

8. A semiconductor package, comprising:
    a first redistribution structure having a first side and a second side opposite to the first side;
    a semiconductor die disposed on the first side of the redistribution structure;
    conductive terminals disposed on the second side of the redistribution structure; and
    a passive device module disposed on the second side of the redistribution structure, the passive device module including:
        a first semiconductor chip;
        first through interlayer walls disposed beside the first semiconductor chip;
        a first encapsulant laterally wrapping the first semiconductor chip and the first through interlayer walls;
        a second semiconductor chip vertically stacked with the first semiconductor chip and electrically connected to the first through interlayer walls;
        a second encapsulant laterally wrapping the second semiconductor chip; and
        connective terminals, wherein at least one connective terminal is in contact with one through interlayer wall of the first through interlayer walls,
    wherein the first and second semiconductor chips include passive devices, and
    a contact surface of the first semiconductor chip is oblique with respect to an active surface of the semiconductor die.

9. The semiconductor package of claim 8, wherein the passive device module further includes:
    a second redistribution structure, disposed over the second encapsulant and the second semiconductor chip.

10. The semiconductor package of claim 9, wherein the passive device module further includes second through interlayer walls disposed beside the second semiconductor chip, encapsulated by the second encapsulant, and vertically stacked on the first through interlayer walls.

11. The semiconductor package of claim 8, further comprising second through interlayer walls disposed beside the second semiconductor chip and encapsulated by the second encapsulant, wherein the second through interlayer walls are vertically misaligned with respect to the first through interlayer walls.

12. The semiconductor package of claim 11, further comprising:
    a second redistribution structure, extending on the second encapsulant and the second semiconductor chip, and electrically connected to the second semiconductor chip; and
    a third redistribution structure, extending on the first encapsulant and the first semiconductor chip, electrically connected to the first semiconductor chip,
    wherein first ends of the first through interlayer walls directly contact the second redistribution structure, second ends of the first through interlayer walls opposite to the first ends directly contact the third redistribution structure, and the connective terminals are installed on vertical side surfaces of the first through interlayer walls connecting the first ends to the second ends.

13. The semiconductor package of claim 8, wherein the at least one connective terminal is disposed directly on the one through interlayer wall.

14. The semiconductor package of claim 12, wherein the second redistribution structure electrically connects the second semiconductor chip to the second through interlayer walls.

15. A semiconductor package, comprising:
- a first semiconductor chip, comprising:
  - a semiconductor substrate;
  - a pair of first contact pads located at a front surface of the semiconductor substrate; and
  - a first contact post, including two first portions and a second portion each, wherein each first portion extends directly on a corresponding contact pad of the pair of first contact pads, and the second portion extends on the front surface of the semiconductor substrate and joins the two first portions, and
- the semiconductor package further comprises:
- a first encapsulant directly contacting side surfaces of the first semiconductor chip;
- a second semiconductor chip vertically stacked with the first semiconductor chip;
- first through interlayer walls, disposed beside the second semiconductor chip to face side surfaces of the second semiconductor chip and electrically connected to the first semiconductor chip, wherein one first through interlayer walls of the first through interlayer walls contacts the first contact post;
- a second encapsulant directly contacting side surfaces of the second semiconductor chip and side surfaces of the first through interlayer walls; and
- first connective terminals, electrically connected to the first through interlayer walls,
- wherein, when viewed in a horizontal plane view, a first dimension of the first through interlayer walls along a first direction is greater than a second dimension of the first through interlayer walls along a second direction and the side surfaces of the second semiconductor chip faced by the first through interlayer walls extend along one direction selected from the first direction and the second direction, the first direction and the second direction being perpendicular directions in the horizontal plane.

16. The semiconductor package of claim 15, further comprising second connective terminals electrically connected to the second semiconductor chip,
- wherein the first connective terminals are disposed directly on first ends of the first through interlayer walls,
- the second semiconductor chip comprises second contact posts, and
- the second connective terminals are disposed directly on the second contact posts of the second semiconductor chip.

17. The semiconductor package of claim 15, further comprising a dielectric layer, disposed on the first semiconductor chip and the first encapsulant, and having a pair of openings each exposing one first portion of the first portions of the first contact post, wherein the one first through interlayer wall directly contacts the first portions of the first contact post through the pair of openings.

18. The semiconductor package of claim 17, further comprising:
- second through interlayer walls disposed beside the first semiconductor chip;
- third through interlayer walls, disposed beside the second semiconductor chip and vertically aligned with the second through interlayer walls, directly contacting the second through interlayer walls via additional openings of the dielectric layer;
- a redistribution structure extending on the second encapsulant, electrically connecting the first semiconductor chip and the second semiconductor chip to the first connective terminals and to the third through interlayer walls; and
- second connective terminals, connected to first ends of the second through interlayer walls opposite to second ends of the second through interlayer walls, the second ends of the second through interlayer walls directly contacting the third through interlayer walls,
- wherein the first encapsulant directly contacts side surfaces of the second through interlayer walls, and
- the second encapsulant directly contacts side surfaces of the third through interlayer walls.

19. The semiconductor package of claim 18, wherein electrical connection between the first contact post of the first semiconductor chip and one of the second connective terminals is established, in sequence, via the one first through interlayer wall, the redistribution structure, one of the third through interlayer walls, and one of the second through interlayer walls.

20. The semiconductor package of claim 18, further comprising another redistribution structure disposed at an opposite side of the first encapsulant with respect to the dielectric layer, wherein the second connective terminals are connected to the first ends of the second through interlayer walls via the other redistribution structure.

* * * * *